(12) United States Patent
Kim et al.

(10) Patent No.: US 11,936,968 B2
(45) Date of Patent: Mar. 19, 2024

(54) CIRCUIT BOARD, AN IMAGE SENSOR MODULE, A LENS DRIVING DEVICE, AND A CAMERA MODULE INCLUDING THE SAME

(71) Applicant: LG INNOTEK CO., LTD., Seoul (KR)

(72) Inventors: Hae Sik Kim, Seoul (KR); So Hee Choi, Seoul (KR); Jee Heum Paik, Seoul (KR); Na Kyung Kwon, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 135 days.

(21) Appl. No.: 17/726,135

(22) Filed: Apr. 21, 2022

(65) Prior Publication Data

US 2022/0353389 A1 Nov. 3, 2022

(30) Foreign Application Priority Data

Apr. 21, 2021 (KR) .................. 10-2021-0051997
May 21, 2021 (KR) .................. 10-2021-0065557
May 26, 2021 (KR) .................. 10-2021-0067575

(51) Int. Cl.
*H05K 1/18* (2006.01)
*H04N 23/54* (2023.01)
*H04N 23/57* (2023.01)

(52) U.S. Cl.
CPC ............. *H04N 23/54* (2023.01); *H04N 23/57* (2023.01); *H05K 1/181* (2013.01); *H05K 1/185* (2013.01);
(Continued)

(58) Field of Classification Search
CPC ........ H04N 23/54; H04N 23/57; H04N 23/52; H04N 23/6812; H04N 23/685;
(Continued)

(56) References Cited

U.S. PATENT DOCUMENTS 6,770,122 B2 8/2004 Thompson
7,665,915 B2 * 2/2010 Lee .................. H01L 27/14618
396/529
(Continued)

FOREIGN PATENT DOCUMENTS

CN 110557878 A 12/2019
DE 10 2012 221 002 A1 5/2014
(Continued)

*Primary Examiner* — Ahmed A Berhan
(74) *Attorney, Agent, or Firm* — Birch, Stewart, Kolasch & Birch, LLP

(57) ABSTRACT

A circuit board according to an embodiment includes an insulating portion; and a pattern portion disposed on the insulating portion, wherein the insulating portion includes: a first insulating region, and a second insulating region disposed outside the first insulating region and spaced apart from the first insulating region with a separation region therebetween; wherein the pattern portion includes: a first pattern portion for signal transmission; and a second pattern portion including a dummy pattern separated from the first pattern portion, wherein the first pattern portion includes: a first terminal portion disposed on the first insulating region; a second terminal portion disposed on the second insulating region; and a connection portion disposed on the separation region and connecting between the first terminal portion and the second terminal portion, wherein the second pattern portion includes: a second-first pattern portion disposed on the first insulating region; and a second-second pattern portion disposed on the second insulating region and separated from the second-first pattern portion.

20 Claims, 31 Drawing Sheets

(52) U.S. Cl.
CPC ........... *H05K 2201/0338* (2013.01); *H05K 2201/09409* (2013.01); *H05K 2201/10121* (2013.01); *H05K 2201/10151* (2013.01); *H05K 2201/10969* (2013.01)

(58) Field of Classification Search
CPC ............. H05K 1/181; H05K 1/185; H05K 2201/0338; H05K 2201/09409; H05K 2201/10121; H05K 2201/10151; H05K 2201/10969; H05K 1/0271; H05K 1/0281; H05K 3/202; H05K 2201/09272; H05K 1/0283; H05K 1/0204; H05K 1/119; H05K 3/0061; H05K 2201/0311; H05K 2201/0394; H05K 2201/066; H05K 2201/09063; H05K 2201/09781; H05K 1/0206; H05K 1/0209; H05K 1/11; H05K 3/386; H05K 3/4614; G03B 13/36
See application file for complete search history.

(56) References Cited

U.S. PATENT DOCUMENTS

| | | |
|---|---|---|
| 8,524,378 B2 | 9/2013 | Arai et al. |
| 8,928,601 B2 * | 1/2015 | Lee ................... G06F 3/04164 |
| | | 345/173 |
| 9,474,149 B2 | 10/2016 | Wölfel |
| 10,924,675 B2 | 2/2021 | Hubert et al. |
| 2013/0148016 A1 | 6/2013 | Oh et al. |
| 2015/0327355 A1 | 11/2015 | Wölfel |
| 2020/0196447 A1 | 6/2020 | Mak |

FOREIGN PATENT DOCUMENTS

| | | | | |
|---|---|---|---|---|
| JP | 2005-513117 A | 5/2005 | | |
| JP | 2019-512734 A | 5/2019 | | |
| KR | 10-0661739 B1 | 12/2006 | | |
| KR | 10-2013-0065202 A | 6/2013 | | |
| KR | 10-1288641 B1 | 7/2013 | | |
| KR | 10-2014-0085583 A | 7/2014 | | |
| WO | WO 2020/162688 A1 | 8/2020 | | |
| WO | WO-2020162688 A1 * | 8/2020 | ....... | H01L 27/14618 |
| WO | WO 2021/071303 A1 | 4/2021 | | |

* cited by examiner

[FIG. 1]
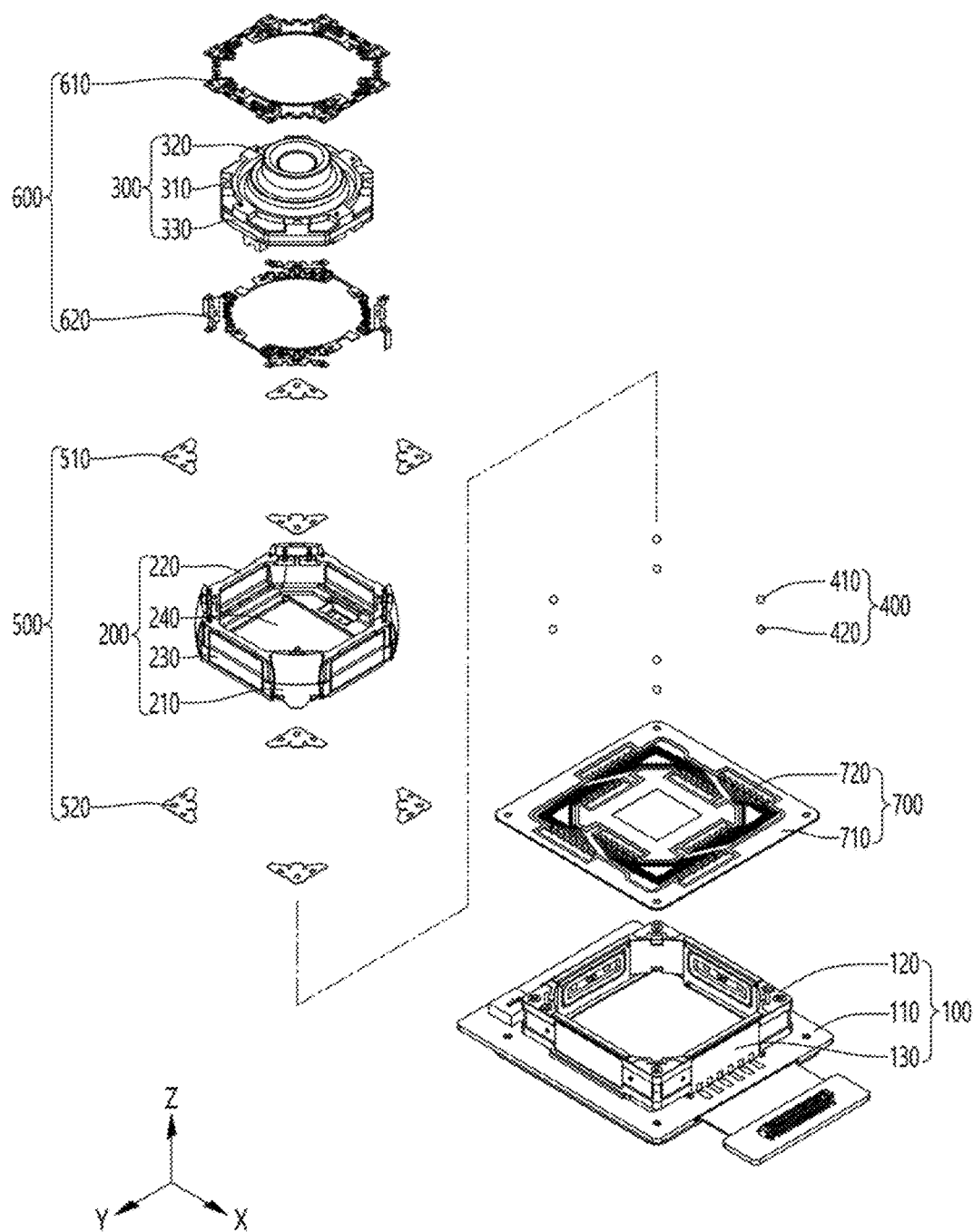

[FIG. 2]
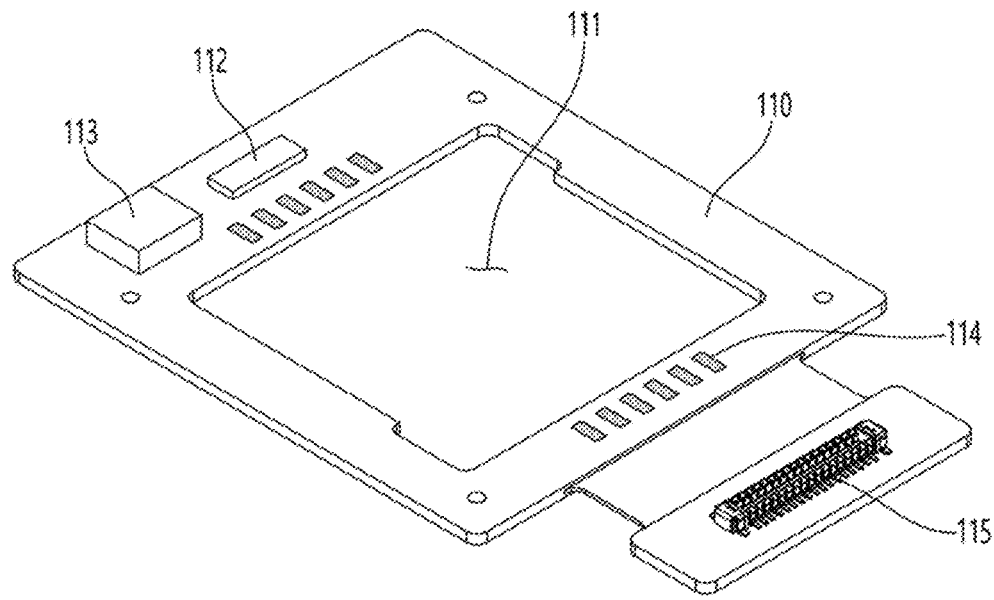
(a)
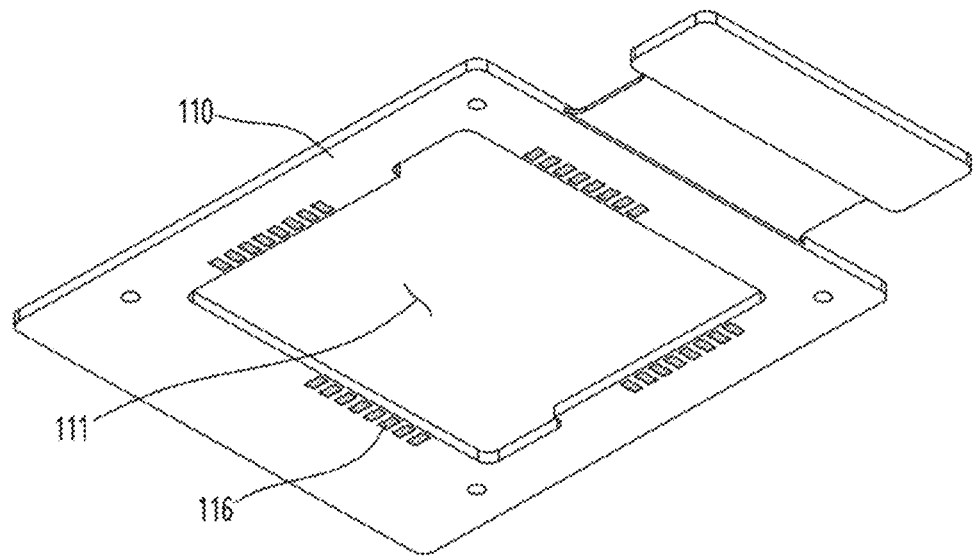
(b)

[FIG. 3]
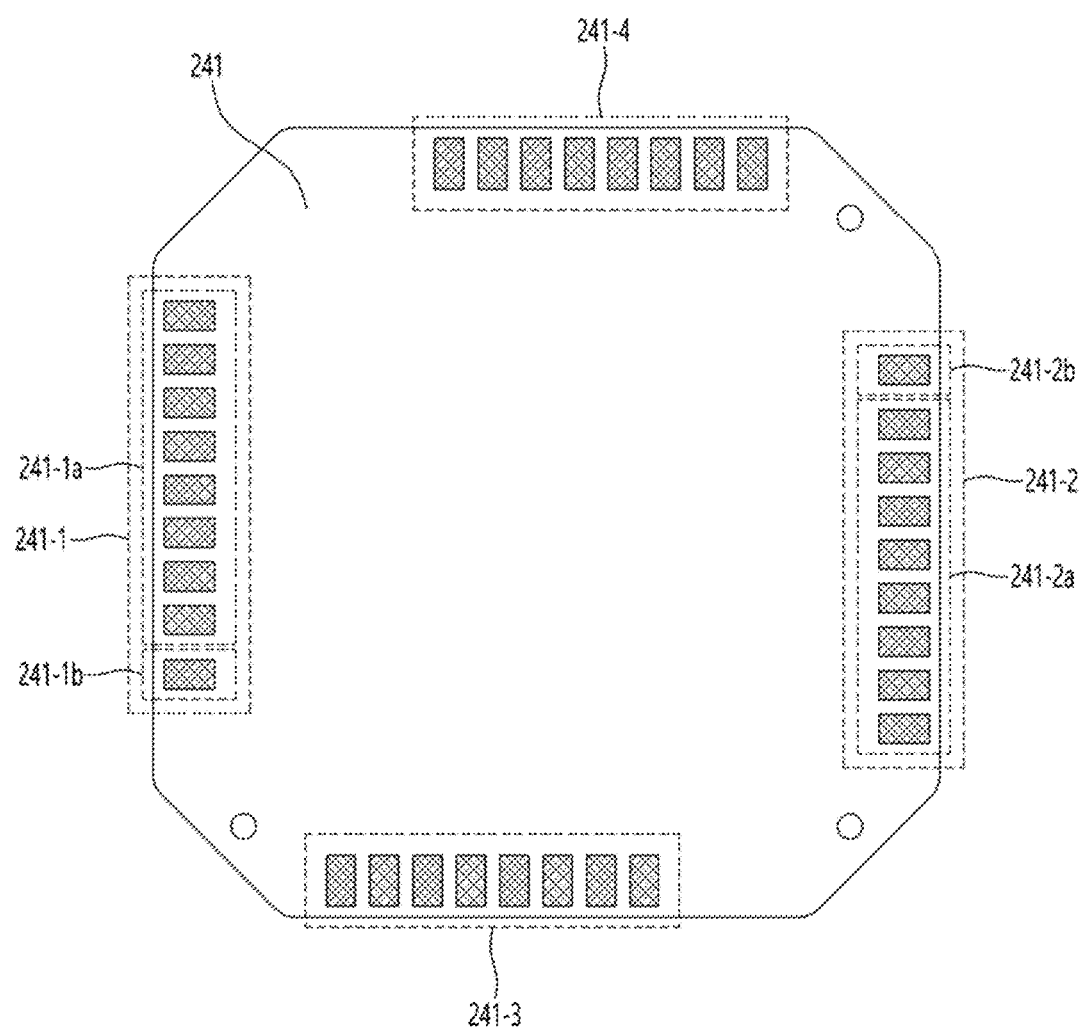

【FIG. 4a】
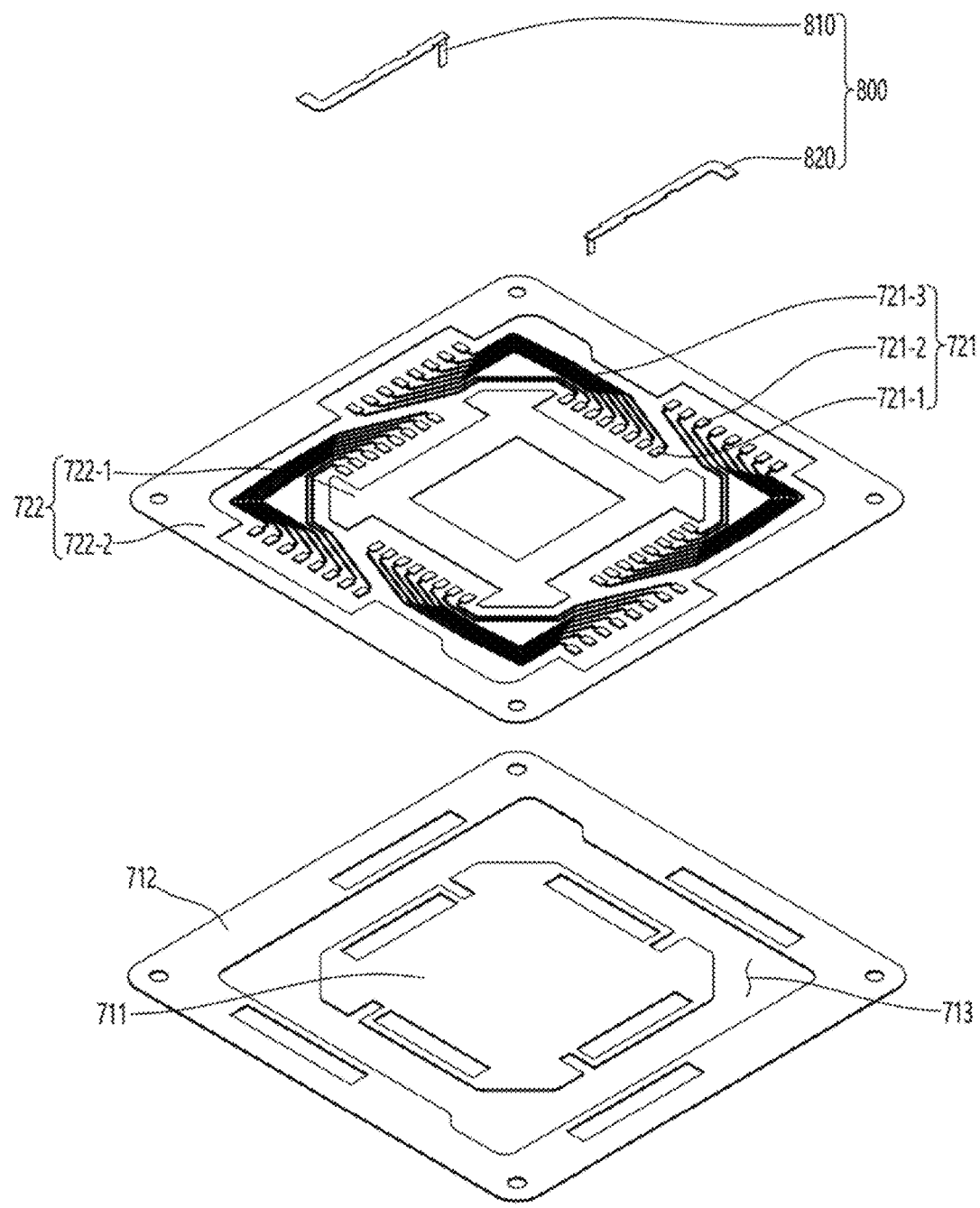

[FIG. 4b]
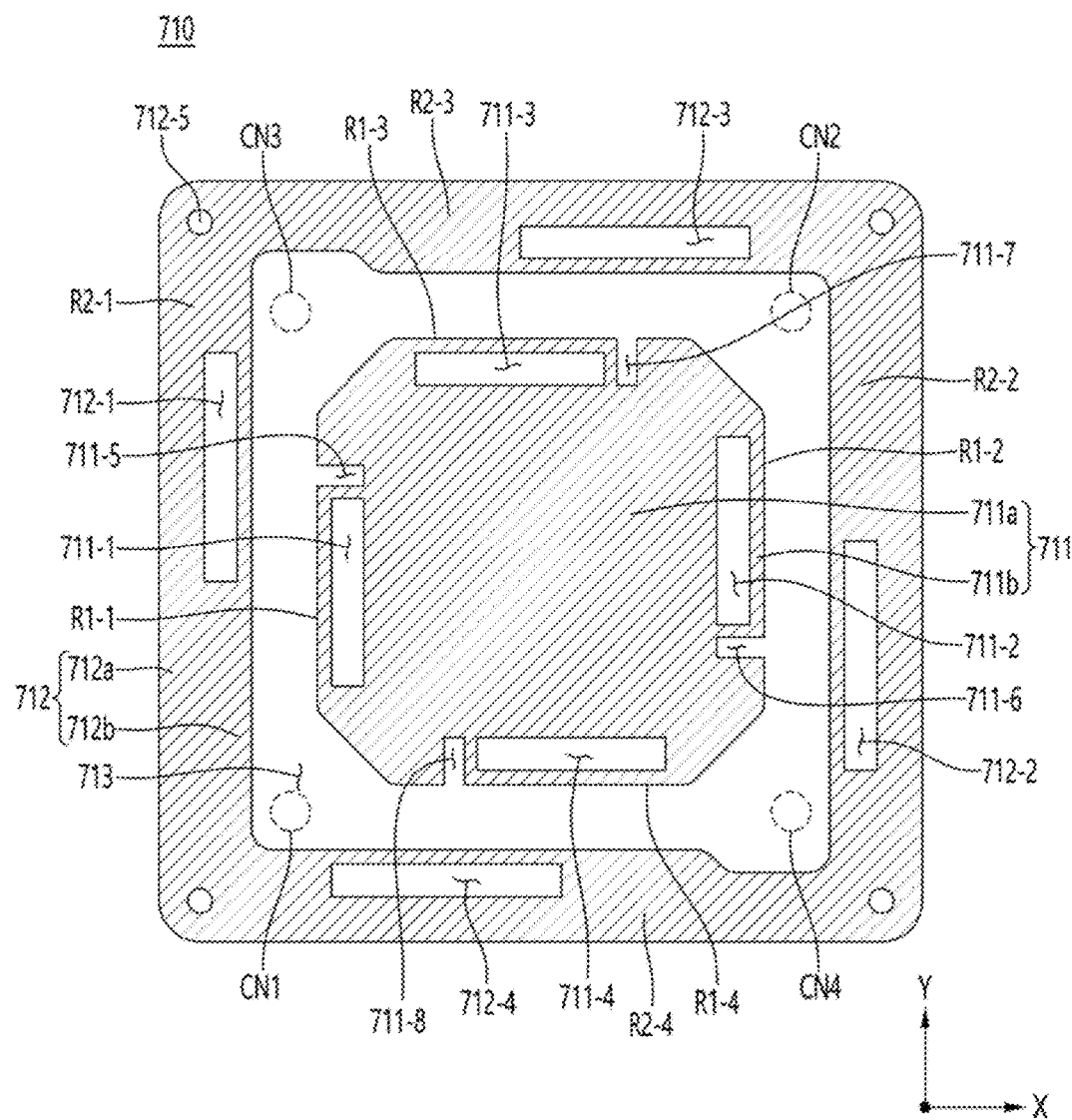

[FIG. 4c]
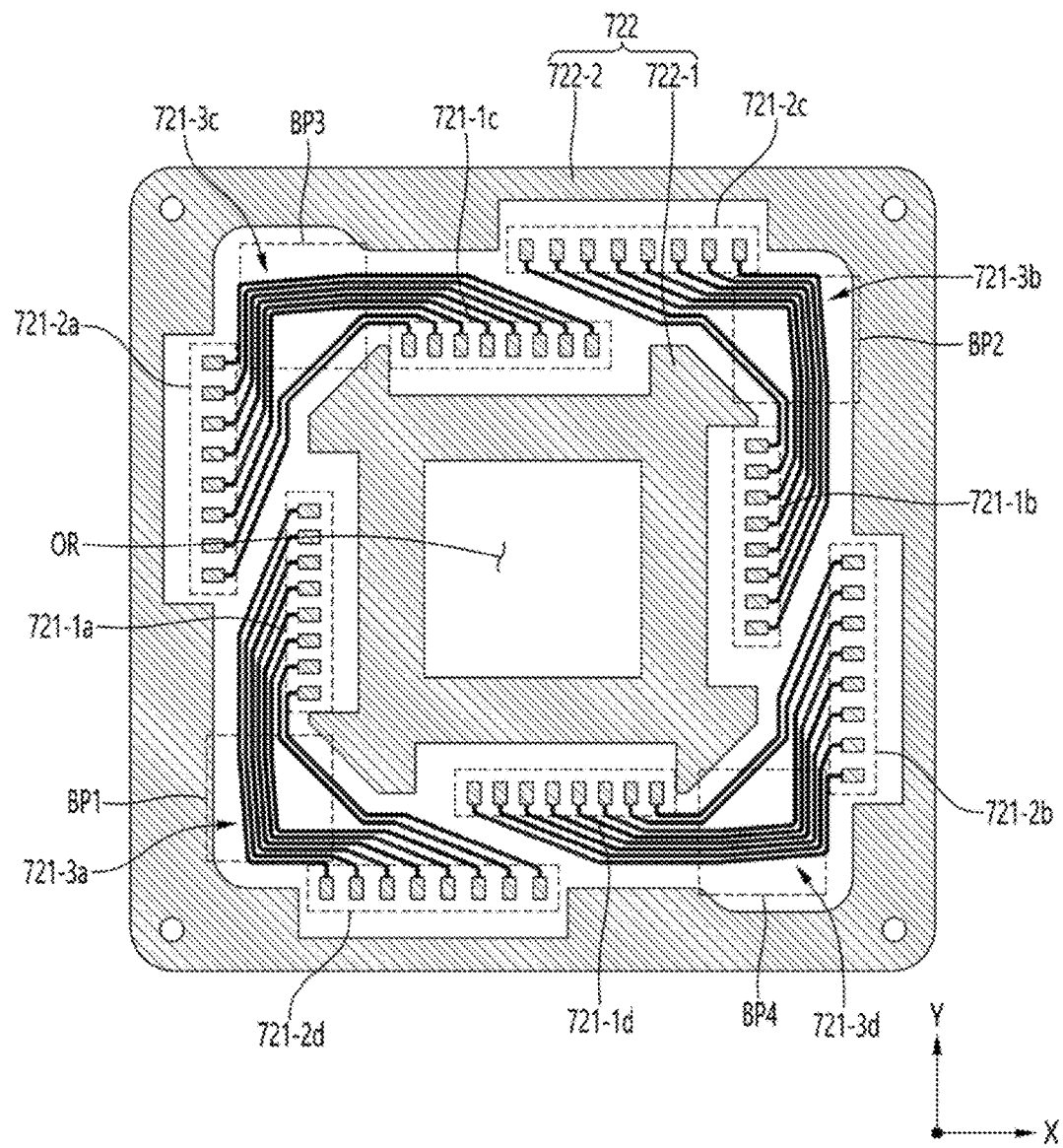

[FIG. 4d]
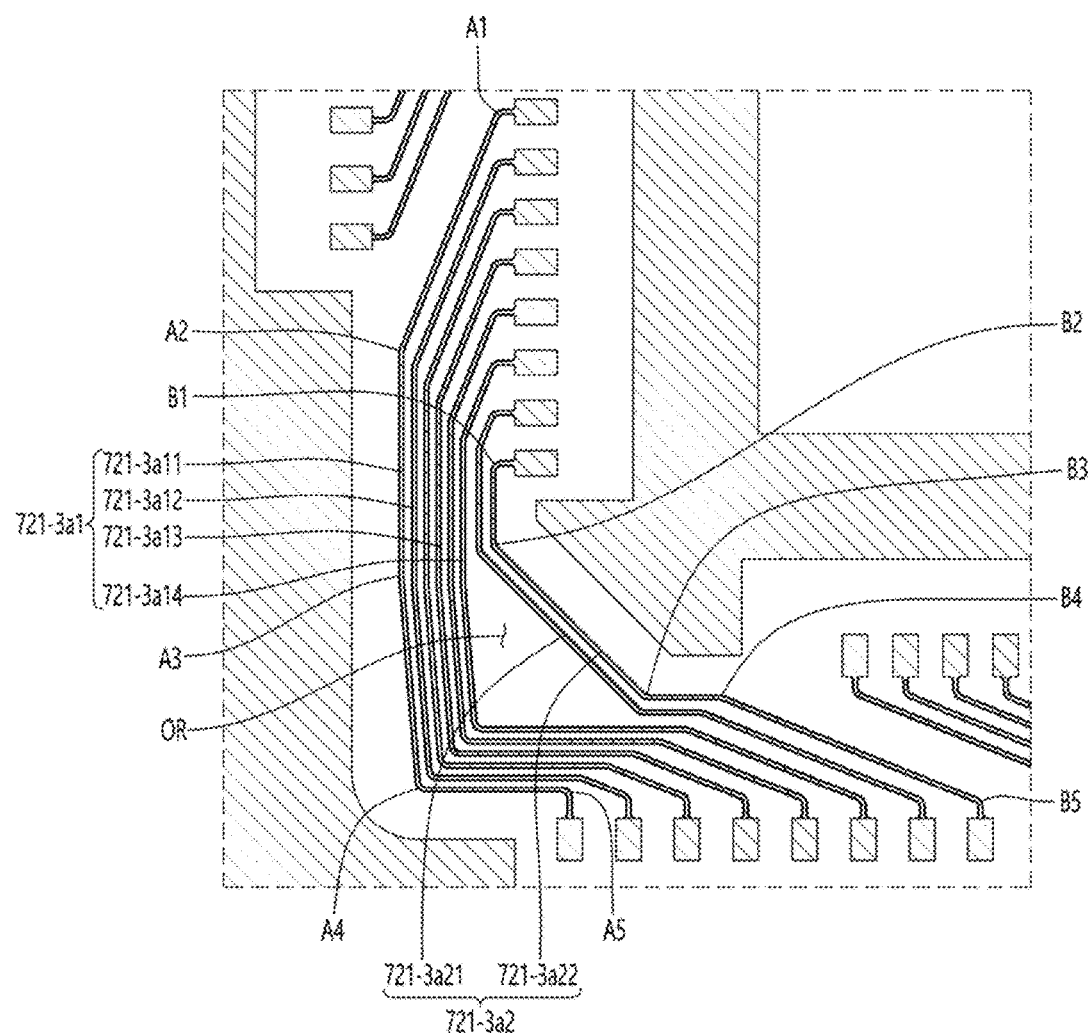

[FIG. 4e]
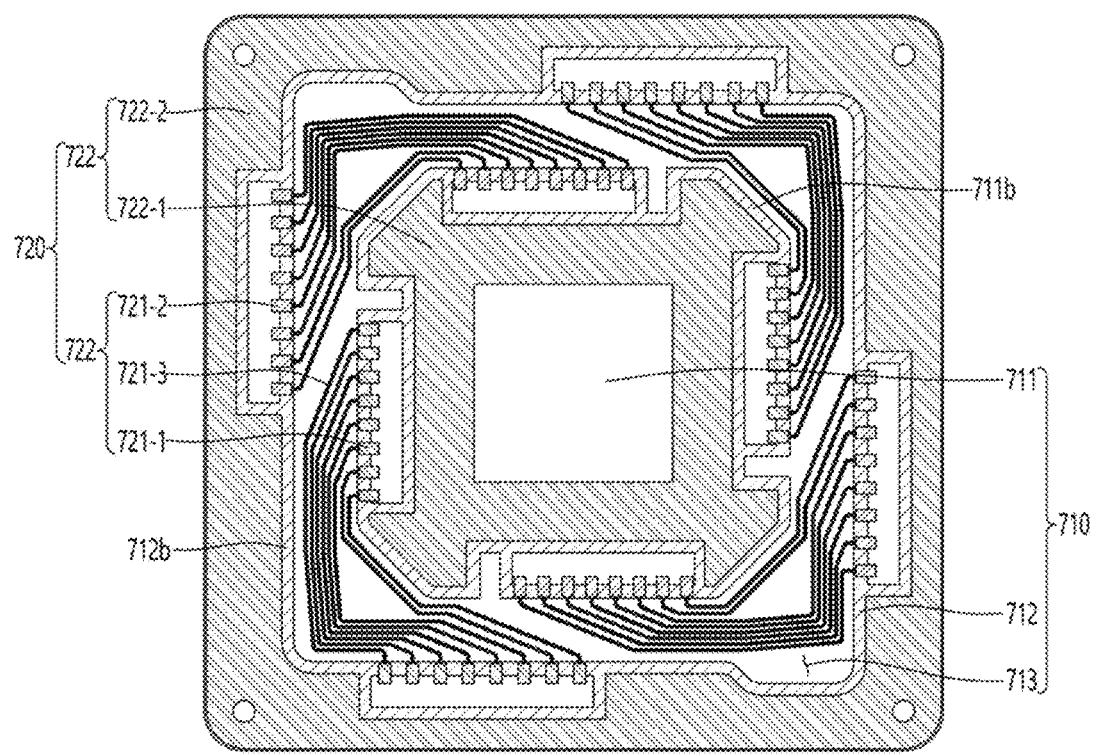

[FIG. 4f]
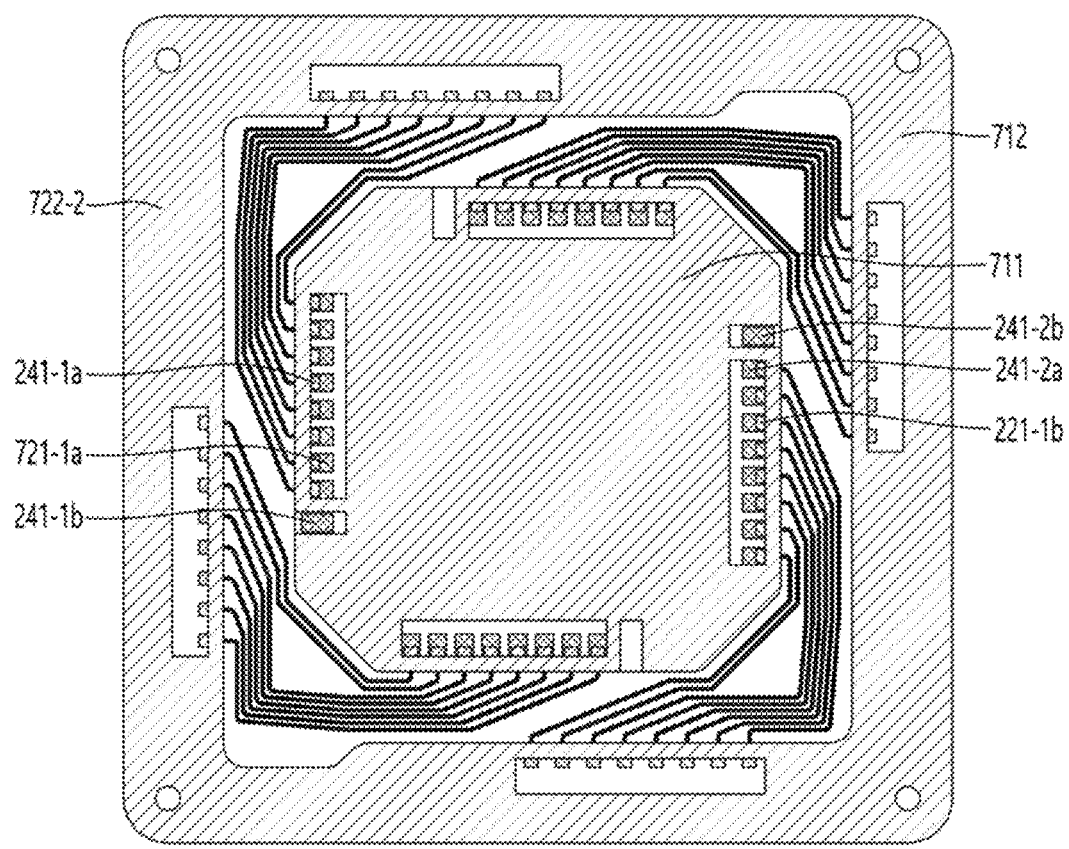

[FIG. 5a]
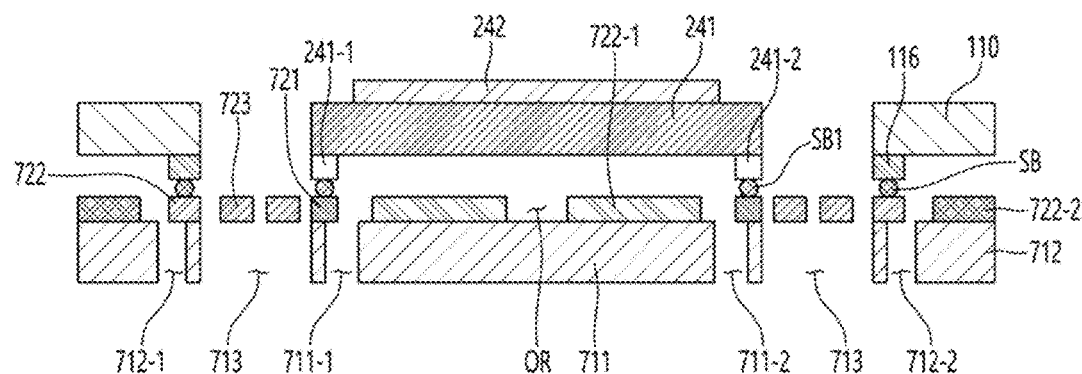
[FIG. 5b]
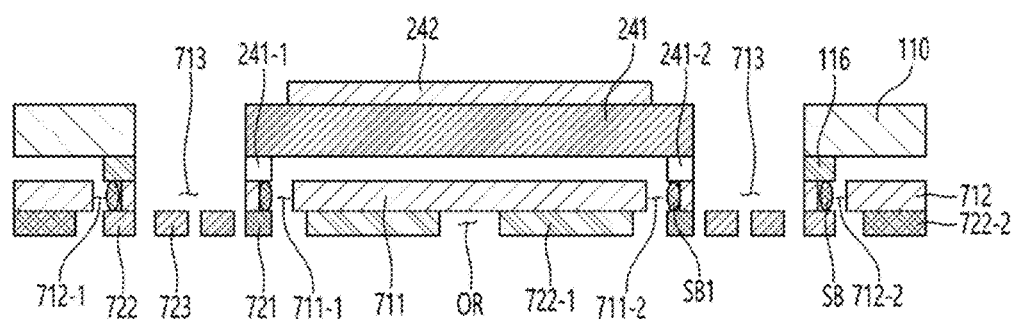

[FIG. 6]
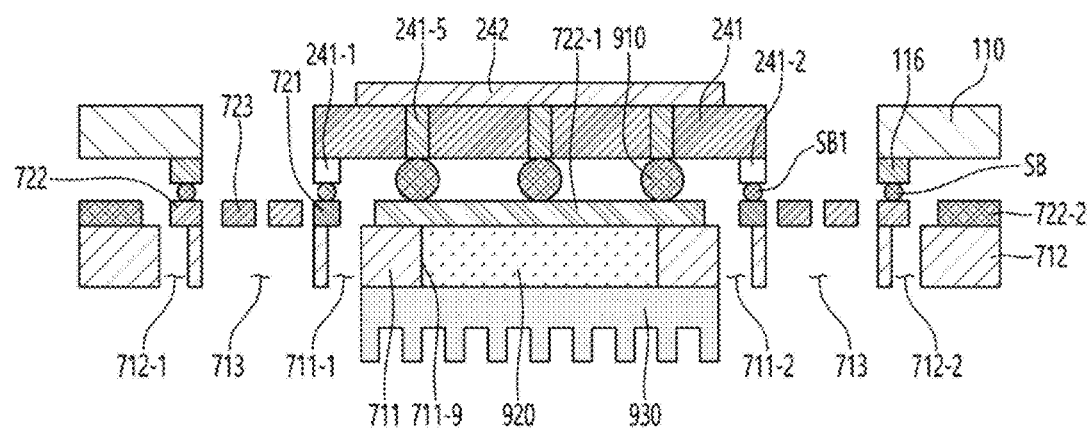
[FIG. 7]
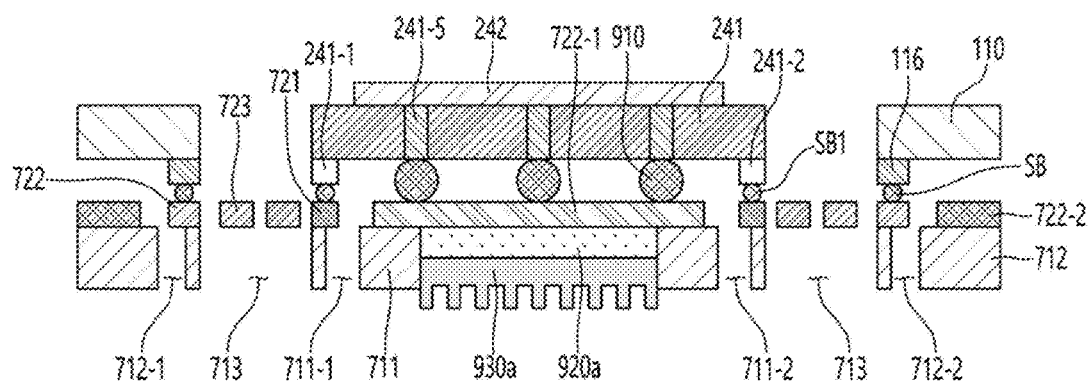

[FIG. 8a]
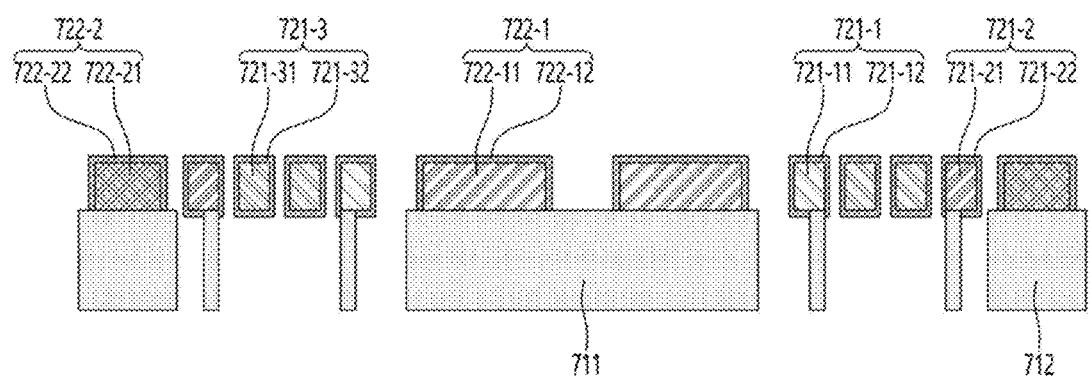

[FIG. 8b]
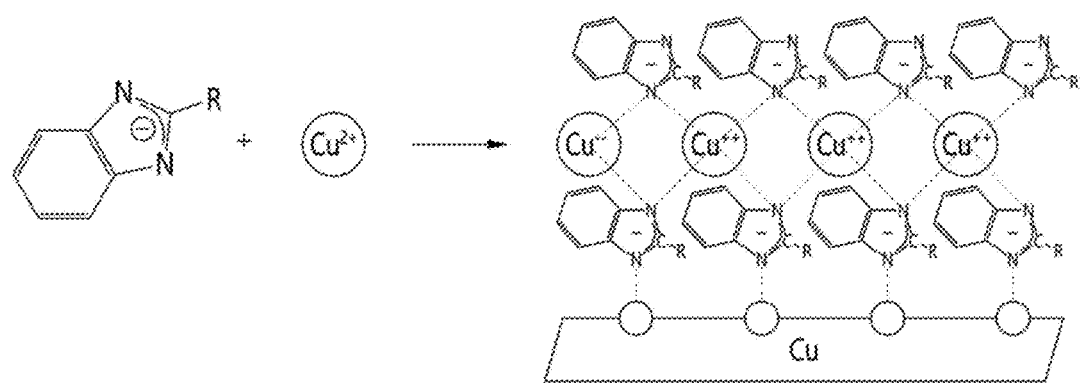
[FIG. 8c]
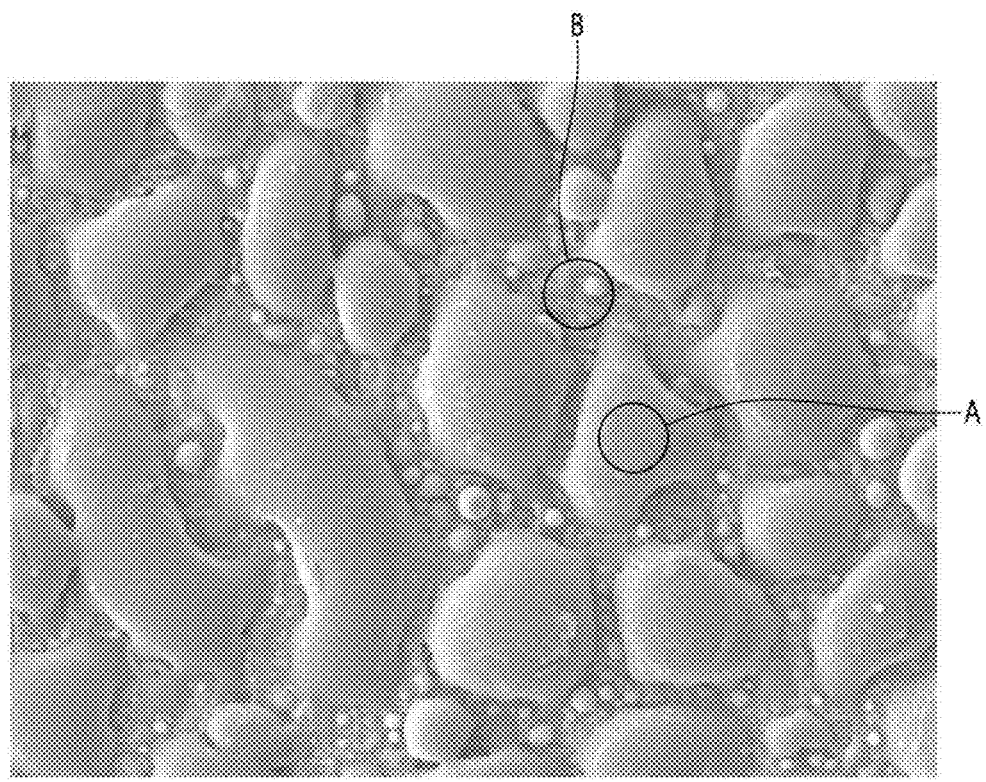

[FIG. 9a]
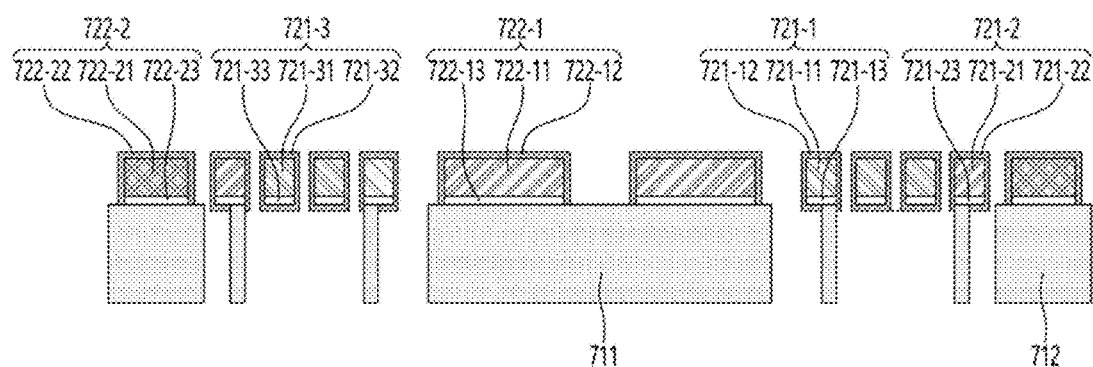
[FIG. 9b]
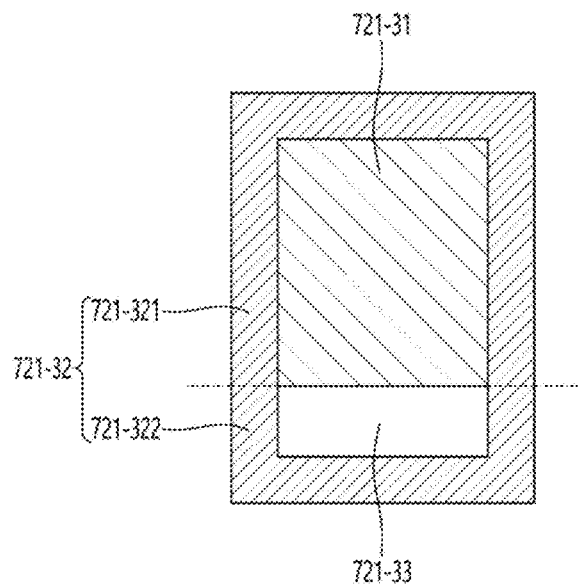

[FIG. 9c]
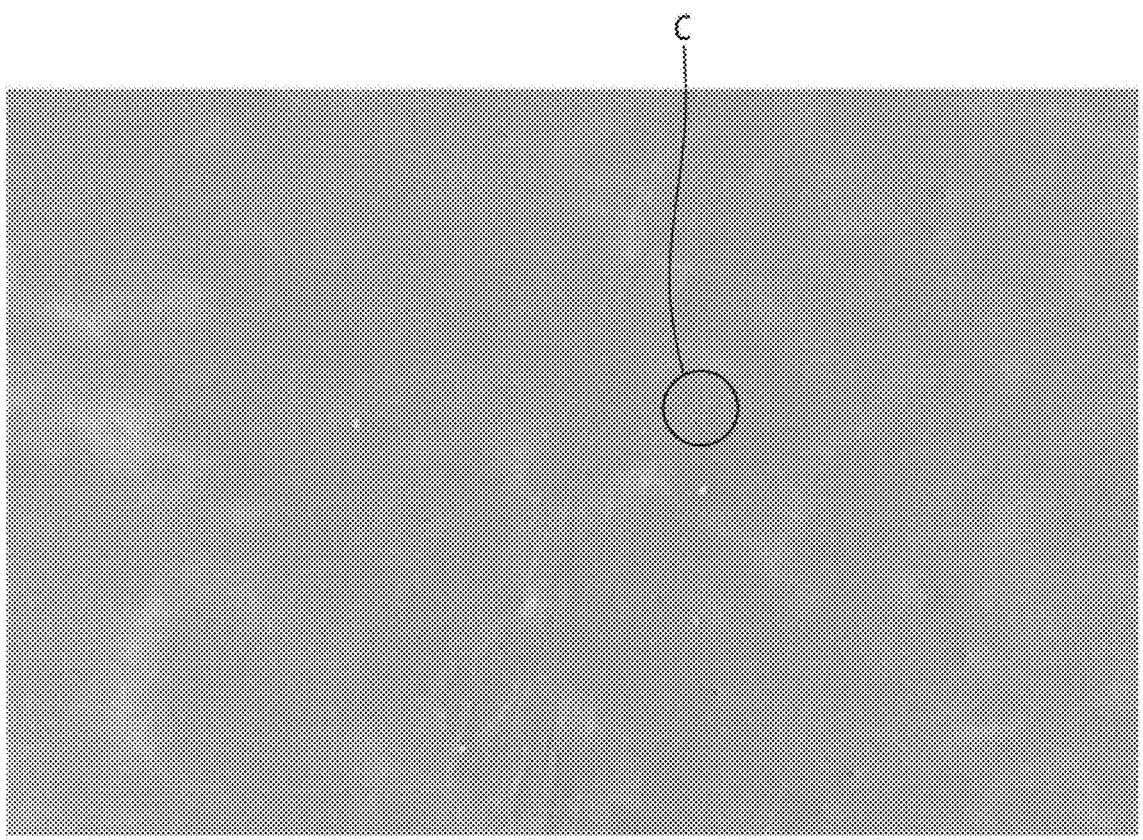

[FIG. 10]
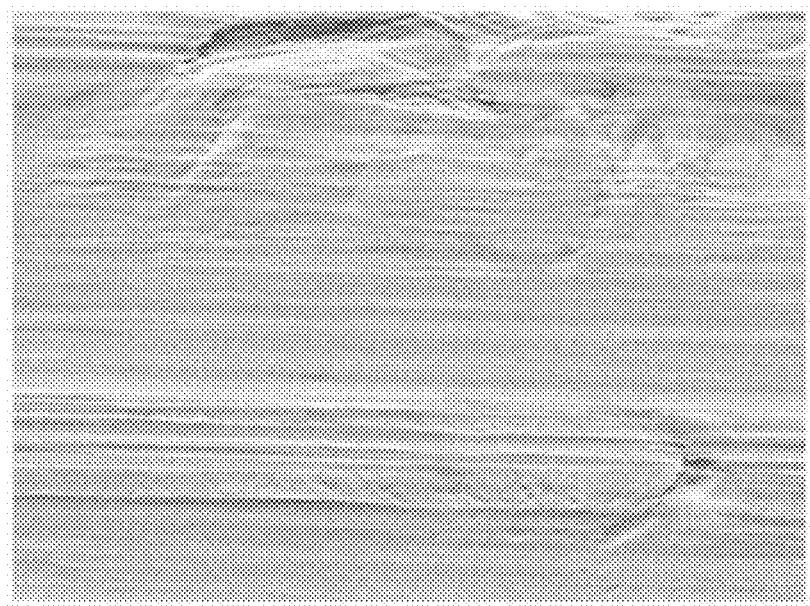
(a)
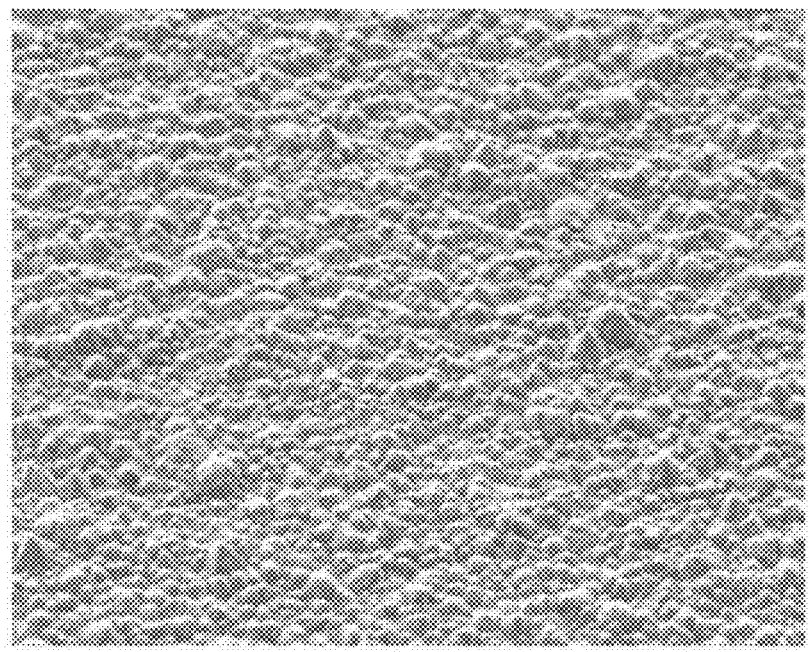
(b)

[FIG. 11a]
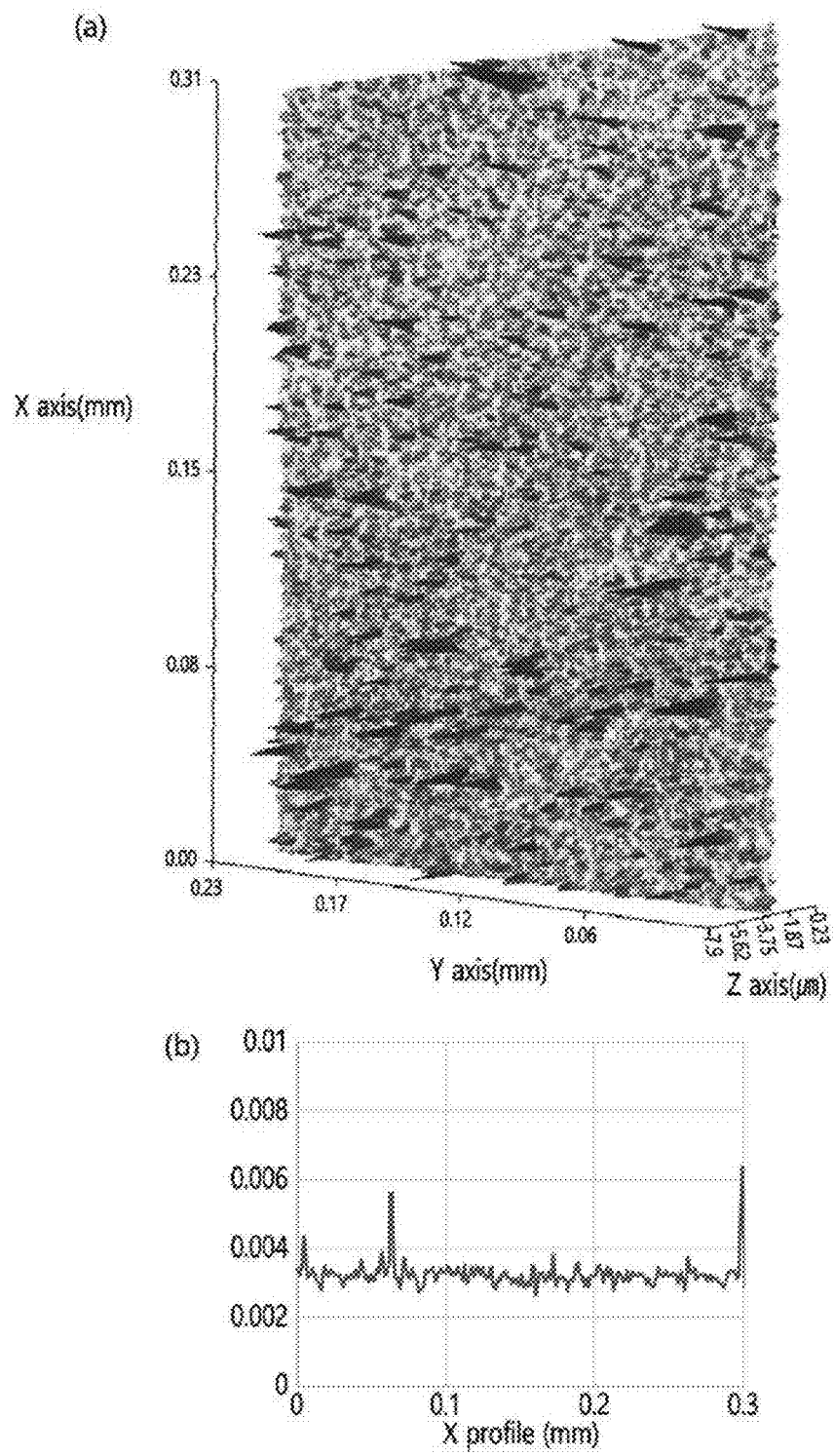

【FIG. 11b】
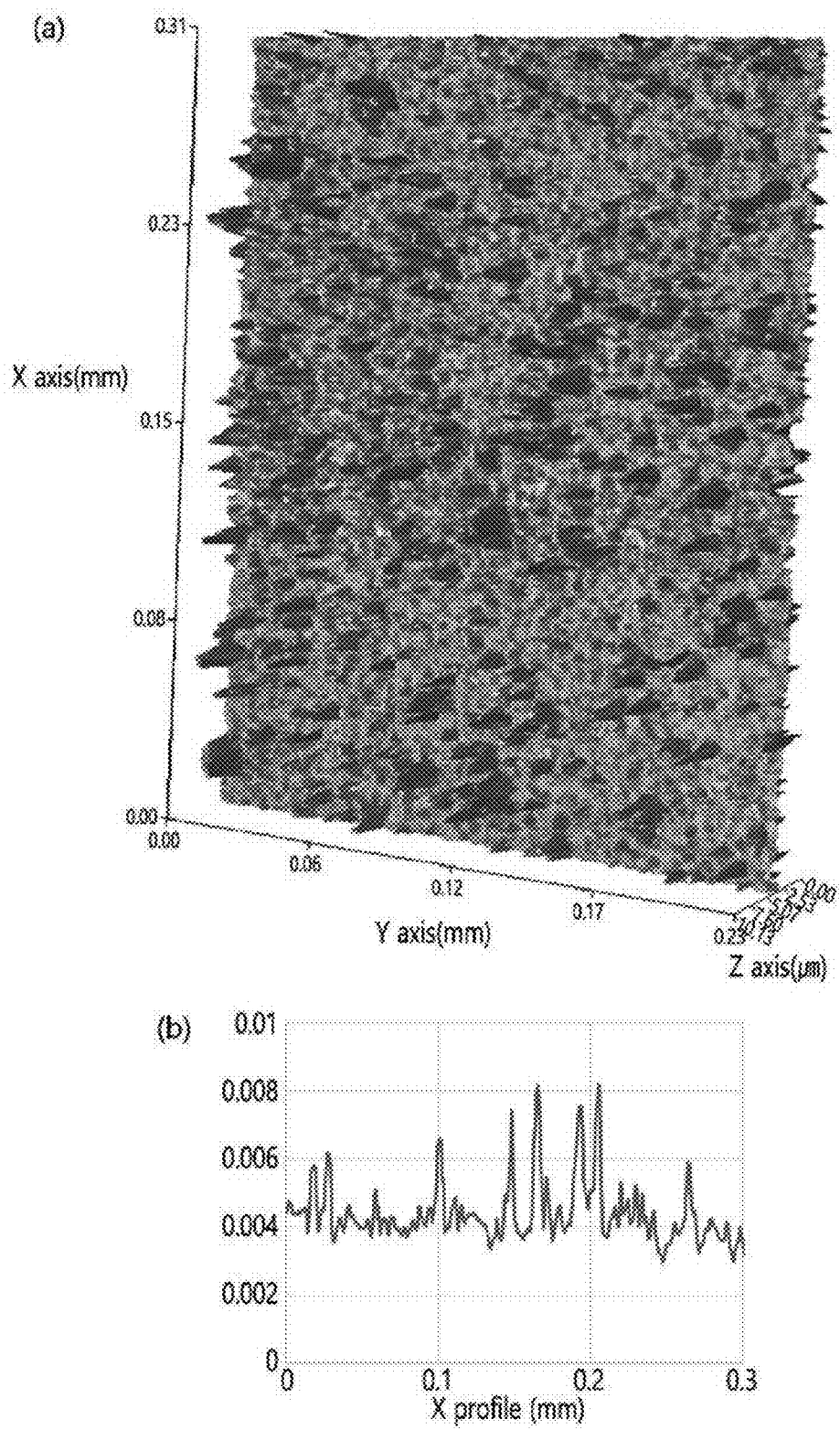

[FIG. 11c]
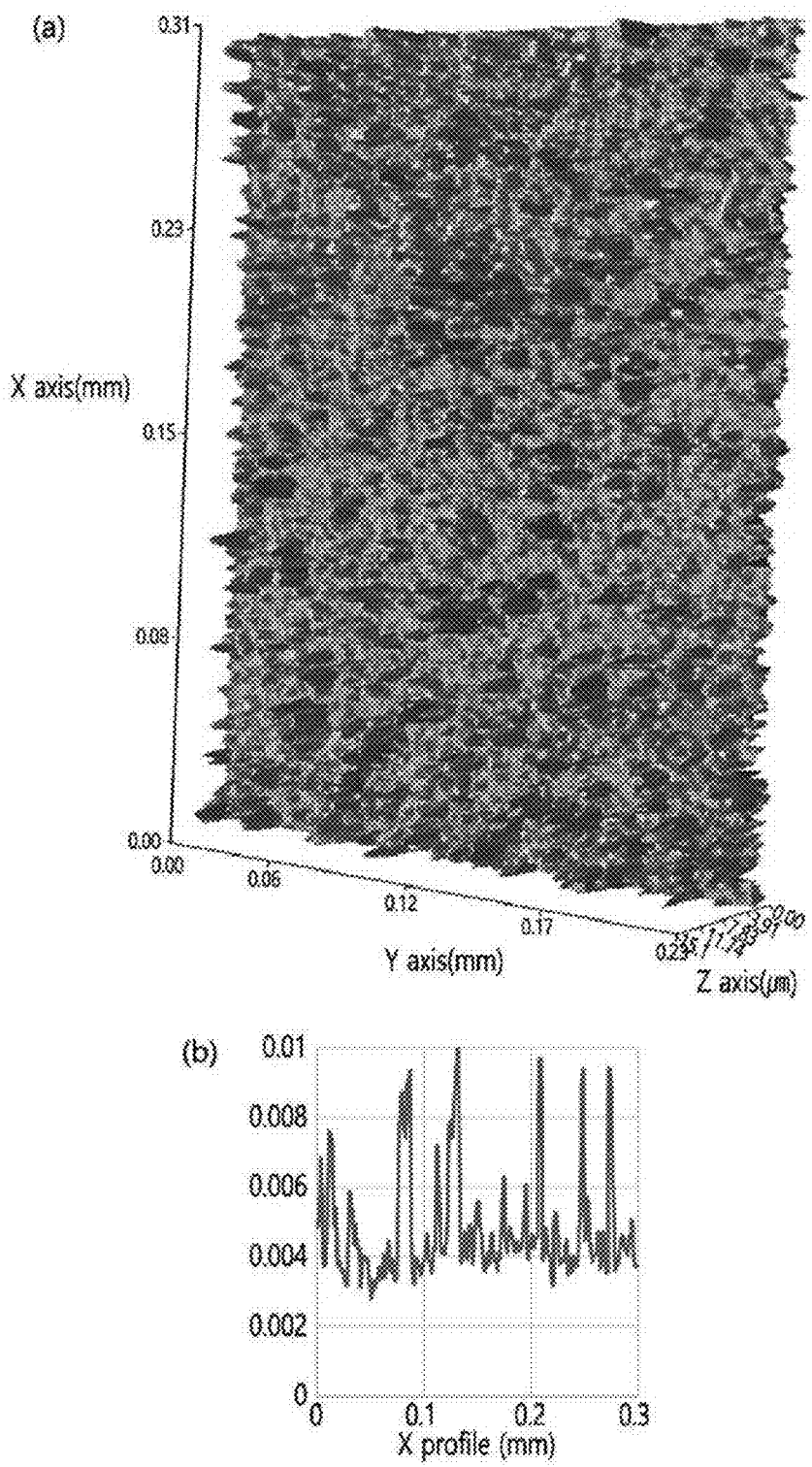

【FIG. 11d】
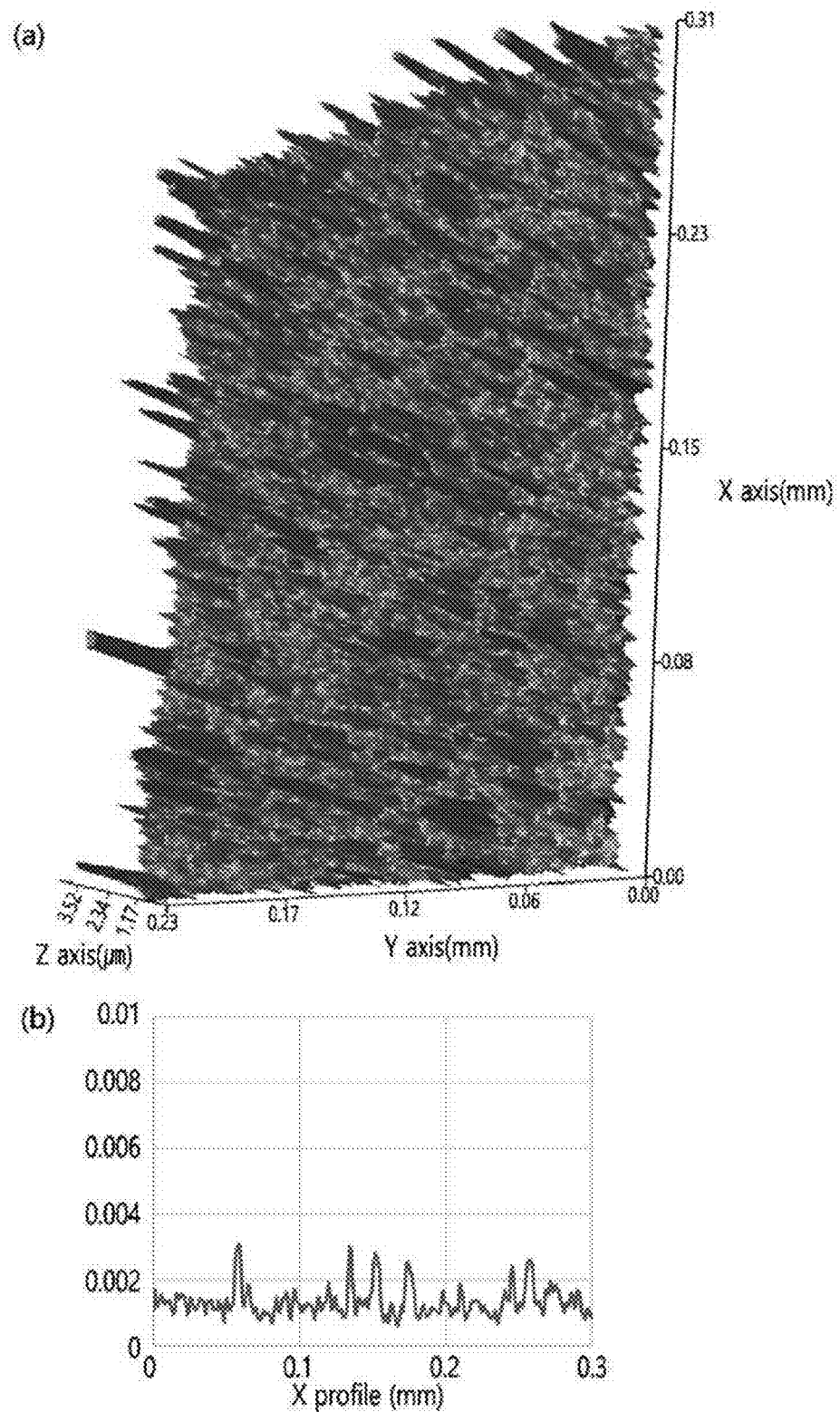

【FIG. 11e】
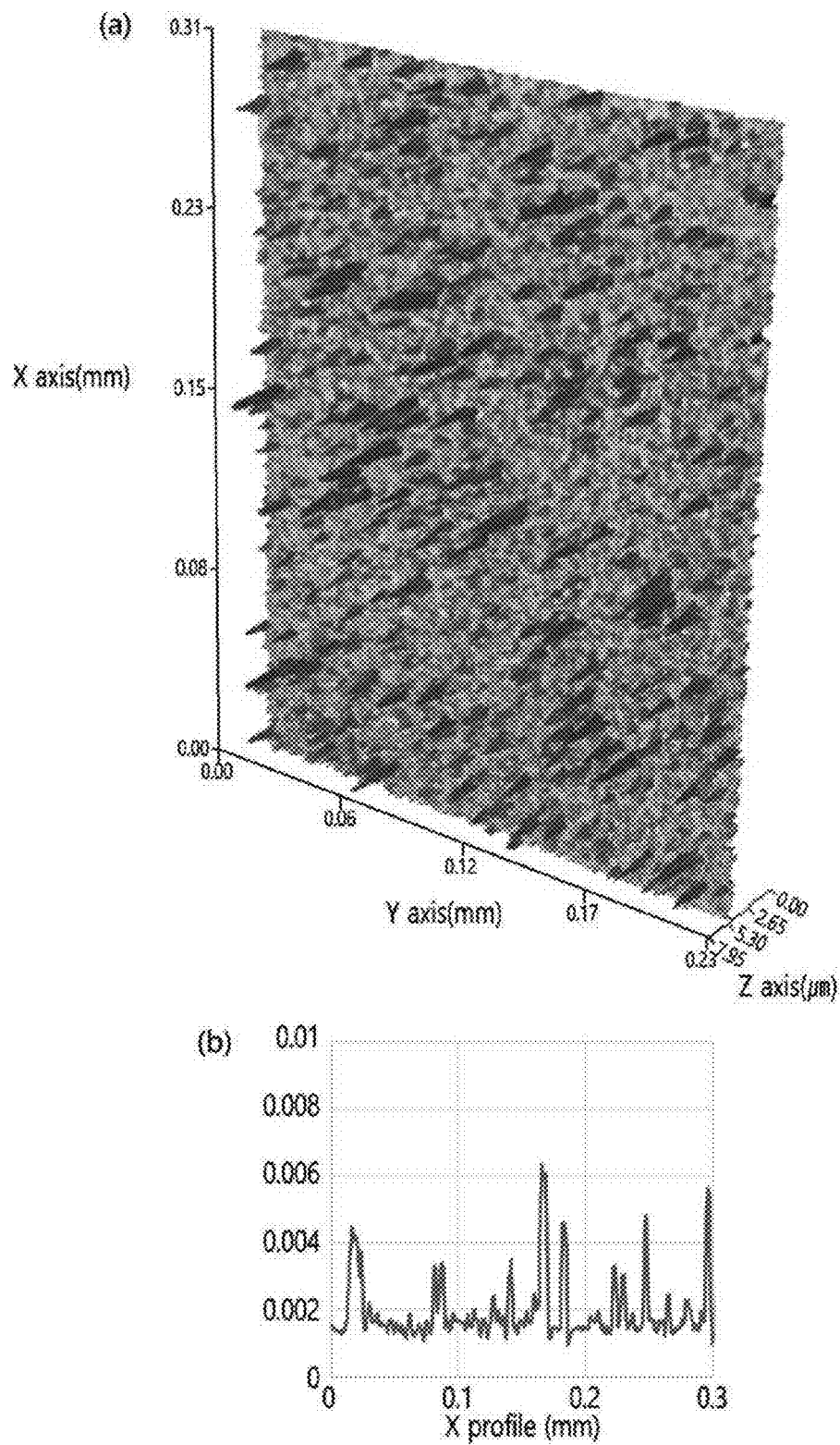

[FIG. 12a]
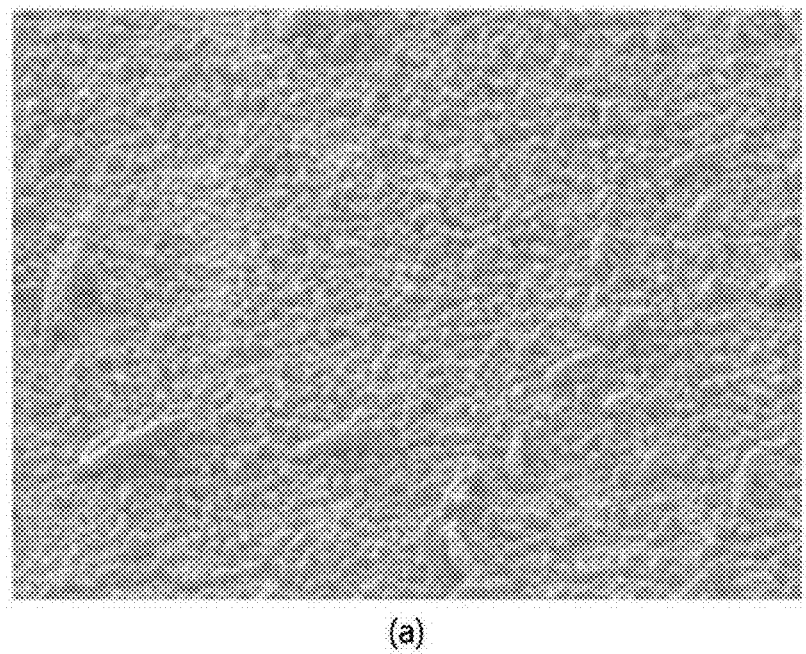
(a)
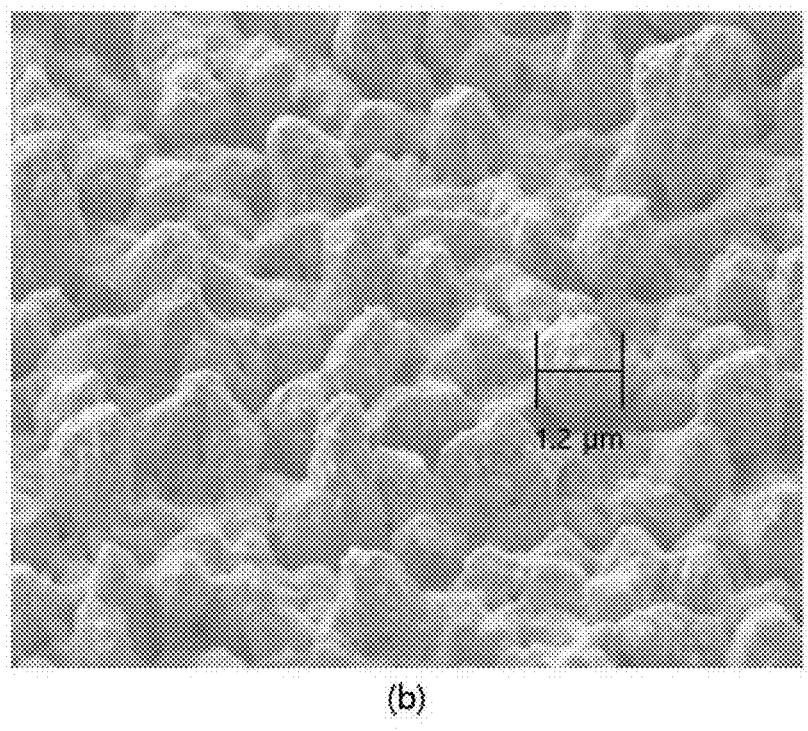
(b)

[FIG. 12b]
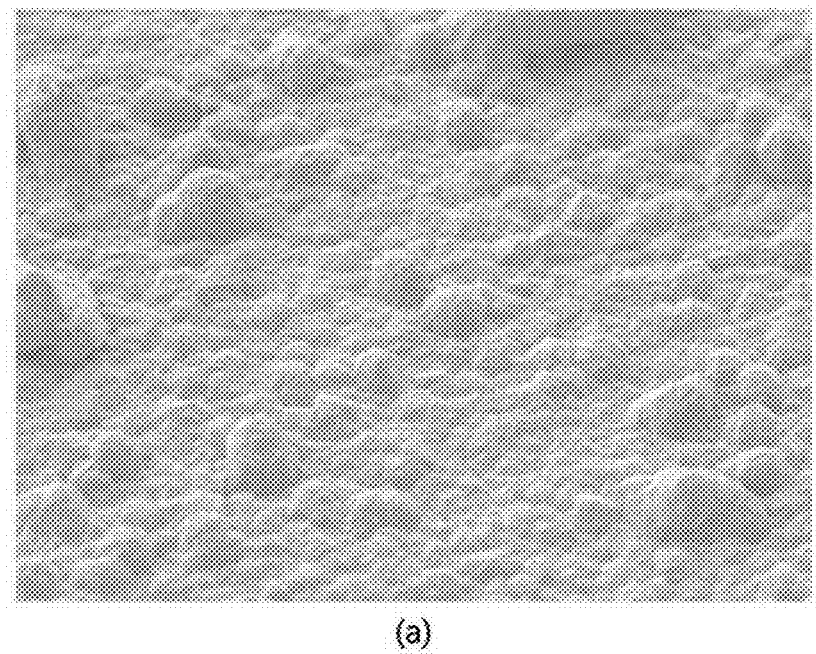
(a)
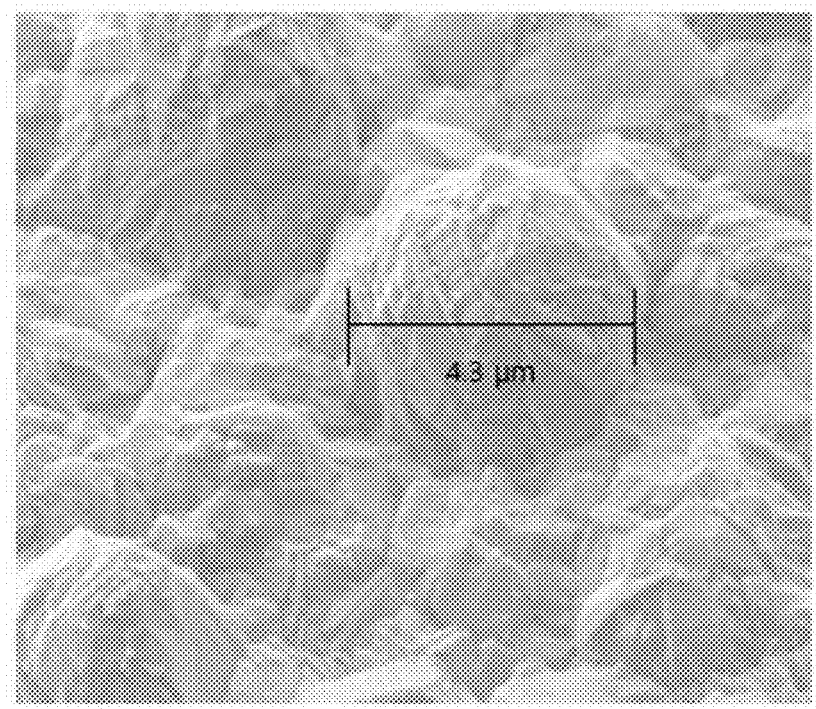
(b)

[FIG. 12c]
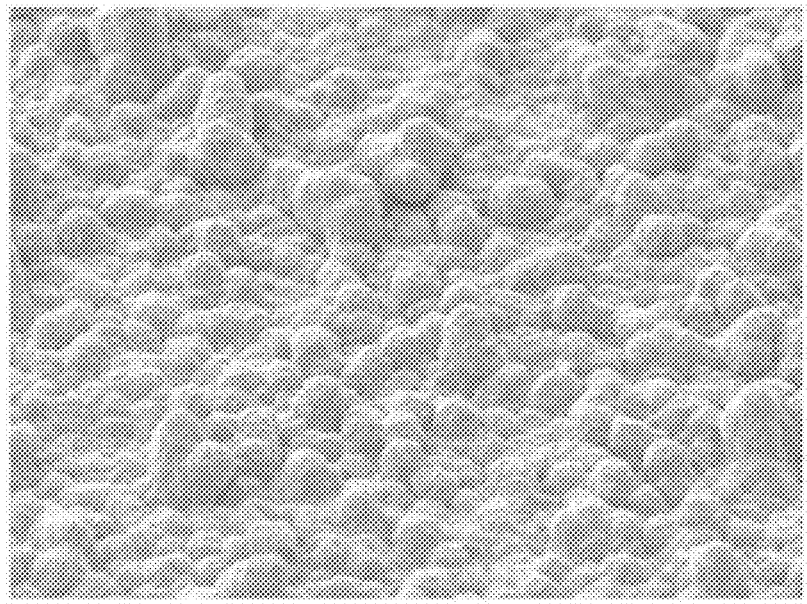
(a)
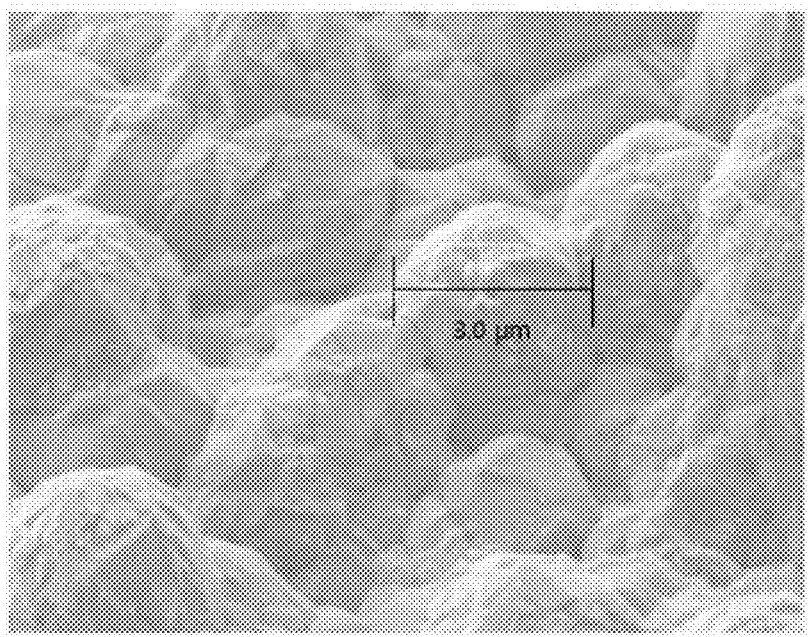
(b)

[FIG. 12d]
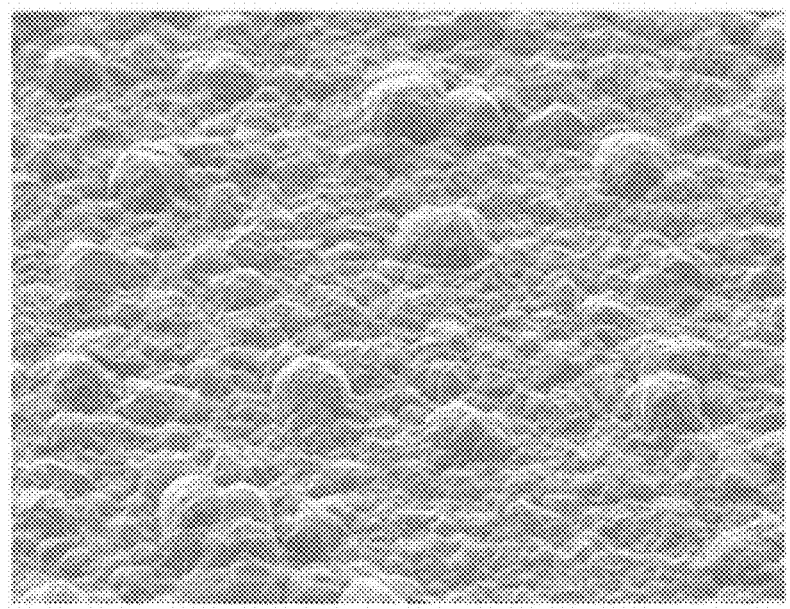
(a)
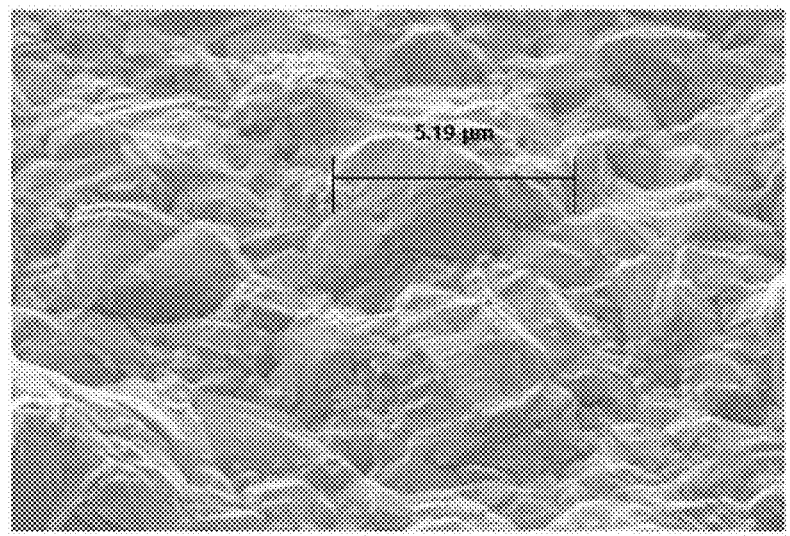
(b)

[FIG. 12e]
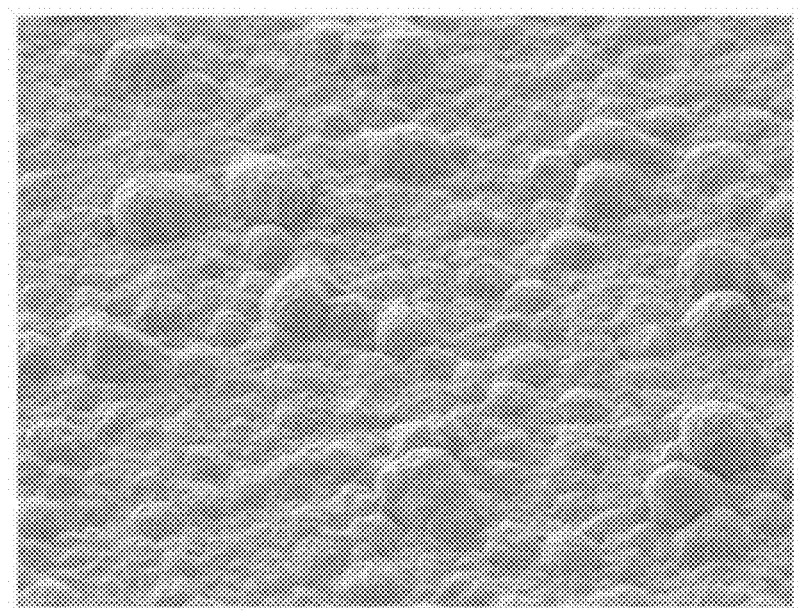
(a)
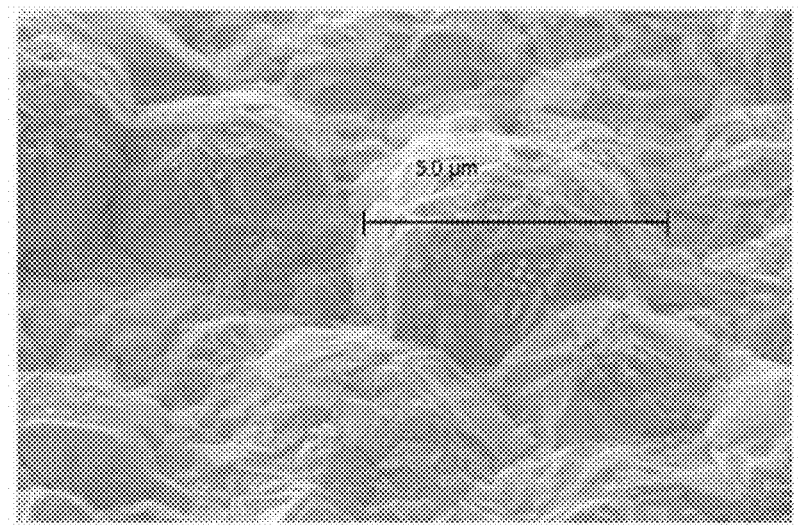
(b)

[FIG. 13a]
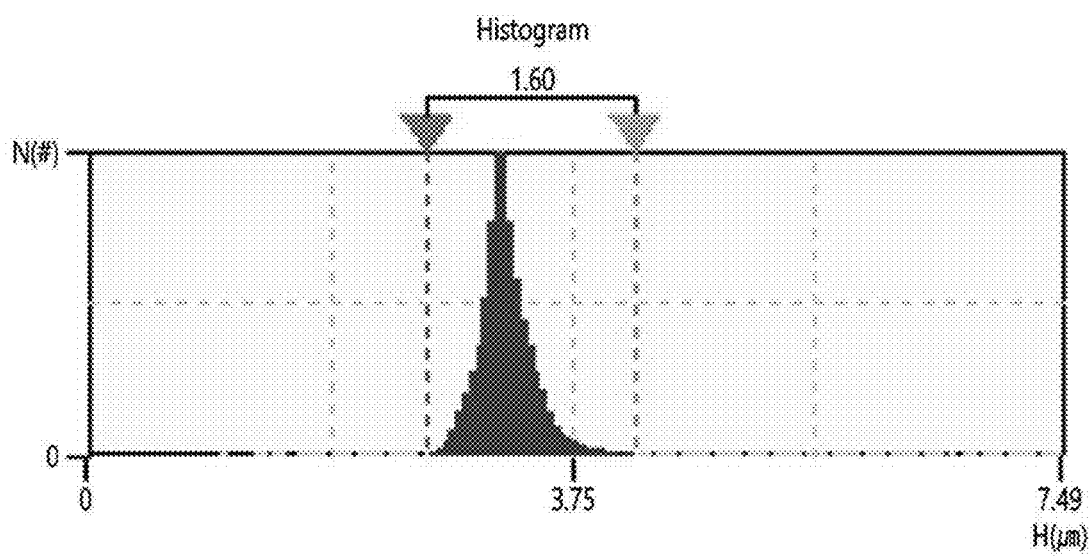

[FIG. 13b]
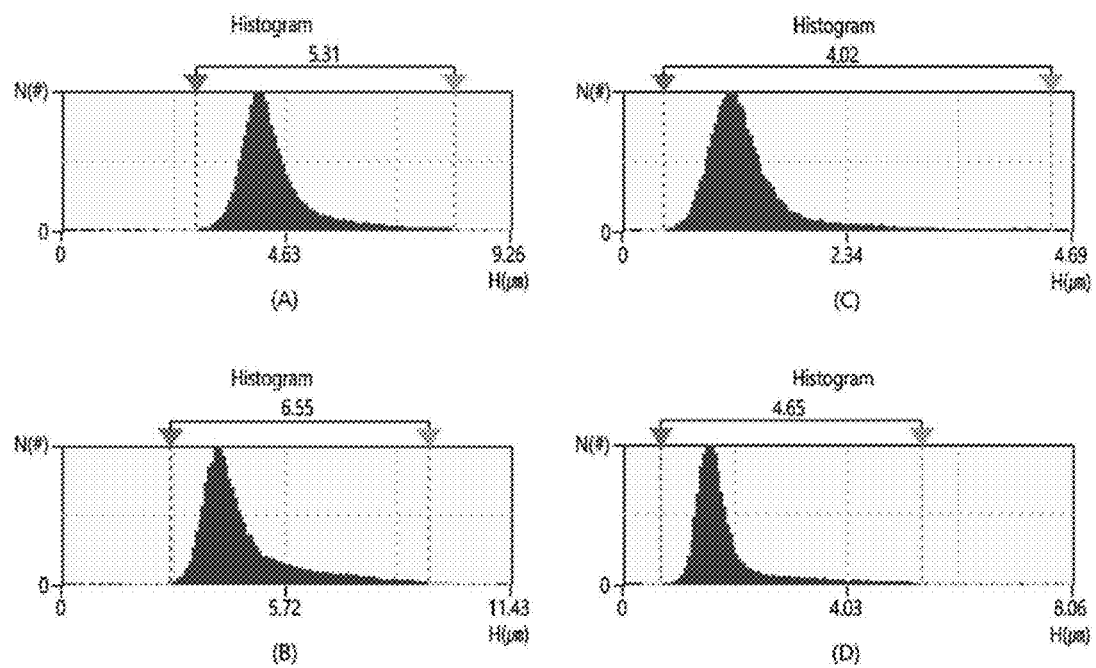

[FIG. 14]
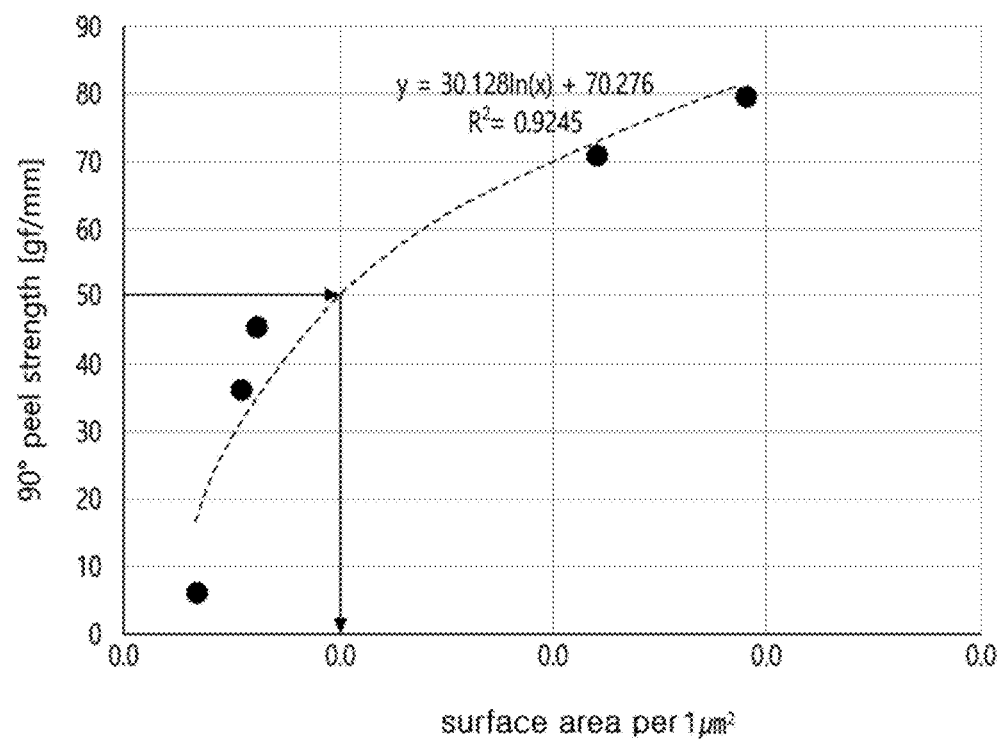

[FIG. 15]
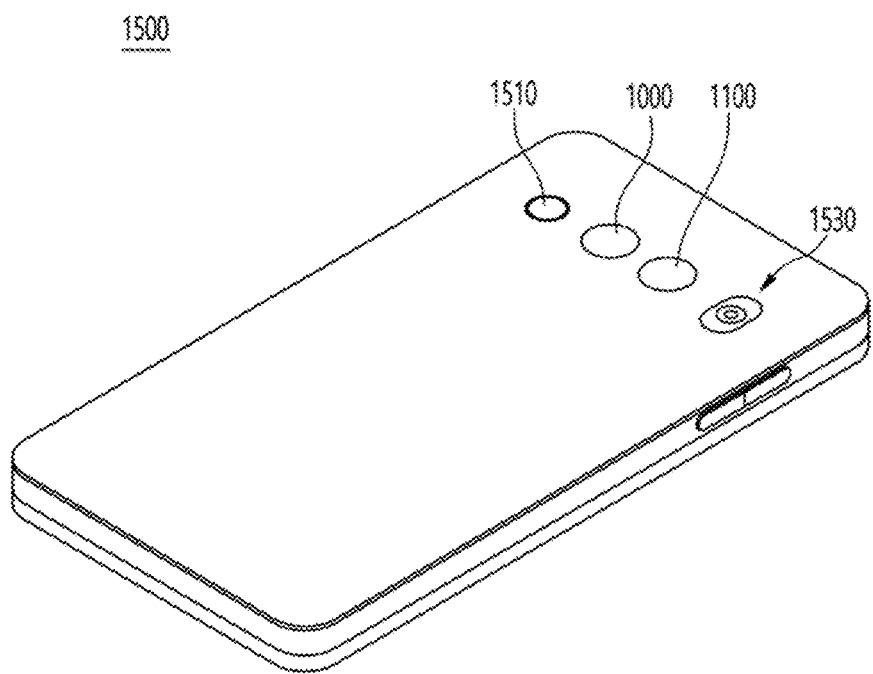

[FIG. 16]
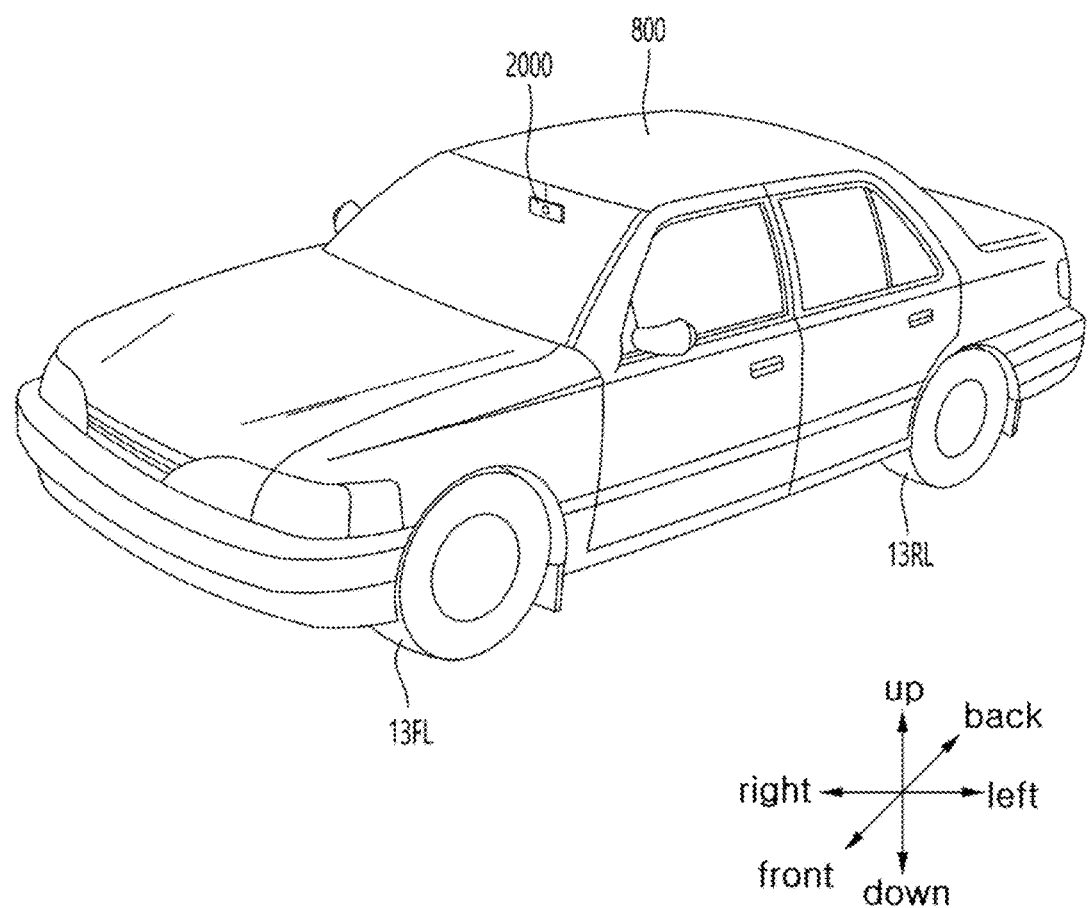

CIRCUIT BOARD, AN IMAGE SENSOR MODULE, A LENS DRIVING DEVICE, AND A CAMERA MODULE INCLUDING THE SAME

CROSS-REFERENCE TO RELATED APPLICATION

This application claims priority to and the benefit of Korean Patent Application No. 10-2021-0051997, filed on Apr. 21, 2021, No. 10-2021-0065557, filed on May 21, 2021, and No. 10-2021-0067575, filed on May 26, 2021, the disclosure of which is incorporated herein by reference in its entirety.

TECHNICAL FIELD

An embodiment relates to a circuit board, an image sensor module, a lens driving device, and a camera module including the same.

BACKGROUND ART

A camera module is driven based on an actuator of a sensor shift method or a module tilt method. An image sensor and a sensor substrate are separated from other structures due to the structure of the actuator. Accordingly, the camera module has a structure in which heat generated from the image sensor and the sensor substrate cannot be transferred to the outside. Accordingly, the camera module has a problem in that the surface temperature of the image sensor and the sensor substrate is continuously increased.

Further, the substrate for shifting the sensor of the camera module (eg, interposer) is in contact with the image sensor or the sensor substrate. However, an area of a contact region between the sensor shift substrate and the image sensor and the sensor substrate is very small. Accordingly, there is a problem that the heat dissipation of the camera module is inefficient.

And, when the size of the image sensor is small, since the amount of heat generated by the image sensor is not large, it is not a big problem. However, the size of an image sensor a recent camera module increases due to an increase in resolution. In addition, when the size of the image sensor increases, reliability problems due to the amount of heat generated by the image sensor increase.

Accordingly, a fundamental countermeasure for solving this is required.

SUMMARY

Technical Problem

An embodiment provides a s circuit board, an image sensor module, a lens driving device, and a camera module including the same, which can improve drivability of an image sensor.

In addition, the embodiment provides a circuit board, an image sensor module, a lens driving device, and a camera module including the same, which can improve the heat dissipation characteristics of the image sensor.

In addition, the embodiment provides a circuit board, an image sensor module, a lens driving device, and a camera module including the same, which can prevent oxidation of a pattern portion.

In addition, the embodiment provides a circuit board, an image sensor module, a lens driving device, and a camera module including the same, which can improve the electrical reliability of the pattern portion.

In addition, the embodiment provides a circuit board, an image sensor module, a lens driving device, and a camera module including the same, which can improve the adhesion between the insulating portion and the pattern portion.

Technical problems to be solved by the proposed embodiments are not limited to the above-mentioned technical problems, and other technical problems not mentioned may be clearly understood by those skilled in the art to which the embodiments proposed from the following descriptions belong.

Technical Solution

A circuit board according to an embodiment includes an insulating portion; and a pattern portion disposed on the insulating portion, wherein the insulating portion includes: a first insulating region, and a second insulating region disposed outside the first insulating region and spaced apart from the first insulating region with a separation region therebetween; wherein the pattern portion includes: a first pattern portion for signal transmission; and a second pattern portion including a dummy pattern separated from the first pattern portion, wherein the first pattern portion includes: a first terminal portion disposed on the first insulating region; a second terminal portion disposed on the second insulating region; and a connection portion disposed on the separation region and connecting between the first terminal portion and the second terminal portion, wherein the second pattern portion includes: a second-first pattern portion disposed on the first insulating region; and a second-second pattern portion disposed on the second insulating region and separated from the second-first pattern portion.

In addition, the second-first pattern portion is disposed on a central region of an upper surface of the first insulating region, and the first terminal portion is disposed on an edge region of the upper surface of the first insulating region excluding the central region.

In addition, the first insulating region includes a first terminal opening portion overlapping the first terminal portion in a vertical direction, wherein a part of the first terminal portion is disposed on the first insulating region; and wherein a remaining part of the first terminal portion is disposed on the first terminal opening portion.

In addition, the second insulating region includes a second terminal opening portion overlapping the second terminal portion in a vertical direction, wherein a part of the second terminal portion is disposed on the second insulating region; and wherein a remaining part of the second terminal portion is disposed on the second terminal opening portion.

In addition, at least one of the first terminal opening portion and the second terminal opening portion is not connected to the separation region of the insulating portion.

In addition, the first insulating region includes a fixing pad opening portion disposed adjacent to the first terminal opening portion and spaced apart from the first terminal opening portion.

In addition, the fixing pad opening portion is connected to the separation region.

In addition, the first insulating region includes: a first portion overlapping the first terminal portion of the first pattern portion and the second-first pattern portion of the second pattern portion in a vertical direction; and a second portion other than the first portion.

In addition, the second insulating region includes: a third portion overlapping the second terminal portion of the first pattern portion and the second-second pattern portion of the second pattern portion in a vertical direction; and a fourth portion excluding the third portion.

In addition, the separation region includes first to fourth corner portions, wherein the connection portion includes first to fourth connection portions including a bending portion disposed on each of the first to fourth corner portions, and wherein the first to fourth connection portions extend in the same direction from one end connected to the first terminal portion and are connected to the second terminal portion.

In addition, the first insulating region includes first-first to first-fourth side regions, wherein the first terminal portion includes first-first to first-fourth terminals disposed on each of the first-first to first-fourth side regions, wherein the second insulating region includes second-first to second-fourth side regions facing each of the first-first to first-fourth side regions of the first insulating region; and wherein the second terminal portion includes second-first to second-fourth terminals disposed on each of the second-first to second-fourth side regions.

In addition, the first-first to first-fourth terminals are disposed adjacent to different corner portions of the first to fourth corner portions of the separation region, respectively, and wherein the second-first to second-fourth terminals are disposed adjacent to different corner portions of the first to fourth corner portions of the separation region, respectively.

In addition, each of the first to fourth connection portions is bent counterclockwise from one end connected to the first terminal portion to be connected to the second terminal portion.

In addition, the first connection portion includes one end connected to the first-first terminal and the other end connected to the second-fourth terminal that does not face the first-first terminal, wherein the second connection portion includes one end connected to the first-second terminal and the other end connected to the second-third terminal that does not face the first-second terminal, wherein the third connection portion includes one end connected to the first-third terminal and the other end connected to the second-first terminal that does not face the first-third terminal, and wherein the fourth connection portion includes one end connected to the first-fourth terminal and the other end connected to the second-second terminal that does not face the first-fourth terminal.

In addition, each of the first to fourth connection portions includes: an inner connection portion disposed inside an open region that opens a part of each of the first to fourth corner portions and an outer connection portion disposed outside the open region, and wherein the number of the inner connection portions is different from the number of the outer connection portions.

In addition, the number of bending points of the inner connection portion is the same as the number of bending points of the outer connection portion.

On the other hand, an image sensor module according to the embodiment includes a first substrate; a second substrate disposed on the first substrate; and an image sensor disposed on the second substrate; wherein the first substrate includes: an insulating portion including a first insulating region and a second insulating region disposed outside the first insulating region and spaced apart from the first insulating region with a separation region therebetween; a first pattern portion including a first terminal portion disposed on the first insulating region, a second terminal portion disposed on the second insulating region, and a connection portion disposed on the separation region to connect between the first terminal portion and the second terminal portion; and a second pattern portion including a second-first pattern portion disposed to be spaced apart from the first terminal portion on the first insulating region, and a second-second pattern portion disposed to be spaced apart from the second terminal portion on the second insulating region and separated from the second-first pattern portion, wherein the second substrate includes: a pad connected to the first terminal portion of the first substrate; and a via passing through the second substrate; wherein the via is connected to the second-first pattern portion with an adhesive member interposed therebetween.

In addition, the first insulating region of the first substrate includes a through hole formed in a region overlapping the second-first pattern portion in a vertical direction and passing through the first insulating region; and wherein the first substrate includes: an adhesive layer disposed in the through hole; and a heat dissipation portion attached to the first substrate through the adhesive layer.

In addition, a planar area of the second-first pattern portion is larger than a planar area of the first insulating region of the first substrate.

In addition, at least a part of the heat dissipation portion is disposed in the through hole formed in the first insulating region.

On the other hand, a circuit board according to another embodiment includes an insulating portion; and a pattern portion disposed on the insulating portion, wherein the insulating portion includes a first insulating region and a second insulating region disposed outside the first insulating region and spaced apart from the first insulating region with a separation region therebetween, wherein the pattern portion includes: a first pattern portion for signal transmission; and a second pattern portion including a dummy pattern separated from the first pattern portion, wherein the first pattern portion includes: a first terminal portion disposed on the first insulating region; a second terminal portion disposed on the second insulating region; and a connection portion disposed on the separation region and connecting between the first terminal portion and the second terminal portion, wherein each of the first terminal portion, the second terminal portion, and the connection portion include: a metal layer, and a plating layer formed on at least one surface of the metal layer, and wherein an average value of sizes of plating particles of the plating layer has a range between 0.8 μm to 5.15 μm.

In addition, the metal layer includes a rolled copper foil alloy.

In addition, the plating particles of the plating layer include a binary or ternary complex element selected from Cu, Ni, Co, Mn and Al.

In addition, a difference value between a first plating particle having a largest size and the second plating particle having a smallest size among the plating particles constituting the plating layer is 7.0 μm or less.

In addition, an surface area of the plating particles included in an unit area (1 μm$^2$) of the plating layer is 0.5 μm 2 or more.

In addition, a centerline average surface roughness (Ra) of the plating layer has a range of 0.05 μm to 1.5 μm, a 10-point average surface roughness (Rz) of the plating layer has a range of 0.6 μm to 15 μm.

In addition, a peel strength (90' peel strength) between the plating layer and the insulating portion is 50 gf/mm or more.

In addition, each of the first terminal portion, the second terminal portion, and the connection portion includes a surface treatment layer disposed on the metal layer and the plating layer.

In addition, the surface treatment layer of the connection portion is entirely disposed on an upper surface and a side surface of the metal layer of the connection portion, and a side surface and a lower surface of the plating layer of the connection portion.

In addition, the surface treatment layer of the first terminal portion is disposed on an upper surface and a side surface of the metal layer of the first terminal portion, and is disposed on a part of a lower surface of the metal layer of the first terminal portion.

In addition, the lower surface of the metal layer of the first terminal portion includes a first-first lower surface overlapping the first insulating region in a thickness direction, and a first-second lower surface other than the first-first lower surface, and wherein the surface treatment layer of the first terminal portion is disposed on the first-second lower surface of the metal layer of the first terminal portion.

In addition, a lower surface of the metal layer of the second terminal portion includes a second-first lower surface overlapping the second insulating region in a thickness direction, and a second-second lower surface other than the second-first lower surface, and wherein the surface treatment layer of the second terminal portion is disposed on the second-second lower surface of the metal layer of the second terminal portion.

In addition, the circuit board further includes a second pattern portion disposed on the insulating portion and separated from the first pattern portion, the first pattern portion is a pattern portion for signal transmission, and the second pattern portion is a dummy pattern portion, and wherein the second pattern portion includes a metal layer, a plating layer and a surface treatment layer to corresponding the first pattern portion.

In addition, the surface treatment layer of each of the first terminal portion, the second terminal portion, and the connection portion includes a first surface treatment portion disposed on the metal layer of each of the first terminal portion, the second terminal portion and the connection portion, and a second surface treatment portion disposed on the plating layer of each of the first terminal portion, the second terminal portion, and the connection portion.

On the other hand, a circuit board according to another embodiment includes an insulating portion; and a pattern portion disposed on the insulating portion, wherein the insulating portion includes a first insulating region and a second insulating region disposed outside the first insulating region and spaced apart from the first insulating region with a separation region therebetween; wherein the pattern portion includes: a first pattern portion for signal transmission; and a second pattern portion including a dummy pattern separated from the first pattern portion, wherein the first pattern portion includes: a first terminal portion disposed on the first insulating region; a second terminal portion disposed on the second insulating region; and a connection portion disposed on the separation region and connecting between the first terminal portion and the second terminal portion, wherein each of the first terminal portion, the second terminal portion; and the connection portion include: a metal layer, and a surface treatment layer disposed on the metal layer and formed of at least one of an organic material, an inorganic material, and an organic-inorganic composite.

In addition, the surface treatment layer of the connection portion is entirely disposed on an upper surface, a side surface, and a lower surface of the metal layer of the connection portion.

In addition, the surface treatment layer of the first terminal portion is disposed on an upper surface and a side surface of the metal layer of the first terminal portion, and is disposed on a part of a lower surface of the metal Dyer of the first terminal portion.

In addition, the lower surface of the metal layer of the first terminal portion includes a first-first lower surface overlapping the first insulating region in a thickness direction, and a first-second lower surface other than the first-first lower surface, and wherein the surface treatment layer of the first terminal portion is disposed on the first-second lower surface of the metal layer of the first terminal portion.

In addition, the surface treatment layer of the second terminal portion is disposed on an upper surface and a side surface of the metal layer of the second terminal portion, and is disposed on a part of a lower surface of the metal layer of the second terminal portion.

In addition, the lower surface of the metal layer of the second terminal portion includes a second-first lower surface overlapping the second insulating region in a thickness direction, and a second-second lower surface other than the second-first lower surface, and wherein the surface treatment layer of the second terminal portion is disposed on the second-second lower surface of the metal layer of the second terminal portion.

In addition, the surface treatment layer includes alkylimidazole.

In addition, the circuit board includes a second pattern portion disposed on the insulating portion and separated from the first pattern portion, the first pattern portion is a pattern portion for signal transmission, and the second pattern portion is a dummy pattern portion, and the second pattern portion includes a metal layer and a surface treatment layer corresponding to the first pattern portion.

In addition, the surface treatment layer of each of the first terminal portion, the second terminal portion, and the connection portion includes a first surface treatment portion disposed on the metal layer of each of the first terminal portion, the second terminal portion and the connection portion, and a second surface treatment portion disposed on the plating layer of each of the first terminal portion, the second terminal portion, and the connection portion.

In addition, the first surface treatment portion includes a metal element different from a metal element constituting the second surface treatment portion.

Advantageous Effects

A lens driving device of the embodiment includes a sensor portion and a circuit board for moving an image sensor connected to the sensor portion. The circuit board may be an interposer. The sensor portion includes a sensor substrate connected to the circuit board and an image sensor mounted on the sensor substrate. In this case, the sensor substrate includes an electrical pad electrically connected to the circuit board and a fixing pad other than the electrical pad. In this case, the circuit board may include an opening portion into which the fixing pad of the sensor substrate is inserted.

Accordingly, the fixing pad of an embodiment may be inserted into the opening portion during a soldering process between the circuit board and the sensor substrate. Through this, the embodiment may facilitate alignment between the circuit board and the sensor substrate in the soldering process.

Further, the embodiment may limit the movement of the sensor substrate in a state in which the positions of the circuit board and the sensor substrate are aligned. Through this, the embodiment can solve the problem of position shift between the circuit board and the sensor substrate occurring in the soldering process. Through this, the embodiment can improve workability.

The embodiment may also improve electrical connectivity between the sensor substrate and the circuit board. Through this, the embodiment may improve product reliability.

In addition, the circuit board of the embodiment includes an insulating portion and a pattern portion. The insulating portion includes a first insulating region, a second insulating region, and a separation region therebetween. In addition, the pattern portion includes a first terminal portion disposed on the first insulating region to be connected to the sensor substrate, a second terminal portion disposed on the second insulating region to be connected to the main substrate, and a connection portion disposed on the separation region and connecting between the first terminal portion and second terminal portion. In this case, the connection portion includes a bending portion disposed on each of corner portions of the separation region. In this case, each of bending portions of the connection portion is bent by rotating in the same direction at the corner portion. Accordingly, the mobility of the sensor portion by the circuit board may be improved by the bent structure of the connection portion. Furthermore, the embodiment may improve the accuracy of the movement position of the sensor portion.

In addition, the bending portion of the connection portion of the embodiment includes a first open region that opens a part of each of the corner portions of the separation region. In this case, the first open region may be formed at a position overlapping a protrusion of a second frame constituting the first moving portion in the optical axis direction. In addition, the connection portion includes an inner connection portion disposed inside the first open region and an outer connection portion disposed outside the first open region while avoiding the first open region. In this case, the number of the inner connection portion may be smaller than the number of the outer connection portion.

Accordingly, the embodiment may increase the mobility of the first moving portion by making the number of outer connection portion disposed outside of the first open region larger than the number of inner connection portion disposed inside the first open region. For example, when the number of the outer connection portion is greater than the number of the inner connection portion, the amount of movement of the first moving portion can be easily adjusted compared to the opposite case. For example, the outer connection portion is disposed outside the first open region to have a greater length than the inner connection portion. And, since the length of the outer connection portion is greater than the length of the inner connection portion, the intensity of the driving force required to move the first moving portion may be reduced compared to the inner connection portion. Accordingly, the mobility of the first moving portion in the embodiment may be improved by a difference in the number of the inner connection portion and the outer connection portion. Furthermore, the amount of movement of the first moving portion can be finely adjusted.

In addition, each of the outer connection portion and the inner connection portion of the embodiment includes a plurality of bending points. In this case, the number of bending points of the outer connection portion may be the same as the number of bending points of the inner connection portion. In addition, the mobility of the first moving portion may be increased by the same number of bending points.

For example, when the number of bending points of the outer connection portion is different from the number of bending points of the inner connection portion, force may be concentrated on a connection portion having a relatively large number of bending points. Accordingly, a problem may occur in which the connection portion on which the force is concentrated is broken before other connection portion. Furthermore, a problem ay occur in the movement accuracy of the first moving portion.

In contrast, when the first moving portion moves, the force applied to the inner connection portion and the outer connection portion in the embodiment may be uniformly distributed because the number of the bending points is the same. Accordingly, in the embodiment, the force may be uniformly distributed to the inner connection portion and the outer connection portion. Accordingly, the embodiment can solve the problem that the specific connection portion is cut off first. Furthermore, even when the connection portion is cut off, the inner connection portion and the outer connection portion in the embodiment may be cut off at the same time.

Meanwhile, the embodiment includes an adhesive layer disposed in a through hole passing through the first insulating region of the circuit board, and a heat dissipation portion attached to the circuit board through the adhesive layer. In addition, the heat dissipation portion may dissipate heat generated from the sensor substrate.

Accordingly, the embodiment may improve heat dissipation characteristics by dissipating heat generated by the image sensor to the outside. Accordingly, the embodiment may improve the operational reliability of the image sensor. Furthermore, the embodiment may improve the quality of an image obtained from an image sensor.

In addition, the pattern portion of the embodiment includes a metal layer and a surface treatment layer disposed on the metal layer. The surface treatment layer may be a thin film layer formed by coating an organic material. In this case, the dielectric constant (Er) of the organic material is 3.24. This value is significantly smaller than the dielectric constant (Er) of nickel or gold (Au) of a normal surface treatment layer. That is, the dielectric constant (Er) of the nickel or gold (Au) is 4 or ore.

Accordingly, the embodiment may improve the signal transmission speed of the wiring that changes in inverse proportion to the relative dielectric constant of the surface treatment layer. Accordingly, the embodiment may improve product reliability of the circuit board.

In addition, the thermal conductivity of the organic material used in the surface treatment layer of the embodiment is higher than the thermal conductivity of nickel. Accordingly, the embodiment may increase the thermal conductivity of the pattern portion.

In particular, heat dissipation characteristics of electronic products including camera modules are emerging as a major issue because they affect product performance. That is, the components included in the camera module have a structure vulnerable to heat dissipation. Accordingly, efforts are being made to improve the heat dissipation characteristics of the camera module. In this case, the embodiment may increase the thermal conductivity of the pattern portion by the organic coating. Accordingly, the embodiment may improve the heat dissipation characteristics of the circuit board and the heat dissipation characteristics of the camera module to which the circuit board is applied.

In addition, the pattern portion of the embodiment is a portion of the configuration of the first moving portion of the camera module. Accordingly, the pattern portion may move along with the movement of the first moving portion. In addition, the pattern portion may be in contact with other components when the first moving portion moves. In this case, when the pattern portion is in contact with other components, a problem in electrical reliability may occur.

At this time, the organic material of the surface treatment layer of the embodiment has an electrical conductivity lower than that of nickel or gold. Accordingly, when the pattern portion is in contact with other components, the surface treatment layer may perform an insulating function. Accordingly, the embodiment may improve the electrical reliability of the circuit board. In addition, the embodiment may simplify the plating process by applying the organic coating method, further reducing the plating cost.

On the other hand, the pattern portion of the embodiment includes a plating layer disposed between the metal layer and the surface treatment layer. The plating layer may improve peel strength between the pattern portion and the insulating portion.

In this case, the plating layer has a surface roughness. In this case, even when the surface roughness of the plating layer increases, the adhesion between the plating layer and the insulating portion may decrease. Accordingly, the embodiment improves the adhesion by controlling the size of the plating particles constituting the plating layer.

For example, the average value of the plating particles of the plating layer of the embodiment has a range between 0.8 µm to 5.15 µm. In addition, a difference value between a first plating particle having a maximum size and a second plating particle having a minimum size of the plating layer in the embodiment is 7.0 µm or less. In addition, a surface area of the plating particles in an unit area (1 µm$^2$) of the plating layer may be 0.5 µm 2 or more. In addition, a centerline average surface roughness (Ra) of the plating layer has a range of 0.05 µm to 1.5 µm. In addition, a 10-point average surface roughness (Rz) of the plating layer has a range of 0.6 µm to 15 µm. Accordingly, the embodiment may further improve the adhesion between the pattern portion and the insulating portion. Further, the peel strength (90 peel strength) between the pattern portion and the insulating portion in the embodiment is 50 gf/mm or more. Accordingly; the embodiment can solve the reliability problem in which the pattern portion is detached from the insulating portion in an environment in which the camera module is used. Furthermore, the embodiment may improve the operation reliability of the auto-focusing or hand-shake prevention function of the camera module.

BRIEF DESCRIPTION OF THE DRAWINGS

FIG. 1 is an exploded perspective view of a lens driving device according to an embodiment.

FIG. 2 is a perspective view of a main substrate of the lens driving device according to the embodiment, FIG. 3 is a bottom view of a sensor substrate of the embodiment.

FIG. 4a is an exploded perspective view of a substrate according to an embodiment.

FIG. 4b is a plan view of an insulating portion of FIG. 4a.

FIG. 4c is a plan view of a pattern portion of FIG. 4a.

FIG. 4d is an enlarged view of the pattern portion of FIG. 4c.

FIG. 4e is a plan view of a substrate of an embodiment.

FIG. 4f is a coupling view of the substrate and the sensor substrate of the embodiment.

FIG. 5a is a cross-sectional view of an image sensor module according to a first embodiment.

FIG. 5b is a view showing a modified example of the image sensor module of FIG. 5a.

FIG. 6 is a cross-sectional view showing an image sensor module according to a second embodiment.

FIG. 7 is a view showing an image sensor module according to a third embodiment.

FIG. 8a is a view for explaining a layer structure of a pattern portion according to a first embodiment, FIG. 8b is a view showing a chemical reaction formula of a surface treatment layer of FIG. 8a, FIG. 8c is a view showing a surface of the surface treatment layer of FIG. 8a.

FIG. 9a is a view for explaining a layer structure of a pattern portion according to a second embodiment, FIG. 9b is an enlarged view of a connection portion of FIG. 9b.

FIG. 9c is a view showing a second surface treatment portion of the surface treatment layer of FIG. 9a.

FIG. 10 is a view for explaining a surface roughness of a metal layer and a plating layer of the pattern portion according to the embodiment.

FIGS. 11a to 11e are views for explaining the relationship between plating conditions and adhesion of a plating layer according to an embodiment.

FIGS. 12a to 12e are SEM photographs showing a surface of the plating layer according to the first to fifth plating conditions.

FIGS. 13a and 13b are views showing histograms of the plating particle size of the plating layer according to the first to fifth plating conditions.

FIG. 14 is a graph showing the relationship between a surface area of the plating particles and a peel strength according to the embodiment.

FIG. 15 is a mobile terminal to which a camera module according to an embodiment is applied.

FIG. 16 is a perspective view of a vehicle to which a camera module according to an embodiment is applied.

DETAILED DESCRIPTION OF THE EMBODIMENTS

Hereinafter, embodiments of the present invention will be described in detail with reference to the accompanying drawings.

However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art. Further, the terms used in the embodiments of the present invention are for describing the embodiments and are not intended to limit the present invention.

In this specification, the singular forms may also include the plural forms unless specifically stated in the phrase, and may include at least one of all combinations that may be combined in A B, and C when described in "at least one (or more) of A (and), B, and C". Further, the terms such as first, second, A, B, (a), and (b) may be used in describing the elements of the embodiments of the present invention.

These terms are only used to distinguish the elements from other elements, and the terms are not limited to the essence, order, or order of the elements. In addition, when an element is described as being "connected", "coupled", or "contacted" to another element, it may include not only when the element is directly "connected" to, "coupled" to, or "contacted" to other elements, but also when the element is "connected", "coupled", or "contacted" by another element between the element and other elements.

In addition, when described as being formed or disposed "on (over)" or "under (below)" of each element, the "on (over)" or "under (below)" may include not only when two elements are directly connected to each other, but also when one or more other elements are formed or disposed between two elements. Further, when expressed as "on (over)" or "under (below)", it may include not only the upper direction but also the lower direction based on one element.

Hereinafter, a configuration of the camera module will be described with reference to the drawings.

FIG. 1 is an exploded perspective view of a lens driving device according to an embodiment, FIG. 2 is a perspective view of a main substrate of the lens driving device according to the embodiment, and FIG. 3 is a bottom view of a sensor substrate of the embodiment.

Referring to FIGS. 1 to 3, a lens driving device may include a fixed portion 100, a first moving portion 200, a second moving portion 300, a guide member 400, a first elastic member 500, a second elastic member 600, and a substrate 700. The substrate 700 may be an interposer. The substrate 700 may be coupled to the first moving portion 200. For example, the substrate 700 may be coupled to a sensor portion of the first moving portion 200. In addition, the substrate 700 may electrically connect between the fixed portion 100 and the sensor portion 240. Furthermore, the substrate 700 allows the sensor portion 240 to move relative to the fixed portion 100. For example, the substrate 700 may elastically support the sensor portion 240 while electrically connecting between the sensor portion 240 and the fixed portion 100 so that the sensor portion 240 is movable relative to the fixed portion 100. This will be described in more detail below.

The lens driving device may be a voice coil motor (VCM, Voice Coil Motor). The lens driving device may be a lens driving motor. The lens driving device may be a lens driving actuator. The lens driving device may include an AF module. The lens driving device may include an OIS module.

The fixed portion 100 may mean a part having a fixed position among components of the lens driving device. For example, the position of the fixed portion 100 may be fixed during an OIS operation or an AF operation of the lens driving device. The fixed portion 100 may be disposed to surround an outside of the first moving portion 200, The fixed portion 100 may be spaced apart from the first moving portion 200. Preferably, when the first moving portion 200 moves during the OIS operation of the lens driving device, the fixed portion 100 may be a fixed position. Also, when the second moving portion 300 moves during the AF operation of the lens driving device, the fixed portion may be a fixed position. The fixed portion 100 may include a main substrate 110, a first frame 120, and a first driving member 130.

The first moving portion 200 may be disposed in an inner space of the fixed portion 100, The first moving portion 200 may be disposed to be spaced apart from the first moving portion 200 in the inner space of the fixed portion 100.

The first moving portion 200 may move relative to the fixed portion 100 in the inner space of the fixed portion 100. For example, the first moving portion 200 may rotate about a first axis. For example, the first moving portion 200 may perform a yaw operation to rotate about an x-axis corresponding to the first axis. For example, the first moving portion 200 may rotate based on a second axis perpendicular to the first axis. For example, the first moving portion 200 may perform a pitching operation to rotate about a y-axis corresponding to the second axis. Specifically, the first moving portion may be an OIS module for OIS operation. Here, the rotation may include declining or tilting. The first moving portion 200 may include a second frame 210, a sub frame 220, a second driving member 230, and a sensor portion 240.

The second moving portion 300 may be disposed in an inner space of the first moving portion 200. The second moving portion 300 may move with respect to the fixed portion 100 and the first moving portion 200. For example, the second moving portion 300 may move based on a third axis. For example, the second moving portion may perform an auto-focusing operation to move in a z-axis (or optical axis) corresponding to the third axis. Specifically, the second moving portion 300 may be an AF module for an AF operation. The second moving portion 300 may include a third frame 310, a lens 320, and a third driving member 330.

The guide member 400 may be a rolled member. For example, the guide member 400 may include a plurality of balls. The guide member 400 may be disposed between the fixed portion 100 and the first moving portion 200. The guide member 400 may guide the first moving portion 200 to be moved with respect to the fixed portion 100. The guide member 400 may include an upper guide member 410 and a lower guide member 420.

The first elastic member 500 may be a pressing member. The first elastic member 500 may correspond to the guide member 400. The first elastic member 500 may be provided to correspond to the number of balls constituting the guide member 400. The first elastic member 500 may be disposed on the fixed portion 100. The first elastic member 500 may press the guide member 400. Specifically; the first elastic member 500 includes a coupling region coupled to the fixed portion 100. Also, the first elastic member 500 may include a contacting region extending from the coupling region to contact the guide member 400. In addition, the contacting region of the first elastic member 500 may have an elastic force. Accordingly, the guide member 400 may be pressed in the z-axis direction. The first elastic member 500 may include a first upper elastic member 510 and a first lower elastic member 520.

The second elastic member 600 may elastically couple the second moving portion 300 to the first moving portion 200. For example, the second elastic member 600 elastically supports the second moving portion 300 with respect to the first moving portion 200, so that the second moving portion 300 is movable in the inner space of the first moving portion 200. Accordingly, the second moving portion 300 may move in the z-axis direction corresponding to the optical axis by the elastic force of the second elastic member 600 in a state elastically coupled to the first moving portion 200. The second elastic member 600 may include a second upper elastic member 610 and a second lower elastic member 620.

The substrate 700 may electrically connect the fixed portion 100 and the first moving portion 200 to each other. In this case, the substrate 700 may be elastically connected so that the first moving portion 200 is movable relative to the fixed portion 100. The substrate 700 may include a 'pattern portion' that is elastically bent when the first moving portion 200 moves in a state in which the fixed portion 100 and the first moving portion 200 are electrically connected. For example, the substrate 700 may be referred to as an 'interposer' disposed between the fixed portion 100 and the sensor portion 240 of the first moving portion 200. For example, the substrate 700 may be referred to as a 'sensor moving substrate' that enables the relative movement of the sensor portion 240 of the first moving portion 200 with respect to the fixed portion 100.

The fixed portion 100 may include the main substrate 110. The main substrate 110 may also be referred to as a 'first substrate'. The main substrate 110 may be coupled to the first frame 120. The main substrate 110 may be a board electrically connected to an external device. Here, the external device may be a power supply unit and/or a control unit of the optical device. The main substrate 110 may be disposed under the first frame 120. The main substrate 110 may include a connector 115 for connection to an external device.

The main substrate 110 may include an opening portion overlapping the first moving portion 200 and the second moving portion 300 in the optical axis direction. The main substrate 110 may include a pad 114 disposed on an upper surface adjacent to the opening portion 111. The pad 114 may be formed to surround the upper surface of the main substrate 110 adjacent to the opening portion 111. The pad 114 of the main substrate 110 may be electrically connected to a coil portion (not shown) of the first driving member 130. Specifically, the pad 114 of the main substrate 110 may be electrically connected to a coil substrate (not shown) of the first driving member 130.

The main substrate 110 may include a first driver IC 112. The first driver IC 112 may be connected to a driving member. Here, the driving member may be a coil portion.

The first driver IC 112 may be electrically connected to a Hall sensor (not shown). The hall sensor may detect a position of the moving portion moved by the driving member. In addition, the first driver IC 112 may supply a current to the coil portion to control the first moving portion 200 to rotate based on the x-axis or the y-axis. Also, the first driver IC 112 may adjust the direction or strength of the current applied to the coil portion 132 based on a position value sensed through the Hall sensor (not shown).

The main substrate 110 may include a gyro sensor 113. The gyro sensor may detect hand-shake information. For example, the gyro sensor 113 may detect a movement of a user using a camera module to which the lens driving device is mounted.

On the other hand, the lower surface of the main substrate 110 may include an additional pad 116. The pad 116 disposed on the lower surface of the main substrate 110 may be electrically connected to a substrate 700 to be described later.

The first moving portion 200 may include a sensor portion 240.

The sensor portion 240 may be coupled to the second frame 210. That is, the sensor portion 240 may rotate along the x-axis or the y-axis together with the second frame 210. The sensor portion 240 may include a sensor substrate 241.

The sensor substrate 241 may include a pad.

For example, a pad coupled to the substrate 700 may be provided on a lower surface of the sensor substrate 241. Specifically, the pad connected to the substrate 700 may be formed on an edge of a lower surface of the sensor substrate 241.

For example, a first pad 241-1 may be formed on a first region of a lower surface of the sensor substrate 241, For example, a second pad 241-2 may be formed on a second region of the lower surface of the sensor substrate 241 facing the first region. For example, a third pad 241-3 may be formed on a third region between the first region and the second region of the lower surface of the sensor substrate 241. In addition, a fourth pad 241-4 may be formed on a fourth region of the lower surface of the sensor substrate 241 facing the third region.

Each of the first pad 241-1, the second pad 241-2, the third pad 241-3, and the fourth pad 241-4 may be disposed to be biased toward one side in the first to fourth regions of the lower surface of the sensor substrate 241.

For example, the first pad 241-1 may be disposed adjacent to the fourth region in the first region of the lower surface of the sensor substrate 241. For example, the second pad 241-2 may be disposed adjacent to the third region in the second region of the lower surface of the sensor substrate 241. For example, the third pad 241-3 may be disposed adjacent to the first region in the third region of the lower surface of the sensor substrate 241. For example, the fourth pad 241-4 may be disposed adjacent to the second region in the fourth region of the lower surface of the sensor substrate 241, Accordingly, the embodiment may improve the mobility of the first moving portion 200.

For example, the pad of the sensor substrate 241 has a form that rotates in a clockwise or counterclockwise direction (eg, a form that is biased toward one side in a clockwise or counterclockwise direction). This may correspond to the arrangement structure of the pattern portion of the substrate 700.

The pad formed on the lower surface of the sensor substrate 241 may be electrically connected to a first terminal portion 721-1 of the substrate 700. For example, the pad of the sensor substrate 241 and the first terminal portion 721-1 of the substrate may be coupled by soldering.

On the other hand, the pad of the sensor substrate 241 proves the ease of coupling between the sensor substrate 241 and the substrate 700 in addition to signal transmission.

For example, the pad of the sensor substrate 241 includes an electrical pad electrically connected to the pattern portion of the substrate 700. In addition; the pad of the sensor substrate 241 includes a pad electrically separated from the pattern portion of the substrate 700. The electrically separated pad is a fixing pad for fixing the sensor substrate 241 to the substrate 700 in the soldering process.

For example, the first pad 241-1 includes the first-first pad 241-1a electrically connected to the pattern portion of the substrate 700. The first-first pad 241-1a may be configured in plurality. Also, the first pad 241-1 may include a first-second pad 241-1b that is not electrically connected to the pattern portion of the substrate 700. At this time, although it is illustrated in the drawings that the first-second pad 241-1b is configured of one, the embodiment is not limited thereto. For example, the first-second pad 241-1b may be configured in plurality. And when the first-second pads 241-1b are configured in plurality, the plurality of first-second pads 241-1b may be all arranged on one side of the first-first pad 241-1a. Alternatively, when the first-second pads 241-1b are configured in plurality, the plurality of first-second pads 241-1*b* may be disposed on one side and the other side of the first pad 241-1, respectively. The first-first pad 241-1*a* and the first-second pad 241-1*b* are functionally divided and may be formed of the same metal material. For example, the first-first pad 241-1*a* and the first-second pad 241-1*b* may be simultaneously formed.

For example, the second pad 241-2 includes a second-first pad 241-2*a* electrically connected to the pattern portion of the substrate 700. The second-first pad 241-2*a* may be configured in plurality. Also, the second pad 241-2 may include a second-second pad 241-2*b* that is not electrically connected to the pattern portion of the substrate 700. A plurality of second-second pads 241-2*b* may also be configured.

Meanwhile, the third pad 241-3 may include only electrical pads electrically connected to the pattern portion of the substrate 700. In addition, the fourth pad 241-4 may include only electrical pads electrically connected to the pattern portion of the substrate 700. However, the third pad 241-3 and the fourth pad 241-4 may include an electric pad and a fixing pad corresponding to the first pad 241-1 and the second pad 241-2.

The first-second pad 241-1*b* and the second-second pad 241-2*b* may be formed to facilitate a soldering operation between the substrate 700 and the sensor substrate 241. For example, the first-second pad 241-1*b* and the second-second pad 241-2*b* may align the pattern portion of the substrate 700 with the pad of the sensor substrate 241. For example, the first-second pad 241-1*b* and the second-second pad 241-2*b* may guide an alignment position between the substrate 700 and the sensor substrate 241.

For example, there may be difficulties in a soldering process for bonding the substrate 700 and the sensor substrate 241 in the comparative example in which the first-second pad 241-1*b* and the second-second pad 241-2*b* are not included. For example, the soldering process in the comparative example should be performed by individually aligning the plurality of pads of the sensor substrate 241 and the pattern portions of the substrate 700. Furthermore, a positional shift between the sensor substrate 241 and the substrate 700 in the comparative example may occur during the soldering process.

Unlike this, when the soldering process of the substrate 700 and the sensor substrate 241 is performed, the first-second pad 241-1*b* and the second-second pad 241-2*b* in an embodiment may be inserted into the fixing pad opening portion of the substrate 700. Through this, the embodiment may facilitate alignment of the positions of the substrate 700 and the sensor substrate 241. Furthermore, the movement of the sensor substrate 241 in the embodiment may be restricted by the first-second pad 241-1*b* and the second-second pad 241-2*b*. For example, the movement of the first-second pad 241-1*b* and the second-second pad 241-2*b* may be restricted while being inserted into the fixing pad opening portion of the substrate 700. Accordingly, the embodiment can solve the problem of position shift occurring in the soldering process. Accordingly, the embodiment may improve workability. Furthermore, the embodiment may improve electrical connectivity and product reliability between the sensor substrate 241 and the substrate 700.

<Substrate for Moving Image Sensor>

FIG. 4*a* is an exploded perspective view of a substrate according to an embodiment, FIG. 4*b* is a plan view of an insulating portion of FIG. 4*a*, FIG. 4*c* is a plan view of a pattern portion of FIG. 4*a*, FIG. 4*d* is an enlarged view of the pattern portion of FIG. 4*c*, FIG. 4*e* is a plan view of a substrate of an embodiment, and FIG. 4*f* is a coupling view of the substrate and the sensor substrate of the embodiment.

Hereinafter, the substrate 700 and the electrical connection structure thereof according to the embodiment will be described with reference to FIGS. 4*a* to 4*f*.

The substrate 700 according to the embodiment includes an insulating portion 710 and a pattern portion 720, In addition, the substrate 700 may further include a connection spring portion 800 according to an embodiment.

The insulating portion 710 may include a first insulating region 711 and a second insulating region 712 spaced apart from the first insulating region 711. In addition, the insulating portion 710 may include a separation region 713 between the first insulating region 711 and the second insulating region 712.

For example, the first insulating region 711 and the second insulating region 712 may be spaced apart from each other with the separation region 713 interposed therebetween. For example, the second insulating region 712 may be disposed to surround the outside of the first insulating region 711. The first insulating region 711 and the second insulating region 712 may have various shapes such as a square shape, a circular shape, an oval shape, and a polygonal shape.

The first insulating region 711 may correspond to the sensor substrate 241. The second insulating region 712 may correspond to the main substrate 110. For example, the first insulating region 711 may overlap the sensor substrate 241 in the optical axis direction. The second insulating region 712 may overlap the main substrate in the optical axis direction.

The first insulating region 711 and the second insulating region 712 may be separated from each other. Another insulating region of the insulating portion may not exist between the first insulating region 711 and the second insulating region 712. The first insulating region 711 and the second insulating region 712 may be separated from each other at positions spaced apart from each other. Accordingly, the embodiment may improve the mobility of the sensor driving device. Here, the mobility of the sensor driving device may include a tilting characteristic in the x-axis, y-axis, and z-axis, and a shift characteristic in the x-axis, y-axis, and z-axis directions. Specifically, the strength of the driving force required to move the first moving portion in the embodiment may be reduced by the mutual separation structure of the first and second insulating regions. That is, the first insulating region 711 in the embodiment may be freely moved together with the first moving portion without being disturbed by the second insulating region 712.

The first insulating region 711 may include a first portion 711*a* and a second portion 711*b*. The first portion 711*a* may be a central region of the first insulating region 711. The second portion 711*b* may be an edge region of the first insulating region disposed around the first portion 711*a* of the first insulating region 711. Preferably, the first portion 711*a* may be a part overlapping the second-first pattern portion 722-1 of the second pattern portion 722 in a vertical direction or an optical axis direction. The second portion 711*b* may be a part that does not overlap the second-first pattern portion 722-1 of the second pattern portion 722 in the vertical direction or the optical axis direction. That is, the first insulating region 711 may have a greater width than the second-first pattern portion 722-1, Accordingly, at least a part of the first insulating region 711 may not overlap the second-first pattern portion 722-1 in the vertical direction or the optical axis direction.

The second insulating region 712 may include a third portion 712*a* and a fourth portion 712*b*. The third portion 712a may be a central region of the second insulating region 712. The fourth portion 712b may be an edge region of the second insulating region 712 disposed around the third portion 712a of the second insulating region 712. Preferably, the third portion 712a may be a part overlapping the second-second pattern portion 722-2 of the second pattern portion 722 in a vertical direction or an optical axis direction. The fourth portion 712b may be a part that does not overlap the second-second pattern portion 722-2 of the second pattern portion 722 in the vertical direction or the optical axis direction. That is, the second insulating region 712 may have a greater width than the second-second pattern portion 722-2. Accordingly, at least a part of the second insulating region 712 may not overlap the second-second pattern portion 722-2 in a vertical direction or an optical axis direction.

The first insulating region 711 may include a plurality of opening portions. The first insulating region 711 may include a first terminal opening portion. For example, the first insulating region 711 may include a first terminal opening portion exposing the first terminal portion 721.

The first terminal opening portion may be formed in a plurality of first side regions of the first insulating region 711. For example, the first insulating region 711 may include a plurality of first side regions. For example, the first insulating region 711 may include a first-first side region R1-1. For example, the first insulating region 711 may include a first-second side region R1-2 opposite to the first-first side region R1-1. For example, the first insulating region 711 may include a first-third side region R1-3 between the first-first side region R1-1 and the first-second side region R1-2. For example, the first insulating region 711 may include a first-fourth side region R1-4 opposite to the first-third side region R1-3.

The first terminal opening portion may include a first-first terminal opening portion 711-1 formed in the first-first side region R1-1 of the first insulating region 711. For example, the first terminal opening portion may include a first-second terminal opening portion 711-2 formed in the first-second side region R1-2 of the first insulating region 711. For example, the first terminal opening portion may include a first-third terminal opening portion 711-3 formed in the first-third side region R1-3 of the first insulating region 711. For example, the first terminal opening portion may include a first-fourth terminal opening portion 711-4 formed in the first-fourth side region R1-4 of the first insulating region 711.

The first-first terminal opening portion 711-1 may expose a part of the first terminal portion 721-1. For example, the first-first terminal opening portion 711-1 may expose a part of the first-first terminal 721-1a of the first terminal portion 721-1. That is, the first-first terminal 721-1a of the first terminal portion 721-1 includes a first region disposed on the first insulating region 711 and a second region disposed on the first-first terminal opening portion 711-1. The first-first terminal opening portion 711-1 may overlap the first pad 241-1 of the sensor substrate 241 in the optical axis direction. The first-first terminal opening portion 711-1 may improve soldering workability between a first-first terminal 721-1a of the first terminal portion 721-1 and a first pad 241-1 of the sensor substrate 241. For example, the alignment state between the first-first terminal 721-1a of the first terminal portion 721-1 and the first pad 241-1 of the sensor substrate in the embodiment can be checked from both the upper side and the lower side of the substrate 700. In addition, the embodiment enables a connection test between the substrate 700 and the sensor substrate 241 in a state in which the camera module is manufactured. For example, the lower surface of the first-first terminal 721-1a exposed through the first-first terminal opening portion 711-1 may also function as a test pad for testing mutual electrical connectivity.

The first-first terminal opening portion 711-1 may have a closed loop shape. For example, the first-first terminal opening portion 711-1 may not be connected to the separation region 713. For example, the separation region 713 and the first-first terminal opening portion 711-1 may be spaced apart from each other. For example, the first-first terminal opening portion 711-1 and the separation region 713 may be partitioned by the first insulating region 711. Accordingly, a part of the first insulating region 711 may be positioned between the first-first terminal opening portion 711-1 and the separation region 713. The part of the first insulating region 711 may be a region in which a part of the first-first terminal 721-1a of the first terminal portion 721-1 is disposed. For example, a part of the first insulating region 711 may be a support region supporting a part of the first-first terminal 721-1a of the first terminal portion 721-1. However, the reliability of the substrate in the embodiment 700 may be further improved because the first-first terminal opening portion 711-1 has a closed loop shape.

That is, when the first-first terminal opening portion 711-1 has an open loop shape, the reliability of the substrate 700 may decrease. For example, when the first-first terminal opening portion 711-1 has an open loop shape, an electrical short problem may occur in a state in which the first moving portion 200 is moved with respect to the fixed portion 100 by the lens driving device. For example, when the first moving portion 200 moves, the connection portion 721-3 is elastically bent. At this time, when the first-first terminal opening portion 711-1 has an open loop shape, the connection portion 721-3 may be in contact with the first-first terminal 721-1a disposed in the first-first terminal opening portion 711-1. Accordingly, an electrical short problem may occur. Accordingly, the first-first terminal opening portion 711-1 in the embodiment has a closed loop shape. Accordingly, even when the connection portion 721-3 of the pattern portion 720 is bent, the contact between the first-first terminal 721-1a and the connection portion 721-3 may be blocked. Accordingly, the embodiment may improve electrical reliability and operational reliability. Furthermore, when the first-first terminal opening portion 711-1 is coupled to the sensor substrate 241, it is also possible to arrange the sensor substrate 241 upside down. For example, the pad of the sensor substrate 241 in the first embodiment may be disposed on the first pattern portion 721 and the second pattern portion 722. Alternatively, the first pattern portion 721 and the pad of the sensor substrate 241 in the second embodiment may be disposed to face each other with the insulating portion 710 interposed therebetween. For example, the first pattern portion and the pad of the sensor substrate 241 in the second embodiment may be disposed to face each other directly with the first-first terminal opening portion 711-1 interposed therebetween. Accordingly, a soldering process in the second embodiment may be performed by applying an adhesive to the first-first terminal opening portion 711-1.

The first-second terminal opening portion 711-2 may form in the first-second side region R1-2 of the first insulating region 711 and expose a part of the pattern portion 720. For example, the first-second terminal opening portion 711-2 may expose a part of the first-second terminal 721-1b of the first terminal portion 721-1. That is, a part of the first-second terminal 721-1b of the first terminal portion 721-1 is disposed on the first insulating region 711, and a remaining part of the first-second terminal 721-1*b* of the first terminal portion 721-1 may be exposed through the first-second terminal opening portion 711-2. The first-second terminal opening portion 711-2 may improve soldering workability between a first-second terminal 721-1*b* of the first terminal portion 721-1 and a second pad 241-2 of the sensor substrate 241. In addition, the first-second terminal opening portion 711-2 may be formed for testing between the first-second terminal 721-1*b* of the first terminal portion 721-1 and the second pad 241-2 of the sensor substrate 241.

The first-second terminal opening portion 711-2 may have the same closed loop shape as the first-first terminal opening portion 711-1.

Meanwhile, the first-second terminal opening portion 711-2 may be disposed to face the first-first terminal opening portion 711-1. For example, the first-second terminal opening portion 711-2 may be disposed to face the first-first terminal opening portion 711-1 in the x-axis direction. However, the first-first terminal opening portion 711-1 and the first-second terminal opening portion 711-2 may be disposed to be shifted from each other with respect to the x-axis. For example, a center of the first-first terminal opening portion 711-1 may be positioned to be shifted from a center of the first-second terminal opening portion 711-2 with respect to the x-axis.

For example, the first-first terminal opening portion 711-1 may be disposed to be biased in the −y-axis direction in the first-first side region R1-1 of the first insulating region 711. For example, the first-second terminal opening portion 711-2 may be disposed to be biased in the +y-axis direction in the first-second side region R1-2 of the first insulating region 711.

Also, the first-third terminal opening portion 711-3 is formed in the first-third side region R1-3 of the first insulating region 711. The first-third terminal opening portion 711-3 may expose a part of the first-third terminal 721-1*c* of the first terminal portion 721-1. That is, a part of the first-third terminal 721-1*c* of the first terminal portion 721-1 is disposed on the first insulating region 711 and a remaining part of the first-third terminal 721-1*c* of the first terminal portion 721-1 may be exposed through the first-third terminal opening portion 711-3. The first-third terminal opening portion 711-3 may improve soldering workability between a first-third terminal 721-1*c* of the first terminal portion 721-1 and a third pad 241-3 of the sensor substrate 241. In addition, the first-third terminal opening portion 711-3 may be formed for testing between the first-third terminal 721-1*c* of the first terminal portion 721-1 and the third pad 241-3 of the sensor substrate 241.

The first-third terminal opening portion 711-3 has the same closed loop shape as the first-first terminal opening portion 711-1 and the first-second terminal opening portion 711-2.

The first-fourth terminal opening portion 711-4 is formed in the first-fourth side region R1-4 of the first insulating region 711. The first-fourth terminal opening portion 711-4 may expose a part of the first-fourth terminal 721-1*d* of the first terminal portion 721-1 of the pattern portion 720. That is, a part of the first-fourth terminal 721-1*d* of the first terminal portion 721-1 is disposed on the first insulating region 711, and a remaining part of the first-fourth terminal 721-1*d* of the first terminal portion 721-1 may be exposed through the first-fourth terminal opening portion 711-4. The first-fourth terminal opening portion 711-4 may improve soldering workability between a first-fourth terminal 721-1*d* of the first terminal portion 721-1 and a fourth pad 241-4 of the sensor substrate 241. In addition, the first-fourth terminal opening portion 711-4 may be formed for testing between the first-fourth terminal 721-1*d* of the first terminal portion 721-1 and the fourth pad 241-4 of the sensor substrate 241.

Meanwhile, the first-fourth terminal opening portion 711-4 may be disposed to face the first-third terminal opening portion 711-3. The first-fourth terminal opening portion 711-4 may be disposed to face the first-third terminal opening portion 711-3 in the y-axis direction. However, the first-third terminal opening portion 711-3 and the first-fourth terminal opening portion 711-4 may be disposed to be shifted from each other based on the y-axis. For example, a center of the first-third terminal opening portion 711-3 may be shifted from the center of the first-fourth terminal opening portion 711-4 with respect to the y-axis. For example, the first-third terminal opening portion 711-3 may be disposed to be biased in the +x-axis direction in the first-third side region R1-3 of the first insulating region 711. For example, the first-fourth terminal opening portion 711-4 may be disposed to be biased in −x-axis direction different from the first-third terminal opening portion 711-3 in the first-fourth side region R1-4 of the first insulating region 711.

Meanwhile, the first insulating region 711 may include a fixing pad opening portion. The fixing pad opening portion may be disposed adjacent to the first terminal opening portion. For example, the first insulating region 711 may include a first fixing pad opening portion 711-5. The first fixing pad opening portion 711-5 may be disposed adjacent to the first-first terminal opening portion 711-1. Also, the first fixing pad opening portion 711-5 may be spaced apart from the first-first terminal opening portion 711-1. The first fixing pad opening portion 711-5 may correspond to the fixing pad of the sensor substrate 241. For example, the first fixing pad opening portion 711-5 may correspond to the first-second pad 241-1*b* of the sensor substrate 241. For example, the first fixing pad opening portion 711-5 may overlap the first-second pad 241-1*b* in the optical axis direction. The first fixing pad opening portion 711-5 may be an insertion portion into which the first-second pad 241-1*b* of the sensor substrate 241 is inserted when the substrate 700 and the sensor substrate 241 are coupled.

In the embodiment, the first-second pad 241-1*b* of the sensor substrate 271 is inserted into the first fixing pad opening portion 711-5. Accordingly, when the sensor substrate 241 and the substrate 700 are coupled, position alignment is facilitated. In addition, the sensor substrate 241 can be fixed on the substrate 700. For example, the movement of the first-second pad 241-1*b* of the sensor substrate 241 may be restricted while being disposed in the first fixing pad opening portion 711-5. Accordingly, the embodiment can prevent a position shift between the sensor substrate 241 and the substrate 700.

The first fixing pad opening portion 711-5 may have an open loop shape. For example, the first fixing pad opening portion 711-5 may be connected to the separation region 713. Accordingly, the embodiment facilitates insertion of the first-second pad 241-1*b* when the sensor substrate 241 and the substrate 700 are coupled. Through this, the embodiment can improve workability.

On the other hand, the first fixing pad opening portion 711-5 in the embodiment is spaced apart from the first-first terminal opening portion 411-1 and is disposed adjacent to the first-first terminal opening portion 411-1. Accordingly, the embodiment may improve the strength of the first insulating region 711. For example, the first insulating region 711 includes the first-first terminal opening portion 411-1 as described above. Accordingly, the strength of the first insulating region 711 may be decreased in the region in which the first-first terminal opening portion 411-1 is formed. In this case, the first fixing pad opening portion 711-5 in the embodiment is formed adjacent to the first-first terminal opening portion 411-1. Through this, the first-second pad 241-1b in the embodiment is disposed in the first fixing pad opening portion 711-5. Accordingly, the strength of the first-first side region R1-1 of the first insulating region in the embodiment may be improved by using the first-second pad 241-1b, Through this, the embodiment may improve the operational reliability of the lens driving device.

Also, the first insulating region 711 may include a second fixing pad opening portion 711-6. The second fixing pad opening portion 711-6 may be disposed adjacent to the first-second terminal opening portion 711-2. In addition, the second fixing pad opening portion 711-6 may be spaced apart from the first-second terminal opening portion 711-2. The second fixing pad opening portion 711-6 may correspond to the second-second pad 241-2b of the sensor substrate 241. For example, the second fixing pad opening portion 711-6 may overlap the second-second pad 241-2b in the optical axis direction. The second fixing pad opening portion 711-6 may be an insertion portion into which the second-second pad 241-2b is inserted.

The second fixing pad opening portion 711-6 may have the same open-loop shape as the first fixing pad opening portion 711-5. The second fixing pad opening portion 711-5 is disposed adjacent to the first-second terminal opening portion 711-2. Through this, the strength of the first insulating region 711 with respect to the first-second side region R1-2 in the embodiment may be improved.

On the other hand, the embodiment includes a third fixing pad opening portion 711-7. The third fixing pad opening portion 711-7 may be disposed adjacent to the first-third terminal opening portion 711-3 of the first insulating region 711. In this case, the fixing pad of the sensor substrate 241 may not be disposed in the third fixing pad opening portion 711-7. However, the third fixing pad opening portion 711-7 may be formed to improve workability of bonding the substrate 700 and the sensor substrate 241. For example, when the substrate 700 and the sensor substrate 241 are coupled in a state in which the third fixing pad opening portion 711-7 is not formed, the first-second pad 241-1b of the sensor substrate 241 should be disposed only in the first fixing pad opening portion 711-5. Alternatively, as described above, the fixing pad opening portion in the embodiment is formed in adjacent regions of the first terminal opening portion, respectively. Accordingly, the first and second pads 241-2b of the sensor substrate 241 in the embodiment can be coupled to the sensor substrate 241 and the substrate 700 at any of the four fixing pad opening portions. Accordingly, the embodiment may improve the workability of bonding the sensor substrate 241 and the substrate 700. However, the embodiment is not limited thereto, and the third fixing pad opening portion 711-7 may be selectively omitted. Alternatively, the fixing pad of the third pad 241-3 of the sensor substrate 241 may be disposed in the third fixing pad opening portion 711-7.

Also, the first insulating region 711 of the embodiment includes the fourth fixing pad opening portion 711-8. The fourth fixing pad opening portion 711-8 may be disposed adjacent to the first-fourth terminal opening portion 711-4 of the first insulating region 711. A fixing pad may be disposed in the first-fourth terminal opening portion 711-4 to correspond to the third fixing pad opening portion 711-7, or, differently, the fixing pad may not be disposed.

Meanwhile, the insulating portion 710 in the embodiment includes a second insulating region 712 spaced apart from the first insulating region 711 with the separation region 713 interposed therebetween.

The second insulating region 712 may include a plurality of second side regions. For example, the second insulating region 712 may include a second side region facing the first side region of the first insulating region 711 with the separation region 713 interposed therebetween. For example, the second insulating region 712 may include a second-first side region R2-1 facing the first-first side region R1-1 of the first insulating region 711, For example, the second insulating region 712 may include a second-second side region R2-2 facing the first-second side region R1-2 of the first insulating region 711. For example, the second insulating region 712 may include a second-third side region R2-3 facing the first-third side region R1-3 of the first insulating region 711. For example, the second insulating region 712 may include a second-fourth side region R2-4 facing the first-fourth side region R1-4 of the first insulating region 711.

Also, the second insulating region 712 may include a second terminal opening portion formed in the second side region.

For example, the second insulating region 712 may include a second-first terminal opening portion 712-1 formed in the second-first side region R2-1. The second-first terminal opening portion 712-1 may expose a part of the pattern portion 720 disposed on the insulating portion 710. For example, the second-first terminal opening portion 712-1 may expose a part of the second terminal portion 721-2 constituting the pattern portion 720. For example, the second-first terminal opening portion 712-1 may expose a part of the second-first terminal 721-2a of the second terminal portion 721-2. That is, a part of the second-first terminal 721-2a of the second terminal portion 721-2 is disposed on the second insulating region 712, and a remaining part of the second-first terminal 721-2a of the second terminal portion 721-2 may be exposed through the second-first terminal opening portion 712-1, For example, the second-first terminal 721-2a of the second terminal portion 721-2 may include a part overlapping the second-first terminal opening portion 712-1 in the optical axis direction. The second-first terminal opening portion 712-1 may be formed to improve soldering workability and perform an electrical connection test.

The second-first terminal opening portion 712-1 may be disposed to be biased in one direction in the second-first side region R2-1 of the second insulating region 712. For example, the second-first terminal opening portion 712-1 in the embodiment may be disposed to be biased in the +y-axis direction in the second-first side region R2-1 of the second insulating region 712. Accordingly, in the embodiment, it is possible to secure an arrangement space for the connection portion 721-3 of the pattern portion 720 in the separation region 713. That is, the pattern portion 720 of the embodiment connects between the first terminal portion and the second terminal portion disposed in the first insulating region 711 and the second insulating region 712 that do not face each other. At this time, when the second-first terminal opening portion 712-1 is disposed in a center of the second-first side region R2-1 of the second insulating region 712, a density of the connection portion 721-3 may be increased in the separation region between the first-first region R1-1 and the second-first side region R2-1. Also, when the density of the connection portion 721-3 increases, a problem in which different connection portion 721-3 is in contact with or connected to each other may occur during operation of the lens driving device. In addition, driving reliability may be reduced. Accordingly, as described above, the second-first terminal opening portion 712-1 in the embodiment is disposed to be biased in one direction in the second-first side region R2-1 of the second insulating region 712. Through this, the embodiment reduces the density of the connection portion 721-3 to improve the driving reliability of the lens driving device.

The second-first terminal opening portion 712-1 is disposed to face the first-first terminal opening portion 711-1. In this case, a center of the second-first terminal opening portion 712-1 may be positioned to be shifted from the center of the first-first terminal opening portion 711-1 in the x-axis. In addition, the second-first terminal opening portion 712-1 may have a closed loop shape. According to the embodiment, the short circuit problem occurring during the operation of the lens driving device by the second terminal opening portion can be solved. Accordingly, the embodiment may improve operational reliability.

In addition, a second terminal opening portion having a structure corresponding to the second-first terminal opening portion 712-1 is formed in the other second side region of the second insulating region 712.

For example, a second-second terminal opening portion 712-2 may be formed in the second-second side region R2-2 of the second insulating region 712. For example, a second-third terminal opening portion 712-3 may be formed in the second-third side region R2-3 of the second insulating region 712. For example, a second-fourth terminal opening portion 712-4 may be formed in the second-fourth side region R2-4 of the second insulating region 712.

Meanwhile, the second insulating region 712 may include a first coupling hole 712-5 formed in a corner region. The first coupling hole 712-5 may be for coupling the second insulating region 712 with other components of the lens driving device.

On the other hand, the substrate 700 of the embodiment includes a pattern portion 720 disposed on the insulating portion 710. The pattern portion 720 may be divided into a first pattern portion 721 and a second pattern portion 722 according to functions. The first pattern portion 721 may mean a signal transmission pattern for electrically connecting the sensor substrate 241 and the main substrate 110. For example, the first pattern portion 721 may be a signal pattern portion. The second pattern portion 722 may be a reinforcing pattern portion for improving the rigidity of the substrate 700. For example, the second pattern portion 722 may be a dummy pattern portion that does not transmit an electrical signal. For example, the second pattern portion 722 may not be electrically connected to the first pattern portion 721. Accordingly, the second pattern portion 722 may not be electrically connected to the sensor substrate and the main substrate 110. However, the embodiment is not limited thereto. For example, the second pattern portion 722 may be connected to a ground layer (not shown) included in the sensor substrate 241. For example, the second pattern portion may be connected to a ground layer (not shown) included in the main substrate 110. Accordingly, the second pattern portion 722 may discharge heat generated from the substrate 700 while performing a ground function.

The pattern portion 720 may include a conductive metal material. For example, the first pattern portion 721 and the second pattern portion 722 may be formed of the same conductive metal material. However, the embodiment is not limited thereto, and the first pattern portion 721 and the second pattern portion 722 may include different metal materials.

The second pattern portion 722 may include a second-first pattern portion 722-1 and a second-second pattern portion 722-2. The second-first pattern portion 722-1 may be disposed on the first insulating region 711. The second-first pattern portion 722-1 may be disposed in a central region of the upper surface of the first insulating region 711.

The second-first pattern portion 722-1 may include a second open region OR exposing a part of the surface of the first insulating region 711. The second-first pattern portion 722-1 may improve rigidity of the first insulating region 711. In addition, the second-second pattern portion 722-2 may be disposed on the second insulating region 712 of the insulating portion 710. The second-second pattern portion 722-2 may be spaced apart from the second-first pattern portion 722-1. The second-second pattern portion 722-2 may improve rigidity of the second insulating region 712. The second-second pattern portion 722-2 may include a coupling hole (not shown) aligned with the coupling hole 712-5 formed in the second insulating region 712 of the insulating portion 710. Meanwhile, the second-first pattern portion 722-1 may be formed to expose a first terminal opening portion on the first insulating region 711. In addition, the second-second pattern portion 722-2 may be formed on the second insulating region 712 to expose the second terminal opening portion.

The second-first pattern portion 722-1 and the second-second pattern portion 722-2 may have a predetermined width. In this case, the second-first pattern portion 722-1 may be disposed on the first insulating region 711 to have a width smaller than that of the first insulating region 711. For example, an upper surface of the first insulating region 711 may have a first portion 711a covered by the second-first pattern portion 722-1 and a second portion 711b except for the first portion 711a. The second portion 711b of the upper surface of the first insulating region 711 may be an edge region of the upper surface of the first insulating region 711. For example, the second-first pattern portion 722-1 may be disposed to open an edge region of an upper surface of the first insulating region 711.

The second-second pattern portion 722-2 may be disposed on the second insulating region 712 to have a width smaller than that of the second insulating region 712. For example, an upper surface of the second insulating region 712 may includes a third portion 712a covered by the second-second pattern portion 722-2 and a fourth portion 712b excluding the third portion 712a. In addition, the fourth portion 712b of the upper surface of the second insulating region 712 may be an edge region of the upper surface of the second insulating region 712. For example, the second-second pattern portion 722-2 may be disposed to open an edge region of the upper surface of the second insulating region 712.

The second-first pattern portion 722-1 and the second-second pattern portion 722-2 may be separated from each other. The second-first pattern portion 722-1 and the second-second pattern portion 722-2 may not be connected to each other by a metal other than the first pattern portion which is a signal line. Accordingly, the embodiment may improve the mobility of the sensor driving device. Specifically, when a space between the first insulating region 711 and the second insulating region 712 is connected with a metal other than the first pattern portion 721, movement of the sensor substrate disposed on the first insulating region 711 may be disturbed. Accordingly, the mobility of the sensor driving device may be reduced. Accordingly, according to the exemplary embodiment, a space between the first insulating region 711 and the second insulating region 712 is not connected with a metal other than the first pattern portion 721. Accordingly, the precision of movement of the first moving portion disposed on the first insulating region 711 in the embodiment may be improved.

The first pattern portion 721 may be disposed on the insulating portion 710. For example, the first pattern portion 721 may be disposed on the first insulating region 711, the second insulating region 712, and the separation region 713 of the insulating portion 710. The first pattern portion 721 may be electrically insulated from the second pattern portion 722.

The first pattern portion 721 may include a first terminal portion 721-1, a second terminal portion 721-2, and a connection portion 721-3.

The first pattern portion 721 may allow the first moving portion 200 to move relative to the fixed portion 100 while electrically connecting the main substrate and the sensor substrate 241. To this end, the first pattern portion 721 may have elasticity. The first pattern portion 721 may be formed of an alloy including copper (Cu), For example, the first pattern portion 721 may be a binary alloy including at least one of nickel (Ni), tin (Sn), beryllium (Be), and cobalt (Co) in copper (Cu), or may be a ternary alloy including at least two.

However, the embodiment is not limited thereto, and the first pattern portion 721 may be made of an alloy such as on (Fe), nickel (Ni), zinc, etc. having good electrical properties while having an elastic force that can serve as a spring. In addition, the first pattern portion 721 may be surface-treated with a metal material or an organic material. Preferably, the first pattern portion 721 may be coated with an organic material.

Specifically, the first pattern portion 721 may have a characteristic value of a certain level or higher that does not break even when the first moving portion 200 moves.

For example, the first pattern portion 721 may have a tensile strength and a 0.2% offset yield strength above a certain level. For example, the first pattern portion may have a tensile strength of 500 N/mm2 or more. For example, the first pattern portion 721 may have a tensile strength of 800 N/mm2 or more. For example, the first pattern portion 721 may have a tensile strength of 1000 N/mm2 or more. For example, the first pattern portion 721 may have a tensile strength of 1400 N/mm2 or more. For example, the first pattern portion 721 may have a 0.2% offset yield strength of 500 N/mm2 or more. For example, the first pattern portion 721 may have a 0.2% offset yield strength of 800 N/mm2 or more. For example, the first pattern portion 721 may have a 0.2% offset yield strength of 1000 N/mm2 or more. For example, the first pattern portion 721 may have a 0.2% offset yield strength of 1400 N/mm2 or more.

Meanwhile, the first pattern portion 721 includes a surface in contact with the first insulating region 711 and the second insulating region 712. For example, a part of the first terminal portion 721-1 and a part of the second terminal portion 721-2 of the first pattern portion 721 are in contact with the first insulating region 711 and the second insulating region 712. In this case, the reliability of the substrate 700 may be determined according to the roughness of a contacting surface.

At this time, when the contacting surface has a centerline average surface roughness (Ra) in the range of 0.025 μm to 0.035 μm or/and a 10-point average surface roughness in the range of 0.3 μm to 0.5 μm, there may be a problem in that the first pattern portion 721 is detached from the insulating portion 710.

Accordingly, the surface of the first pattern portion 721 in the embodiment may have a surface roughness of a certain level or more. For example, the roughness of the surface of the first pattern portion 721 may affect adhesion to the insulating portion 710.

For example, the surface of the first pattern portion 721 in an embodiment may have a centerline average surface roughness Ra in a range of 0.05 μm to 0.5 μm. For example, the surface of the first pattern portion 721 in the embodiment may have a centerline average surface roughness Ra in the range of 0.05 μm to 0.2 μm. For example, the surface of the first pattern portion 721 in the embodiment may have a centerline average surface roughness Ra in the range of 0.08 μm to 0.15 μm. For example, the surface of the first pattern portion 721 in the embodiment may have a 10-point average surface roughness Rz in the range of 0.6 to 5 μm. For example, the surface of the first pattern portion 721 in the embodiment may have a 10-point average surface roughness Rz in the range of 0.7 to 3.0 μm. For example, the surface of the first pattern portion 721 in the embodiment may have a 10-point average surface roughness Rz in the range of 1.0 to 2.5 μm.

The first pattern portion 721 may include a first terminal portion 721-1, a second terminal portion 721-2, and a connection portion 721-3. In this case, the first terminal portion 721-1, the second terminal portion 721-2, and the connection portion 721-3 are only separated for description of the configuration, and they may be integrally, formed with each other.

The first terminal portion 721-1 may be formed on a first side region of the first insulating region 711. Also, at least a part of the first terminal portion 721-1 may be exposed through the first terminal opening portion of the first insulating region 711.

The first terminal portion 721-1 may include a plurality of first terminals disposed on different side regions of the first insulating region 711. In addition, the plurality of first terminals may be disposed adjacent to different corner portions among the four corner portions of the separation region 713. Accordingly, when the moving portion is moved, tilting may be performed at a corner portion (edge portion) rather than tilting in a side region of the substrate 700. Accordingly, the embodiment can improve the mobility of the moving portion. Furthermore, the tilting in the embodiment is performed at the corner portion where a plurality of the connection portions 723 are disposed, thereby increasing the precision of the overall module tilting. In addition, the connection portions 723 are arranged in a dense manner at the corner portions of the separation region 713 while having a bending portion. According to the embodiment, the second terminal portion 721-2 is disposed adjacent to different corner portions, respectively, so that the mobility of the moving portion can be improved.

For example, the first terminal portion 721-1 may include a plurality of first-first terminals 721-1a disposed on the first-first side region R1-1 of the first insulating region 711. The plurality of first-first terminals 721-1a may correspond to the first pad 241-1 of the sensor substrate 241. A part of the first-first terminal 721-1a may be disposed on the first-first side region R1-1 of the first insulating region 711. In addition, a remaining part of the first-first terminal 721-1a may be exposed through the first-first terminal opening portion 711-1 of the first insulating region 711. In addition, the first-first terminal 721-1*a* may be disposed adjacent to the first corner portion CN1 of the separation region 713.

For example, the first terminal portion 721-1 may include a plurality of first-second terminals 721-1*b* disposed on the first-second side region R1-2 of the first insulating region 711. The plurality of first-second terminals 721-1*b* may correspond to the second pad 241-2 of the sensor substrate 241. A part of the first-second terminal 721-1*b* may be disposed on the first-second side region R1-2 of the first insulating region 711. In addition, a remaining part of the first-second terminal 721-1*b* may be exposed through the first-second terminal opening portion 711-2 of the first insulating region 711. In addition, the plurality of first-second terminals 721-1*b* may be disposed adjacent to the second corner portion CN2 of the separation region 713.

For example, the first terminal portion 721-1 may include a plurality of first-third terminals 721-1*c* disposed on the first-third side region R1-3 of the first insulating region 711. The plurality of first-third terminals 721-1*c* may correspond to the third pad 241-3 of the sensor substrate 241. A part of the first-third terminal 721-1*c* may be disposed on the first-third side region R1-3 of the first insulating region 711. In addition, a remaining part of the first-third terminals 721-1*c* may be exposed through the first-third opening portion 711-3 of the first insulating region 711. In addition, the first-third terminals 721-1*c* may be disposed adjacent to the third corner portion CN3 of the separation region 713.

For example, the first terminal portion 721-1 may include a plurality of first-fourth terminals 721-1*d* disposed on the first-fourth side regions R1-4 of the first insulating region 711. The plurality of first-fourth terminals 721-1*d* may correspond to the fourth pad 241-4 of the sensor substrate 241. A part of the first-fourth terminals 721-1*d* may be disposed on the first-fourth side region R1-4 of the first insulating region 711. In addition, a remaining part of the first-fourth terminals 721-1*d* may be exposed through the first-fourth terminal opening portion 711-4 of the first insulating region 711. In addition, the first-fourth terminals 721-1*d* may be disposed adjacent to the fourth corner portion CN4 of the separation region 713.

The first terminal portion 721-1 may be electrically connected to the pad of the sensor substrate 241.

The first pattern portion 721 may include a second terminal portion 721-2 connected to the main substrate 110. The second terminal portion 721-2 may include a plurality of second terminals disposed on different side regions of the second insulating region 712. In addition, the plurality of second terminals may be disposed adjacent to different corner portions in the four corner portions of the separation region 713, respectively.

The second terminal portion 721-2 may include a plurality of second-first terminals 721-2*a* formed on the second-first side region R2-1 of the second insulating region 712. The plurality of second-first terminals 721-2*a* may correspond to the pad 116 of the main substrate 110. A part of the second-first terminal 721-2*a* may be disposed on the second-first side region R2-1 of the second insulating region 712. In addition, a remaining part of the second-first terminal 721-2*a* may be exposed through the second-first terminal opening portion 712-1 of the second insulating region 712. In addition, the second-first to terminal 721-2*a* may be disposed adjacent to the third corner portion CN3 of the separation region 713.

For example, the second terminal portion 721-2 may include a plurality of second-second terminals 721-2*b* formed on the second-second side region R2-2 of the second insulating region 712. The plurality of second-second terminals 721-2*b* may correspond to the pad 116 of the main substrate 110. A part of the second-second terminal 721-2*b* may be disposed on the second-second side region R2-2 of the second insulating region 712, and a remaining part of the second-second terminal 721-2*b* may be exposed through the second-second terminal opening portion 712-2 of the second insulating region 712. In addition, the second-second terminal 721-2*b* may be disposed adjacent to the fourth corner portion CN4 of the separation region 713.

For example, the second terminal portion 721-2 may include a plurality of second-third terminals 721-2*c* formed on the second-third side region R2-3 of the second insulating region 712. The plurality of second-third terminals 721-2*c* may correspond to the pad 116 of the main substrate 110. A part of the second-third terminal 721-2*c* may be disposed on the second-third side region R2-3 of the second insulating region 712, and a remaining part of the second-third terminal 721-2*c* may be exposed through the second-third terminal opening portion 712-3 of the second insulating region 712. In addition, the second-third terminal 721-2*c* may be disposed adjacent to the second corner portion CN2 of the separation region 713.

For example, the second terminal portion 721-2 includes a plurality of second-fourth terminals 721-2*d* formed on the second-fourth side region R2-4 of the second insulating region 712. The plurality of second-fourth terminals 721-2*d* may correspond to the pads 116 of the main substrate 110. A part of the second-fourth terminal 721-2*d* may be disposed on the second-fourth side region R2-4 of the second insulating region 712, and a remaining part of second-fourth terminal 721-2*d* may be exposed through the second-third terminal opening portion 712-4 of the second insulating region 712. In addition, the second-fourth terminal 721-2*d* may be disposed adjacent to the first corner portion CN1 of the separation region 713.

Meanwhile, the connection portion 721-3 may connect between the first terminal portion 721-1 and the second terminal portion 721-2.

The connection portion 721-3 does not connect the first terminal portion and the second terminal portion disposed on the side region facing each other. Preferably, the connection portion 721-3 connects between the first terminal portion and the second terminal portion which are disposed on side regions that do not face each other.

The connection portion 721-3 may not overlap the insulating portion 710 in the optical axis direction. For example, the connection portion 721-3 may be disposed in flying over the separation region 713 of the insulating portion 710.

Accordingly, the embodiment may improve the mobility of the first moving portion 200 by the connection portion 721-3. That is, the embodiment improves the elastic force of the connection portion 721-3 to improve the mobility of the first moving portion 200.

For example, the connection portion 721-3 may include a first connection portion 721-3*a*.

The first connection portion 721-3*a* may be connected between the first-first terminal 721-1*a* of the first terminal portion 721-1 and the second-fourth terminal 721-2*d* of the second terminal portion 721-2. Accordingly, the first connection portion 721-3*a* may include at least one bending portion BP1. In addition, the first connection portion 721-3*a* connects between the first terminal portion 721-1 and the second terminal portion 721-2 disposed on each of different side regions as described above. Accordingly, at least a part of the first connection portion 721-3*a* may be disposed on a corner portion of the separation region 713. For example, the separation region 713 may include four corner portions CN1, CN2, CN3, and CN4. In addition, the first connection portion 721-3a may include a first bending portion BP1 formed in the first corner portion CN1 among the four corner portions of the separation region 713. The first connection portion 721-3a may include one end connected to the first-first terminal 721-1a and the other end extending in a counterclockwise direction from the one end and connected to the second-fourth terminal 721-2d. In addition, the first bending portion BP1 of the first connection portion 721-3a may be bent by rotating counterclockwise starting from the one end.

In addition, the connection portion 721-3 may include a second connection portion 721-3b.

The second connection portion 721-3b may be connected between the first-second terminal 721-1b of the first terminal portion 721-1 and the second-third terminal 721-2c of the second terminal portion 721-2. Accordingly, the second connection portion 721-3b may include at least one bending portion BP2. In addition, the second connection portion 721-3b connects between the first terminal portion 721-1 and the second terminal portion 721-2 disposed on each of different side regions as described above. Accordingly, the second connection portion 721-3b may include the second bending portion BP2 formed in the second corner portion CN2. The second connection portion 721-3b may include one end connected to the first-second terminal 721-1b and the other end extending in a counterclockwise direction from the one end and connected to the second-third terminal 721-2c. In addition, the second bending portion BP2 of the second connection portion 721-3b may be bent by rotating counterclockwise starting from the one end. The second bending portion BP2 of the second connection portion 721-3b may be bent and extended in the same direction as the first connection portion 721-3a.

In addition, the connection portion 721-3 may include a third connection portion 721-3c.

The third connection portion 721-3c may be connected between the first-third terminal 721-1c of the first terminal portion 721-1 and the second-first terminal 721-2a of the second terminal portion 721-2. Accordingly, the third connection portion 721-3c may include at least one bending portion BP3. In addition, the third connection portion 721-3c connects between the first terminal portion 721-1 and the second terminal portion 721-2 disposed on each of different side regions as described above. Accordingly, the third connection portion 721-3c may include the third bending portion BP3 formed in the third corner portion CN3. The third connection portion 721-3c may include one end connected to the first-third terminal 721-1c and the other end extending in a counterclockwise direction from the one end and connected to the second-first terminal 721-2a. In addition, the third bending portion BP3 of the third connection portion 721-3c may be bent by rotating counterclockwise starting from the one end. That is, the third bending portion BP3 of the third connection portion 721-3c may be bent and extended in the same direction as the first connection portion 721-3a and the second connection portion 721-3b.

The connection portion 721-3 may include a fourth connection portion 721-3d.

The fourth connection portion 721-3d may be connected between the first-fourth terminal 721-1d of the first terminal portion 721-1 and the second-second terminal 721-2b of the second terminal portion 721-2. Accordingly, the fourth connection portion 721-3d may include at least one bending portion BP4. In addition, the fourth connection portion 721-3d connects between the first terminal portion 721-1 and the second terminal portion 721-2 disposed on each of different side regions as described above. Accordingly, the fourth connection portion 721-3d may include the fourth bending portion BP4 formed in the fourth corner portion CN4. In addition, the fourth connection portion 721-3d may include one end connected to the first-fourth terminal 721-1d and the other end extending in a counterclockwise direction from the one end and connected to the second-second terminal 721-2b. In addition, the fourth bending portion BP4 of the fourth connection portion 721-3d may be bent by rotating counterclockwise starting from the one end. That is, the fourth bending portion BP4 of the fourth connection portion 721-3d may be bent and extended in the same direction as the first connection portion 721-3a, the second connection portion 721-3b, and the third connection portion 721-3c The connection portion 721-3 of the embodiment includes a plurality of connection portions connecting between the first terminal portion 721-1 and the second terminal portion 721-2. In addition, each of the plurality of connection portions includes a bending portion disposed in different corner portions of the separation region 713. In this case, the bending portions of the plurality of connection portions may be bent and extended in the same direction as the rotation direction. Accordingly, the embodiment may improve the reliability of the connection portion 721-3. Furthermore, the embodiment may improve the mobility of the first moving portion 200 by the lens driving device.

For example, when the bending portions of the plurality of connection portions are bent in different directions as rotation directions, different forces may be applied to the respective connection portions when the first moving portion 200 is moved. Accordingly, the mobility of the first moving portion 200 may be reduced. Furthermore, when the bending portions of the plurality of connection portions are bent in different directions as the rotational direction, force may be concentrated on a specific connection portion among the connection portions. Accordingly, a problem may occur in that the connection portion on which the force is concentrated is broken earlier than other connection portions.

Alternatively, the embodiment allows the bending portions of the plurality of connection portions to be bent in the same direction as each other as the rotational direction. Accordingly, when the first moving portion 200 moves, the force acting on each connection portion can be uniformly distributed. Accordingly, the embodiment may improve the mobility of the first moving portion 200. Furthermore, the embodiment can uniformly distribute the force acting on each connection portion to solve the problem that a specific connection portion is broken first. Furthermore, even if a problem in which the connection portions are broken occurs, all the connection portions may be disconnected at the same time. Accordingly, the embodiment may improve the tilting characteristics of the first moving portion 200.

Meanwhile, the connection portion 721-3 may not be supported by the first insulating region 711 and the second insulating region 712. For example, the connection portion 721-3 may include a part that does not overlap the first insulating region 711 and the second insulating region 712 in the optical axis direction. In addition, the bending portion of the connection portion 721-3 does not overlap the first insulating region 711 and the second insulating region 712 in the optical axis direction. For example, the connection portions 721-3 may be disposed in a flying state on the separation region 713.

Meanwhile, the number of each of the first terminal portion 721-1, the second terminal portion 721-2, and the connection portion 721-3 in the embodiment may be the same as each other. For example, the first terminal portion 721-1, the second terminal portion 721-2, and the connection portion 721-3 may be connected to each other in a 1:1 ratio.

For example, the first-first terminal 721-1a of the first terminal portion 721-1, the second-fourth terminal 721-2d of the second terminal portion 721-2, and the first connection portions 721-3a may be connected to each other 1:1. Accordingly, the number of the first-first terminal 721-1a of the first terminal portion 721-1; the number of the second-fourth terminal 721-2d of the second terminal portion 721-2, and the number of the first connection portion 721-3a may be the same.

In addition, the first-second terminal 721-1b of the first terminal portion 721-1, the second-third terminal 721-2c of the second terminal portion 721-2, and the second connection portion 721-3b may be connected to each other 1:1. Accordingly, the number of the first-second terminal 721-1b of the first terminal portion 721-1, the number of second-third terminal 721-2c of the second terminal portion 721-2, and the number of the second connection portion 721-3b may be the same.

The first-third terminal 721-1c of the first terminal portion 721-1, the second-first terminal 721-2a of the second terminal portion 721-2, and the third connection portion 721-3c may be connected to each other 1:1. The number of first-third terminal 721-1c of the first terminal portion 721-1, the number of second-first terminal 721-2a of the second terminal portion 721-2, and the number of the third connection portion 721-3c may be the same.

In addition, the first-fourth terminal 721-1d of the first terminal portion 721-1, the second-second terminal 721-2b of the second terminal portion 721-2, and the fourth connection portion 721-3d may be connected to each other 1:1. Accordingly, the number of first-fourth terminal 721-1d of the first terminal portion 721-1, the number of second-second terminal 721-2b of the second terminal portion 721-2, and the number of the fourth connection portion 721-3d may be the same.

Meanwhile, the number of first terminals of the first terminal portion 721-1 disposed in different first side regions of the first insulating region 711 may be the same. For example, the first-first terminal 721-1a, the first-second terminal 721-1b, the first-third terminal 721-1c, and the first-fourth terminal 721-1d may have the same number of each other.

Also, the number of second terminals of the second terminal portion 721-2 disposed in different second side regions of the second insulating region 712 may be the same. For example, the second-first terminal 721-2a, the second-second terminal 721-2b, the second-third terminal 721-2c, and the second-fourth terminal 721-2d may have the same number of each other.

In addition, the number of connection portions disposed in different corner portions of the separation region 713 may be the same. For example, the first connection portion 721-3a, the second connection portion 721-3b, the third connection portion 721-3c, and the fourth connection portion 721-3d may have the same number of each other.

In the embodiment, the number of the first terminal portions 721-1, the number of the second terminal portions 721-2 and the number of the connection portions 721-3 are equal to each other, and accordingly, the mobility of the first moving portion 200 may be improved. For example, when the first terminal portion, the second terminal portion, and the connection portion are intensively disposed in a specific region, or the number of the first terminal portion, the second terminal portion, and the connection portion disposed in the specific region is larger than that of another region, a difference may occur between the amount of movement in the intensively disposed region and the amount of movement in other regions except this. Accordingly, the mobility of the first moving portion 200 may be reduced. Accordingly, the first pattern portion in the embodiment are distributedly disposed on the four first side regions of the first insulating region 711 the four second side regions of the second insulating region 712, and the four corner portions of the separation region 713. Accordingly, the embodiment can improve the mobility of the first moving portion 200, and thus the operation reliability can be improved.

On the other hand, the number of each of the first terminal portion 721-1, the second terminal portion 721-2, and the connection portion 721-3 may correspond to the number of channels of signals exchanged between the main substrate 110 and the sensor substrate 241. For example, the number of communication channels between the main substrate 110 and the sensor substrate 241 may be 32.

Accordingly, the number of the first terminal portion 721-1 may be 32, For example, the number of each of the first-first terminal 721-1a, the first-second terminal 721-1b, the first-third terminal 721-1c, and the first-fourth terminal 721-1d may be 8.

In addition, the number of the second terminal portion 721-2 may be 32. Accordingly, the number of each of the second-first terminal 721-2a, the second-second terminal 721-2b, the second-third terminal 721-2c, and the second-fourth terminal 721-2d may be 8.

In addition, the number of the connection portion 721-3 may be 32. Accordingly, the number of each of the first connection portion 721-3a, the second connection portion 721-3b, the third connection portion 721-3c, and the fourth connection portion 721-3d may be 8. However, the number of communication channels is not limited to 32, and may increase or decrease than this.

A thickness of the first pattern portion 721 may be 10 μm to 60 μm. For example, the thickness of the first pattern portion 721 may be 15 μm to 50 μm. For example, the thickness of the first pattern portion 721 may be 20 μm to 45 μm.

When the thickness of the first pattern portion 721 is less than 10 μm, a problem in which the first pattern portion 721 is easily cut may occur when the first moving portion 200 is moved. In addition, when the thickness of the first pattern portion 721 is greater than 60 μm, the elastic force of the connection portion 721-3 may be reduced. Accordingly, the mobility of the first moving portion 200 may be hindered. For example, when the thickness of the first pattern portion 721 is greater than 60 μm, the driving force required to move the first moving portion 200 may increase due to the decrease in the elastic force. Accordingly, power consumption may increase. Accordingly, the first pattern portion 721 in the embodiment has a thickness of 35 μm±5 μm to enable stable movement of the first moving portion 200.

In addition, a length of the connection portion 721-3 may be 1.5 times or more of a width of the separation region 713. The length of the connection portion 721-3 may be 20 times or less the width of the separation region 713. In this case, the width of the separation region 713 may be 1.5 mm. When the length of the connection portion 721-3 is less than 1.5 times the width of the separation region 713, the mobility of the first moving portion 200 may be reduced due to a decrease in the elastic force of the connection portion 721-3. In addition, when the length of the connection portion 721-3 is greater than 20 times the width of the separation region 713, a transmission distance of a signal transmitted through the connection portion 721-3 may increase. As a result, the resistance of the connection portion 721-3 may increase, and thus the noise characteristic of the signal may be deteriorated.

Hereinafter, the connection portion 721-3 will be described in more detail.

The connection portion 721-3 includes a plurality of connection portions disposed in a plurality of corner portions of the separation region 713 as described above. In addition, the plurality of connection portions may include bending portions bent based on the same rotation direction at different corner portions of the separation region 713.

For example, the connection portion 721-3 may include the first connection portion 721-3a disposed in the first corner portion CN1 of the separation region 713 and including the first bending portion BP1.

In addition, the first bending portion BP1 of the first connection portion 721-3a may be disposed while avoiding a part of the first corner portion CN1. For example, the first bending portion BP1 of the first connection portion 721-3 may include a first open region OR that partially opens the first corner portion CN1. In addition, the first connection portion 721-3a may be disposed inside and outside the first open region OR while avoiding the first open region OR.

The first open region OR may be a region overlapping a protrusion of the second frame in the optical axis direction or the vertical direction. In this case, the first open region OR in the embodiment may be provided to provide a space in which the protrusion 214 of the second frame 210 can move. For example, the protrusion of the second frame 210 may be disposed to pass through the first open region OR1 of the connection portion 732. Accordingly, the embodiment may reduce the overall thickness of the camera module. In addition, the embodiment can prevent the connection portion from being damaged due to the protrusion of the second frame 210.

For example, the first connection portion 721-3a may include an outer connection portion 721-3a1 disposed outside the first open region OR and an inner connection portion 721-3a2 disposed inside the first open region OR.

The outer connection portion 721-3a1 may be disposed outside the first open region OR. For example, the outer connection portion 721-3a1 may be disposed farther from the first insulating region 711 than the inner connection portion 721-3a2. For example, the outer connection portions 721-3a1 may be disposed adjacent to the second insulating region 712. The inner connection portions 721-3a2 may be disposed inside the first open region OR. For example, the inner connection portion 721-3a2 may be disposed farther from the second insulating region 712 than the outer connection portion 721-3a1. For example, the inner connection portions 721-3a2 may be disposed adjacent to the first insulating region 711.

In this case, the number of the outer connection portions 721-3a1 may be different from the number of the inner connection portions 721-3a2. For example, the first connection portion 721-3a may include six lines. A part of the six lines of the first connection portion 721-3a may constitute the outer connection portion 721-3a1, and a remaining part may constitute the inner connection portion 721-3a2. In addition, the number of lines constituting the outer connection portion 721-3a1 may be different from the number of lines constituting the inner connection portion 721-3a2. Preferably, the number of lines of the outer connection portion 721-3a1 may be greater than the number of lines of the inner connection portion 721-3a2. For example, the number of lines of the outer connection portion 721-3a1 may be 1.5 times or more of the number of lines of the inner connection portion 721-3a2, For example, the number of lines of the outer connection portion 721-3a1 may be 1.7 times or more of the number of lines of the inner connection portion 721-3a2. For example, the number of lines of the outer connection portion 721-3a1 may be twice or more than the number of lines of the inner connection portion 721-3a2.

For example, when the number of lines of the first connection portion 721-3a is six, the number of lines of the outer connection portion 721-3a1 may be four, and the number of lines of the inner connection portion 721-3a2 may be two. Accordingly, the outer connection portion 721-3a1 may include first to fourth outer connection portions 721-3a11, 721-3a12, 721-3a13, and 721-3a14. Also, the inner connection portion 721-3a2 may include first and second inner connection portions 721-3a21 and 721-3a22.

In the embodiment, the number of outer connection portions 721-3a1 of the first connection portion 721-3a disposed outside the first open region OR is greater than the number of inner connection portions 721-3a2 of the first connection portion 721-3a disposed inside the first open region OR. Accordingly, the embodiment may increase the mobility of the first moving portion 200. For example, if the number of the outer connection portions 721-3a1 is greater than the number of the inner connection portions 721-3a2, it may be easier to control the amount of movement of the first moving portion than in the opposite case. For example, the outer connection portion 721-3a1 may have a length longer than the length of the inner connection portion 721-3a2 outside the first open region OR. In addition, since the length of the outer connection portion 721-3a1 is longer than the length of the inner connection portion 721-3a2, the intensity of the driving force required to move the first moving portion 200 may be reduced. Accordingly, the number of the outer connection portions 721-3a1 in the embodiment may be greater than the number of the inner connection portions 721-3a2 to improve the mobility of the first moving portion 200. Furthermore, the amount of movement of the first moving portion 200 in the embodiment can be finely adjusted.

On the other hand, each of the outer connection portion 721-3a1 and the inner connection portion 721-3a2 includes a plurality of bending points.

In this case, the number of bending points of the outer connection portion 721-3a1 may be the same as the number of bending points of the inner connection portion 721-3a2. For example, the bending number of the outer connection portion 721-3a1 may be the same as the bending number of the inner connection portion 721-3a2. For example, the outer connection portion 721-3a1 may include five bending points. For example, the outer connection portion 721-3a1 may have a first-first bending point A1, a first-second bending point A2, a first-third bending point A3, a first-fourth bending point A4 and a first-fifth bending point A5 from one end connected to the first terminal portion. And, correspondingly, the inner connection portion 721-3a2 may also include five bending points. For example, the inner connection portion 721-3a2 may have a second-first bending point B1, a second-second bending point B2, a second-third bending point B3, a second-fourth bending point B4 and a second-fifth bending point B5 from one end connected to the first terminal portion.

However, the number of bending points of each of the outer connection portions 721-3a1 and the inner connection portions 721-3a2 may be less than or equal to four, and alternatively may be six or more.

In the embodiment, the number of bending points of the outer connection portion 721-3a1 and the number of bending points of the inner connection portion 721-3a2 are equal to each other as described above, and accordingly, mobility of the first moving portion 200 may be increased. For example, when the number of bending points of the outer connection portion 721-3a1 is different from the number of bending points of the inner connection portion 721-3a2, force may be concentrated to the connection portion having more bending points. Accordingly, a problem may occur in which the connection portion on which the force is concentrated is broken before other connection portions. Furthermore, a problem may occur in the movement accuracy of the first moving portion 200.

Accordingly, the number of bending points of the outer connection portion 721-3a1 and the number of bending points of the inner connection portion 721-3a2 in the embodiment are equal to each other. Accordingly, when the first moving portion 200 moves, the force applied to the inner connection portion 721-3a2 and the outer connection portion 721-3a1 can be uniformly distributed. Accordingly, the embodiment can solve the problem that the specific connection portion is cut off first. Furthermore, even when the connection portion is cut off, the inner connection portion 721-3a2 and the outer connection portion 721-3a1 in the embodiment may be cut off at the same time.

In addition, when the first moving portion 200 moves, the force due to rotation or tilting is concentrated at each of the bending points of the inner connection portion 721-3a1 or the outer connection portion 721-3a2. In this case, the number of the inner connection portions 721-3a1 and the outer connection portions 721-3a2 in the embodiment may be the same to prevent concentration of force at a specific bending point. Further, the difference between the number of bending points of the inner connection portion 721-3a1 and the outer connection portion 721-3a2 in the embodiment may be adjusted within 40%, within 20%, or within 10%. Accordingly, the embodiment may prevent a specific connection portion from being broken as the force is concentrated on a specific bending point.

The main substrate 110 is electrically connected to the first terminal portion 721-1 of the substrate 700. The sensor substrate 241 is electrically connected to the second terminal portion 721-2 of the first pattern portion 721 of the substrate 700. In this case, the connection portion 721-3 having an elastic force may be formed between the first terminal portion 721-1 and the second terminal portion 721-2 while electrically connecting them. Accordingly, the main substrate 110 and the sensor substrate 241 may be electrically connected to each other. The first moving portion 200 constituting the sensor substrate 241 is rotatable about the x-axis or the y-axis by the elastic force of the connection portion 721-3. Meanwhile, the sensor substrate 241 may be electrically connected to the third driving member 330.

To this end, the embodiment may include a connection spring portion 800. The connection spring portion 800 may include a first connection spring portion 810. One end of the first connection spring portion 810 is connected to the sensor substrate 241. The other end of the first connection spring portion 810 is connected to one end of the second lower elastic member 620, In addition, one end of the second lower elastic member 620 may be electrically connected to one end of the third driving member 330. In addition, the connection spring portion 800 includes a second connection spring portion 820. One end of the second connection spring portion 820 is connected to the sensor substrate 241, The other end of the second connection spring portion 820 is connected to the other end of the second lower elastic member 620. In addition, the other end of the second lower elastic member 620 may be connected to the other end of the third driving member 330. Accordingly, a current of a specific intensity in the embodiment may be applied to the third driving member 330 in a specific direction, Meanwhile, the second lower elastic member 620 includes a first portion connected to the first connection spring portion 810. The second lower elastic member 620 may include a second portion electrically insulated from the first portion and connected to the second connection spring portion 820.

<Image Sensor Module>

Hereinafter, the image sensor module of the embodiment will be described.

The image sensor module may include the sensor substrate 241, the image sensor 242, and the substrate 700 described above.

Furthermore, the image sensor module may further include a main substrate 100 coupled to the substrate 700. The substrate 700 corresponding to the interposer may be referred to as a 'first substrate', the sensor substrate 241 on which the image sensor 242 is disposed may be referred to as a 'second substrate', and the main substrate 110 may also be referred to as a 'third substrate'.

FIG. 5a is a cross-sectional view of an image sensor module according to a first embodiment.

Referring to FIG. 5a, the image sensor module according to the embodiment may correspond to FIGS. 1 to 4.

The image sensor module includes a substrate 700.

A sensor substrate 241 is disposed on the substrate 700. An image sensor 242 may be mounted on the sensor substrate 241.

For example, a first adhesive portion SB1 may be disposed on the first terminal portion 721-1 of the substrate 700. In addition, a sensor substrate 241 may be disposed on the first adhesive portion SB1. For example, the sensor substrate 241 may be attached to the substrate 700 through the first adhesive portion SB1. For example, the pads 241-1 and 241-2 disposed on the sensor substrate 241 may be electrically connected to the first terminal portion 721-1 of the substrate 700 through the first adhesive portion SB1.

In addition, the main substrate 110 may be disposed on the substrate 700. For example, the main substrate 110 may include a third open region and may be disposed to surround the sensor substrate 241.

For example, a second adhesive portion SB may be disposed on the second terminal portion 721-2 of the substrate 700. In addition, the main substrate 110 may be attached to the substrate 700 through the second adhesive portion SB. For example, the pad 116 of the main substrate 110 may be electrically connected to the second terminal portion 721-2 of the substrate 700 through the second adhesive portion SB.

FIG. 5b is a view showing a modified example of the image sensor module of FIG. 5a.

Referring to FIG. 5b, the substrate 700 in FIG. 5a in the image sensor module of the second embodiment may be disposed in an inverted state, and the sensor substrate 241 may be coupled to the substrate 700 in the inverted state.

That is, the image sensor module includes a substrate 700.

A sensor substrate 241 is disposed on the substrate 700. An image sensor 242 may be mounted on the sensor substrate 241.

At this time, unlike FIG. 5a, the substrate 700 may be disposed such that the first pattern portion 721 and the second pattern portion 722 face downward.

In addition, the first pattern portion 721 and the pad of the sensor substrate 241 may be disposed to directly face each other at positions spaced apart from each other by a predetermined distance through the first terminal opening portion formed on the substrate 700.

In addition, a first adhesive portion SB1 may be disposed in the first terminal opening portion of the substrate 700. In addition, the sensor substrate 241 may be disposed on the first adhesive portion SB1. For example, the sensor substrate 241 may be attached to the substrate 700 through the first adhesive portion 531. For example, the pads 241-1 and 241-2 disposed on the sensor substrate 241 may be electrically connected to the first terminal portion 721-1 of the substrate 700 through the first adhesive portion SB1. According to the modified example, the separation distance between the substrate 700 and the sensor substrate 241 may be minimized by disposing a portion of the first adhesive portion SB1 in the first terminal opening portion. Accordingly, the embodiment may reduce the thickness of the image sensor module.

In addition, the main substrate 110 may be disposed on the substrate 700. For example, the main substrate 110 may include a third open region and may be disposed to surround the sensor substrate 241.

In addition, a second adhesive portion SB may be disposed in the second terminal opening portion of the substrate 700. In addition, the main substrate 110 may be disposed on the second adhesive portion SB. For example, the main substrate 110 may be attached to the substrate 700 through the second adhesive portion SB. For example, the pad 116 disposed on the main substrate 110 may be electrically connected to the second terminal portion 721-2 of the substrate 700 through the second adhesive portion SB.

On the other hand, the image sensor module may be vulnerable to heat dissipation. That is, the structure has a structure in which heat generated by the image sensor 242 is trapped in the receiving space of the lens driving device.

Accordingly, the embodiment allows to increase the heat dissipation of the image sensor module.

FIG. 6 is a cross-sectional view showing an image sensor module according to a second embodiment.

Referring to FIG. 6, a basic structure may be the same compared to the image sensor module of FIG. 5.

However, the image sensor module of the second embodiment may further include a heat dissipation portion 930 for dissipating heat.

To this end, the first insulating region 711 of the insulating portion 710 and the second-first pattern portion 722-1 of the second pattern portion 722 in the image 5 sensor module of the second embodiment are may be different from the structure of the image sensor module of the first embodiment.

The second-first pattern portion 722-1 of the second pattern portion 722 in the embodiment does not include the second open region OR.

The first insulating region 711 of the insulating portion 710 may include a through hole 711-9 exposing a lower surface of the second-first pattern portion 722-1. The through-hole 711-9 of the first insulating region 711 may pass through upper and lower surfaces of the first insulating region 711. For example, the through hole 711-9 of the first insulating region 711 may expose a lower surface of the second-first pattern portion 722-1. For example, the through hole 711-9 of the first insulating region 711 may expose an upper surface of the heat dissipation portion 930 attached to the lower surface of the first insulating region 711.

Accordingly, an area of the first insulating region 711 in the embodiment may be smaller than an area of the second-first pattern portion 722-1. For example, the area of the first insulating region 711 may be 95% or less of the area of the second-first pattern portion 722-1. For example, the area of the first insulating region 711 may be less than or equal to 90% of the area of the second-first pattern portion 722-1. For example, the area of the first insulating region 711 may be less than or equal to 85% of the area of the second-first pattern portion 722-1.

Accordingly, the second-first pattern portion 722-1 may include a first portion disposed on the upper surface of the first insulating region 711 and a second portion disposed on the through hole 711 of the first insulating region 711-9. For example, the second portion of the second-first pattern portion 722-1 may overlap the through hole 711-9 of the first insulating region 711 in the optical axis direction.

Meanwhile, an adhesive layer 920 may be formed in the through hole 711-9 of the first insulating region 711. The adhesive layer 920 may be formed to fill the inside of the through hole 711-9 of the first insulating region 711. For example, a thickness of the adhesive layer 920 may be the same as the thickness or depth of the through hole 711-9 of the first insulating region 711.

The adhesive layer 920 may be disposed in the through hole 711-9 of the first insulating region 711 to bond between the second-first pattern portion 722-1 and the heat dissipation portion 930. For example, the heat dissipation portion 930 may be attached to the lower surface of the first insulating region 711 through the adhesive layer 920. The adhesive layer 920 may include an adhesive member such as a thermosetting adhesive or a curable adhesive, but is not limited thereto. The adhesive layer 920 may be a solder paste, but is not limited thereto. However, the adhesive layer 920 preferably includes a material having high thermal conductivity.

Meanwhile, a sensor substrate 241 may be disposed on the substrate 700, and an image sensor 242 may be mounted on the sensor substrate 241.

In this case, the sensor substrate 241 may include a via 241-5. The via 241-5 of the sensor substrate 241 may be formed to pass through the upper and lower surfaces of the sensor substrate 241. In addition, the via 241-5 of the sensor substrate may be formed of a metal material having high thermal conductivity.

Accordingly, the upper surface of the via 241-5 may be in direct contact with the lower surface of the image sensor 242.

Meanwhile, an adhesive portion 910 may be disposed on a lower surface of the via 241-5. For example, the adhesive portion 910 may be attached to a lower surface of the via 241-5. The adhesive portion 910 may be connected to the lower surface of the image sensor 242 through the via 241-5.

Also, the adhesive portion 910 may be disposed on the second-first pattern portion 722-1. For example, the upper surface of the adhesive portion 910 directly contacts the via 241-5 of the sensor substrate 241. For example, the lower surface of the adhesive portion 910 may directly contact the second-first pattern portion 722-1 disposed on the first insulating region 711, Accordingly, the heat generated by the image sensor 242 in the embodiment may be transferred to the second-first pattern portion 722-1 through the via 241-5 and the adhesive portion 910 of the sensor substrate 241.

On the other hand, the heat dissipation portion 930 is disposed on the lower surface of the insulating portion 710 in the embodiment. For example, the heat dissipation portion 930 may be disposed on a lower surface of the first insulating region of the insulating portion 710. For example, the heat dissipation portion 930 may be attached to the lower surface of the first insulating region 711 through the adhesive layer 920.

In the second embodiment, the via 241-5 and the second-first pattern portion 722-1 are connected through the adhesive portion 910. In addition, the second-first pattern portion 722-1 and the heat dissipation portion 930 in the embodiment are connected through the adhesive layer 920. Accordingly, the heat generated by the image sensor 242 in the embodiment is transferred to the heat dissipation portion 930 through the via 241-5, the adhesive portion 910, the second-first pattern portion 722-1, and the adhesive layer 920. Accordingly, the heat generated by the image sensor 242 in the embodiment can be more efficiently transferred to the substrate 700, thereby improving heat dissipation characteristics.

Meanwhile, the heat dissipation portion 930 in the second embodiment includes a first portion in contact with the adhesive layer 920 and a second portion in contact with the first insulating region 711. For example, an area of the heat dissipation portion 930 in the second embodiment may be larger than an area of the adhesive layer 920. For example, an area of the heat dissipation portion 930 may be larger than an area of the through hole 711-9 formed in the first insulating region 711.

Accordingly, the heat generated by the image sensor 242 in the embodiment may be radiated to the outside, and thus heat dissipation characteristics may be improved. Furthermore, the embodiment may improve the operational reliability of the image sensor 242. Furthermore, the embodiment may improve the quality of the image acquired by the image sensor 242.

FIG. 7 is a view showing an image sensor module according to a third embodiment.

Referring to FIG. 7, the image sensor module according to the third embodiment is the same as the module of the image sensor module according to the second embodiment of FIG. 6 except for the structure of the adhesive layer 920a and the heat dissipation portion 930a.

As described above, the heat dissipation portion 930 according to the second embodiment was attached to the lower surface of the first insulating region 711 through the adhesive layer 920.

Unlike this, the heat dissipation portion 930a according to the third embodiment may not contact the lower surface of the first insulating region 711.

For example, the heat dissipation portion 930a in the third embodiment may be disposed in the through hole 711-9 of the first insulating region 711. For example, the thickness of the adhesive layer 920a in the third embodiment may be smaller than the depth of the through hole 711-9 of the first insulating region 711. Accordingly, the adhesive layer 920a may fill only a part of the through hole 711-9 of the first insulating region 711.

In the embodiment, the heat dissipation portion 930a may be attached to the adhesive layer 920a. For example, the heat dissipation portion 930a in the embodiment may be attached to the adhesive layer 920a and disposed in the through hole 711-9 of the first insulating region 711.

According to the third embodiment, at least a part of the heat dissipation portion 930a is disposed in the through hole 711-9 of the first insulating region 711. Accordingly, the thickness of the image sensor module may be reduced. Furthermore, the embodiment may reduce the overall thickness of the lens driving device by reducing the thickness of the image sensor module. Accordingly, the embodiment may reduce the thickness of the camera module.

Meanwhile, the layer structure of the pattern portion 720 of the embodiment will be described in detail below.

The pattern portion 720 may have a plurality of layer structures. For example, the pattern portion 720 may include a metal layer and a surface treatment layer. The metal layer of the pattern portion 720 may be a raw material constituting the pattern portion 720. For example, the metal layer of the pattern portion 720 may be a rolled material. The surface treatment layer may be formed on the metal layer of the pattern portion 720. The surface treatment layer may be a surface protective layer that prevents oxidation of the pattern portion 720.

That is, when the surface treatment layer is not formed on the surface of the metal layer of the pattern portion 720, oxidation or discoloration of an exposed surface of the pattern portion 720 may occur. Accordingly, electrical reliability may be reduced.

Therefore, the surface treatment layer in the embodiment is formed on the metal layer of the pattern portion 720 to protect the surface of the metal layer of the pattern portion 720.

The surface treatment layer may be an organic coating layer. That is, in the embodiment, the surface treatment layer can be formed by coating an organic material on the metal layer of the pattern portion 720. In other words, conventionally, a surface treatment layer is formed by plating nickel (Ni), gold (Au), or the like on the metal layer. However, the conventional surface treatment layer as described above is formed by plating the metal material as described above. In this case, when the surface treatment layer is formed of nickel, it is difficult to control the concentration of phosphorus in a nickel-plating bath, and thus there is a problem in that fairness is deteriorated. Furthermore, when the concentration of phosphorus in the nickel-plating bath is not properly managed, there is a problem in that the black pad shape in which the surface of the pattern portion 720 is changed to black occurs due to oxidation of nickel. At this time, gold (Au) plating is not properly performed on the portion where the black pad phenomenon occurs. Accordingly, when the pattern portion 720 is used as a chip mounting pad, there is a problem in that it is difficult to perform normal plating of the gold (Au), so that chip bonding properties are deteriorated. In addition, when the surface treatment layer is formed of gold (Au) as in the prior art, an environmental problem may occur due to cyanide ions (CN—) in the gold (Au) plating bath. That is, the cyanide ion in the gold plating bath is not an environmentally friendly material. Accordingly, there is a problem that special equipment is required for wastewater treatment. In addition, when the surface treatment layer is formed of nickel, signal interference occurs in a high frequency band due to the magnetism of the nickel. Accordingly, there is a problem in that the electrical reliability of the pattern portion 720 is lowered.

Accordingly, the surface treatment layer of the pattern portion 720 in the embodiment is formed using an organic material, not a material such as nickel or gold (Au).

Hereinafter, the layer structure of the pattern portion 720 of the embodiment will be described in detail.

FIG. 8a is a view for explaining a layer structure of a pattern portion according to a first embodiment, FIG. 8b is a view showing a chemical reaction formula of a surface treatment layer of FIG. 8a, and FIG. 8c is a view showing a surface of the surface treatment layer of FIG. 8a.

Since the specific structure of the pattern portion 720 has been previously described in detail, a description thereof will be omitted.

The first pattern portion 721 and the second pattern portion 722 may include a metal layer corresponding to a rolled material and a surface treatment layer formed on the metal layer.

For example, the first terminal portion 721-1 of the first pattern portion 721 may include a metal layer 721-11 disposed on the first insulating region 711, and a surface treatment layer 721-12 disposed on the metal layer 721-11.

For example, the second terminal portion 721-2 of the first pattern portion may include a metal layer 721-21 disposed on the second insulating region 712, and a surface treatment layer 721-22 disposed on the metal layer 721-21.

For example, the connection portion 721-3 of the first pattern portion 721 may include a metal layer 721-31 disposed on the separation region 713 of the insulating portion 710, and a surface treatment layer 721-32 disposed on the metal layer 721-31.

For example, the second-first pattern portion 722-1 of the second pattern portion 722 includes a metal layer 722-11 disposed on the first insulating region 711, and a surface treatment layer 722-12 disposed on the metal layer 722-11.

For example, the second-second pattern portion 722-2 of the second pattern portion 722 includes a metal layer 722-21 disposed on the second insulating region 712, and a surface treatment layer 722-22 disposed on the metal layer 722-21.

The surface treatment layers 721-12, 721-22, 721-32, 722-12 and 722-22 of each of the first pattern portion 721 and the second pattern portion 722 may be formed on the metal layer 721-11, 721-21, 721-31, 722-11, 722-21. For example, the surface treatment layers 721-12, 721-22, 721-32, 722-12, and 722-222 may be formed on the metal layers 721-11, 721-21, 721-31, 722-11, 722-21 by coating an organic material.

That is, a surface treatment layer for protecting the surfaces of the first pattern portion 721 and the second pattern portion 722 in the embodiment is formed using an organic material.

The surface treatment layers 721-12, 721-22, 721-32, 722-12, and 722-22 may be formed of an organic material having no conductivity. However, the embodiment is not limited thereto. For example, the surface treatment layers 721-12, 721-22, 721-32, 722-12, and 722-22 may be formed of any one of an organic material, an inorganic material, and a composite thereof having low electrical conductivity.

At this time, the organic material constituting the surface treatment layers 721-12, 721-22, 721-32, 722-12 and 722-22 as described above has a low relative dielectric constant ε. In this case, the relative dielectric constant ε affects the signal transmission speed v of the wiring included in the pattern portion 720. For example, the signal transmission speed v may be determined by the following Equation 1.

$$v = K * C \frac{1}{\sqrt{\varepsilon r}}$$ [Equation 1]

Here, v is the signal transmission speed, ε is the relative dielectric constant of the material constituting the pattern portion 720, C is the speed of light, and K is an integer.

Here, the relative dielectric constant of the surface treatment layers 721-12, 721-22, 721-32, 722-12, and 722-22 is 3.24. This is significantly smaller than the relative dielectric constant ε of the nickel or gold (Au). For example, the relative dielectric constant c of the nickel or gold (Au) is 4 or more. Accordingly, the embodiment may improve the signal transmission speed v of the wiring included in the pattern portion 720. Accordingly, the embodiment may improve product reliability of the circuit board.

In addition, the thermal conductivity of the organic material constituting the surface treatment layer 721-12, 721-22, 721-32, 722-12, and 722-22 is higher than that a conventional nickel or metal layer 721-11, 721-21, 721-31, 722-11, and 722-21. Accordingly, the thermal conductivity of the pattern portion 720 including the surface treatment layers 721-12, 721-22, 721-32, 722-12, and 722-22 may be increased in the embodiment.

That is, thermal conductivity and heat dissipation characteristics in the embodiment can be improved by applying the surface treatment layer 721-12, 721-22, 721-32, 722-12, 722-22 through the organic coating.

On the other hand, the surface treatment layer 721-12, 721-22, 721-32, 722-12 and 722-22 may be formed on at least one side surface of the metal layer 721-11, 721-21, 721-31, 722-11 and 722-21 constituting the pattern portion 720. For example, the surface treatment layers 721-12, 721-22, 721-32, 722-12, and 722-22 may respectively formed on exposed surfaces of the metal layers 721-11, 721-21, 721-31, 722-11, and 722-21.

The first terminal portion 721-1 may include an upper surface, a side surface, and a lower surface. In addition, the upper and side surfaces of the first terminal portion 721-1 do not come into contact with other components of the circuit board. Accordingly, the surface treatment layer 721-12 of the first terminal portion 721-1 may be formed on the upper surface and the side surface of the metal layer 721-11 of the first terminal portion 721-1.

However, the surface treatment layer may not be formed on at least a portion of the lower surface of the metal layer 721-11 of the first terminal portion 721-1. For example, the surface treatment layer 721-12 may not be formed on a lower surface of the metal layer 721-11 of the first terminal portion 721-1 overlapping the first insulating region 711 in a vertical direction or in a thickness direction. However, a part of the lower surface of the metal layer 721-11 of the first terminal portion 721-1 may not overlap the first insulating region 711 in a vertical direction or a thickness direction. For example, a part of the lower surface of the metal layer 721-11 of the first terminal portion 721-1 is exposed through the first terminal opening portion formed in the first insulating region 711. For example, the metal layer 721-11 of the first terminal portion 721-1 includes a region overlapping the first terminal opening portion of the first insulating region 711 in a vertical direction or a thickness direction. In addition, the surface treatment layer 721-12 of the first terminal portion 721-1 may be formed on the lower surface of the metal layer 721-11 of the first terminal portion 721-1 overlapping the first terminal opening portion (not shown). For example, a lower surface of the metal layer 721-11 of the first terminal portion 721-1 includes a first-first lower surface overlapping the first insulating region 711 in a thickness direction and a first-second lower surface other than the first-first lower surface. In addition, the first-second lower surface may be a portion overlapping the first terminal opening portion of the first insulating region 711 in the thickness direction. In addition, the surface treatment layer 721-12 of the first terminal portion 721-1 may be formed only on the first-second lower surface of the metal layer 721-11 of the first terminal portion 721-1.

In addition, the second terminal portion 721-2 may include an upper surface, a side surface, and a lower surface.

In addition, the upper and side surfaces of the second terminal portion 721-2 do not come into contact with other components of the circuit board. Accordingly, the surface treatment layer 721-22 of the second terminal portion 721-2 may be formed on the upper surface and the side surface of the metal layer 721-21 of the second terminal portion 721-2.

However, it may not be formed on at least a portion of the lower surface of the metal layer 721-21 of the second terminal portion 721-2. A part of the lower surface of the metal layer 721-21 of the second terminal portion 721-2 is exposed through the second terminal opening portion formed in the second insulating region 712. For example, the metal layer 721-21 of the second terminal portion 721-2 may include a region overlapping the second terminal opening portion (not shown) of the second insulating region 712 in the vertical direction or in the thickness direction. For example, a lower surface of the metal layer 721-21 of the second terminal portion 721-2 includes a second-first lower surface overlapping the second insulating region 712 in a thickness direction and a second-second lower surface other than the second-first lower surface. In addition, the second-second lower surface may be a portion overlapping the second terminal opening portion of the second insulating region 712 in the thickness direction. In addition, the surface treatment layer 721-22 of the second terminal portion 721-2 may be formed on the second-second lower surface of the metal layer 721-21 of the second terminal portion 721-2.

In addition, the connection portion 721-3 includes an upper surface, a side surface and a lower surface. In this case, the connection portion 721-3 may not come into contact with the insulating portion 710, For example, the connection portions 721-3 are disposed in the separation region 713 of the insulating portion 710. For example, the connection portions 721-3 may be arranged in a flying state in the separation region 713 of the insulating portion 710. Accordingly, the upper surface, the side surface, and the lower surface of the metal layer 721-31 of the connection portion 721-3 may not come into contact with other components of the circuit board. Accordingly, the surface treatment layer 721-32 of the connection portion 721-3 may be disposed on the upper surface, the side surface, and the lower surface of the metal layer 721-31 of the connection portion 721-3 in the embodiment. In addition, the surface treatment layer 721-32 of the connection portion 721-3 may also perform an insulating function of the connection portion 721-3 when the image sensor is moved according to an embodiment.

Meanwhile, the second-first pattern portion 722-1 of the second pattern portion 722 is disposed on the first insulation region 711 of the insulation portion 710. In this case, the second-first pattern portion 722-1 of the second pattern portion 722 may include an upper surface, a side surface, and a lower surface. In addition, an entire region of the lower surface of the second-first pattern portion 722-1 may contact the upper surface of the first insulating region 711. Accordingly, the surface treatment layer 722-12 of the second-first pattern portion 722-1 may not be formed on the lower surface of the metal layer 722-11 of the second-first pattern portion 722-1. For example, the surface treatment layer 722-12 of the second-first pattern portion 722-1 may be only formed on the upper surface and the side surface of the metal layer 722-11 of the second-first pattern portion 722-1.

In addition, the second-second pattern portion 722-2 of the second pattern portion 722 is disposed on the second insulating region 712 of the insulation portion 710. In this case, the second-second pattern portion 722-2 of the second pattern portion 722 may include an upper surface, a side surface, and a lower surface. In addition, an entire region of the lower surface of the second-second pattern portion 722-2 may be in contact with the upper surface of the second insulating region 712. Accordingly, the surface treatment layer 722-22 of the second-second pattern portion 722-2 may be not formed on the lower surface of the metal layer 722-21 of the second-second pattern portion 722-2. For example, the surface treatment layer 722-22 of the second-second pattern portion 722-2 may be only formed on the upper surface and the side surface of the metal layer 722-21 of the second-second pattern portion 722-2.

Meanwhile, although not shown in the drawings, an adhesive layer (not shown) may be formed on the insulating portion 710 and the pattern portion 720. That is, the pattern portion 720 may be formed of a rolled material. In addition, the adhesive layer may be formed between the insulating region 711 and the rolled metal layer for bonding the rolled metal layer of the rolled material and the insulating portion 710. Accordingly, an adhesive layer y be formed between the pattern portion 720 and the insulating portion 710.

On the other hand, as shown in FIG. 8b, the surface treatment layer 721-12, 721-22, 721-32, 722-12, 722-22 constituting the pattern portion 720 may be formed by coating a thin film on the metal layers 721-11, 721-21, 721-31, 722-11, and 722-21. The thin film may be formed by applying at least one coating method among methods such as spray, dip, and deposition. In addition, as the coating solution, an organic material, an inorganic material, an organic-inorganic composite, etc. having no conductivity or low conductivity may be applied.

Preferably, the embodiment forms the surface treatment layer 721-12, 721-22, 721-32, 722-12, 722-22 using an alkylimidazole. The alkylimidazole has low conductivity and high thermal conductivity. That is, the alkylimidazole has excellent insulating properties and heat dissipation properties.

At this time, the surface treatment layer 721-12, 721-22, 721-32, 722-12, 722-22 may be formed by coordination between ions separated from the nitrogen (N) element of the alkylimidazole and copper (Cu) ions constituting the pattern portion B20. That is, the thin film is formed on the pattern portion 720 using the coating solution of the alkylimidazole. At this time, the ions separated from the nitrogen element of the alkylimidazole and the copper ions of the pattern portion 720 are coordinated. Accordingly, surface treatment layers 721-12, 721-22, 721-32, 722-12, and 722-22 may be formed on the pattern portion 720.

The surface treatment layers 721-12, 721-22, 721-32, 722-12, and 722-22 may have a thickness in the range of 0.1 μm to 10 μm. For example, the surface treatment layers 721-12, 721-22, 721-32, 722-12, and 722-22 may have a thickness in a range of 0.15 μm to 8 μm. For example, the surface treatment layers 721-12, 721-22, 721-32, 722-12, and 722-22 may have a thickness of 0.2 μm to 5 μm. When the thickness of the surface treatment layers 721-12, 721-22, 721-32, 722-12, and 722-22 is less than 0.1 μm, there is a problem in that a uniform surface treatment layer cannot be formed on the surface of the pattern portion 720. That is, when the thickness of the surface treatment layers 721-12, 721-22, 721-32, 722-12, and 722-22 is less than 0.1 μm, a problem occurs that the surface treatment layer cannot be disposed on some surfaces of the pattern portion 720, and oxidation may occur in a region where the surface treatment layer is not disposed. In addition, when the thickness of the surface treatment layers 721-12, 721-22, 721-32, 722-12, and 722-22 exceeds the range of 10 μm, the resistance increases as the thickness of the pattern portion 720 increases, and accordingly, there is a problem in that signal loss increases. Furthermore, when the thickness of the surface treatment layers 721-12, 721-22, 721-32, 722-12, and 722-22 exceeds 10 µm, there is a problem in that the coating cost for forming the surface treatment layer increases.

Meanwhile, the metal layer of the rolled material of the pattern portion 720 in an embodiment includes copper (Cu) and titanium (Ti). Accordingly, titanium (Ti) of the pattern portion 720 is included in the surface treatment layers 721-12, 721-22, 721-32, 722-12, and 722-22.

That is, referring to FIG. 8c, the surfaces of the surface treatment layers 721-12, 721-22, 721-32, 722-12, and 722-22 may contain different concentrations of metal elements for each region.

Table 1 shows the surface analysis results of region A of FIG. 8c.

TABLE 1

| ELEMENT | CONCENTRATION (wt %) |
|---|---|
| C | 51.88 |
| O | 6.45 |
| Cl | 0.60 |
| Ti | 1.85 |
| Cu | 39.23 |

Table 2 shows the surface analysis results of region B of FIG. 8c.

TABLE 2

| ELEMENT | CONCENTRATION (wt %) |
|---|---|
| C | 75.34 |
| O | 6.01 |
| Cl | 6.06 |
| Ti | 0.33 |
| Cu | 9.47 |

Referring to Tables 1 and 2, the surface treatment layers 721-12, 721-22, 721-32, 722-12, and 722-22 include copper (Cu) and titanium (Ti), which are metal elements constituting the pattern portion 720 other than the metal elements constituting the alkylimidazole. However, the degree of coordination between the pattern portion 720 and the metal element may be different for each region of the surface treatment layers 721-12, 721-22, 721-32, 722-12, and 722-22, Accordingly, the concentrations of copper (Cu) and titanium (Ti) may be different for each region. For example, the pattern portion 720 is made of a rolled material, and thus copper concentration and titanium concentration may be different for each region. In addition, the surface treatment layers 721-12, 721-22, 721-32, 722-12, and 722-22 may include elements having different concentrations for each region as shown in Tables 1 and 2 due to the concentration difference in each region.

On the other hand, a brief description of the manufacturing process for forming the surface treatment layers 721-12, 721-22, 721-32, 722-12, and 722-2 as described above as follows.

First, the pattern portion in the embodiment may be formed on the insulating portion. That is, the pattern portion 720 in the embodiment may be formed by attaching a metal layer of a rolled material on the insulating portion and patterning the attached metal layer.

Thereafter, the embodiment may proceed with a pretreatment process for surface treatment.

For example, the surface of the pattern portion 720 in an embodiment may be provided with a certain level of roughness or higher by performing chemical polishing using at least one of sulfuric acid and hydrochloric acid, or physical polishing using at least one of a brush, sandpaper, and abrasive stone. For example, a surface roughness of Ra (0.05 to 0.2 µm) and Rz (1.0 to 3.0 µm) level may be provided to the pattern portion 720 in order to form the surface treatment layer 721-12, 721-22, 721-32, 722-12, 722-22.

Thereafter, the embodiment prepares a coating solution of at least one of an organic material, an inorganic material, and an organic-inorganic composite with no or low conductivity. In addition, the prepared coating solution may be applied to the pre-treated pattern portion 720 by at least one of coating methods such as spray, dip, and deposition to form a surface treatment layer.

FIG. 9a is a view for explaining a layer structure of a pattern portion according to a second embodiment, FIG. 9b is an enlarged view of a connection portion of FIG. 9b, and FIG. 9c is a view showing a second surface treatment portion of the surface treatment layer of FIG. 9a.

The metal layers 721-11, 721-21, 721-31, 722-11, 722-21 constituting the pattern portion 720 are made of a rolled material.

At this time, the metal layer of a general rolled material has a centerline average surface roughness (Ra) in the range of 0.025 µm to 0.035 µm or/and 10-point average surface roughness in the range of 0.3 µm to 0.5 µm. In this case, when the metal layer has the roughness within the above range, the adhesion between the pattern portion 720 and the insulating portion 710 is reduced due to the low surface roughness. Thereby, there is a problem in that the pattern portion is detached from the insulating portion.

Accordingly, the pattern portion 720 may further include a plating layer. The plating layer may refer to a plating layer formed by plating the surfaces of the metal layers 721-11, 721-21, 721-31, 722-11, and 722-21 including the rolled material.

For example, a plating layer 721-13 may be formed between the metal layer 721-11 of the first terminal portion 721-1 and the first insulating region 711. Accordingly, the surface treatment layer 721-12 of the first terminal portion 721-1 may be disposed to cover the metal layer 721-11 and the plating layer 721-13 of the first terminal portion 721-1.

For example, a plating layer 721-23 may be disposed between the metal layer 721-21 of the second terminal portion 721-2 and the second insulating region 712. Accordingly, the surface treatment layer 721-12 of the second terminal portion 721-2 may be disposed to cover the metal layer 721-21 and the plating layer 721-23 of the second terminal portion 721-2.

In addition, the connection portion 721-3 includes a plating layer 721-33 disposed under the metal layer 721-31. In addition, the surface treatment layer 721-33 of the connection portion 721-3 may be disposed to surround the metal layer 721-31 and the plating layer 721-33 of the connection portion 721-3.

Correspondingly, a plating layer 722-13 may be formed between the metal layer 722-11 of the second-first pattern portion 722-1 and the first insulating region 711. Accordingly, the surface treatment layer 722-12 of the second-first pattern portion 722-1 may be disposed to cover the metal layer 722-11 and the plating layer 722-13.

In addition, a plating layer 722-23 may be disposed between the metal layer 722-21 of the second-second pattern portion 722-2 and the second insulating region 712. Accordingly, the surface treatment layer 722-12 of the second-second pattern portion 722-2 may disposed to cover the metal layer 722-21 and the plating layer 722-23 of the second-second pattern portion 722-2.

Meanwhile, the plating layers 721-13, 721-23, 721-33, 722-13, and 722-23 may include pure copper. Accordingly, an element of the surface treatment layer in the portion formed on the metal layer 721-11, 721-21, 721-31, 722-11, and 722-21 may be different from an element of the surface treatment layer in the portion formed on the plating layers 721-13, 721-23, 721-33, 722-13, and 722-23.

In this case, the metal layers 721-11, 721-21, 721-31, 722-11, and 722-21 may be referred to as a first metal layer, and the plating layers 721-13, 721-23, 721-33, 722-13, and 722-23 may also be referred to as a second metal layer. Hereinafter, the connection portion 721-3 will be described as an example.

The surface treatment layer 721-32 of the connection portion 721-3 may include a first surface treatment portion 721-321 in contact with the metal layer 721-31 of the connection portion 721-3, and a second surface treatment portion 721-322 in contact with the plating layer 721-33 of the connection portion 721-3. Also, elements in the first surface treatment portion 721-321 and elements in the second surface treatment portion 721-322 may appear different from each other.

That is, the metal layers 721-11, 721-21, 721-31, 722-11, and 722-21 include titanium, and thus the surface treatment layer 721-12, 721-22, 721-32, 722-12, and 722-2 include titanium as shown in Tables 1 and 2. Accordingly, the elements shown in Tables 1 and 2 may be included in the first surface treatment portion 721-321.

Alternatively, the plating layer 721-13, 721-23, 721-33, 722-13, and 722-23 includes only copper. For example, titanium is not included in the plating layers 721-13, 721-23, 721-33, 722-13, and 722-23. Accordingly, titanium may not be included in the second surface treatment portion 721-322.

For example, as shown in FIG. 9c, the result of the surface analysis in a region C of the second surface treatment portion 721-322 are shown in Table 3.

TABLE 3

| ELEMENT | CONCENTRATION (wt %) |
|---|---|
| C | 63.73 |
| O | 6.65 |
| Cl | 0.95 |
| Cu | 28.67 |

As shown in Table 3, the second surface treatment portion 721-322 may not contain titanium (Ti) included in the first surface treatment portion 721-321.

Hereinafter, the plating layer ill be described in detail.

The plating layer 721-13, 721-23, 721-33, 722-13, and 722-23 may be formed by electrolytic plating or electroless plating on the metal layer 721-13, 721-23, 721-33, 722-13, and 722-23 that is a rolled copper foil alloy. The plating layers 721-13, 721-23, 721-33, 722-13, and 722-23 may formed by plating of plating particles containing copper on the surfaces of the metal layers 721-11, 721-21, 721-31, 722-11, and 722-21. The plating particles constituting the plating layer 721-13, 721-23, 721-33, 722-13, and 722-23 may contain a binary or ternary complex element containing copper as a main component and at least one of Ni, Co, Mn and Al. The plating layers 721-13, 721-23, 721-33, 722-13, and 722-23 may be formed on the metal layers 721-11, 721-21, 721-31, 722-11, and 722-21 to have a predetermined thickness. For example, the plating layers 721-13, 721-23, 721-33, 722-13, and 722-23 may have a thickness in a range of 0.5 μm to 10 μm. For example, the plating layers 721-13, 721-23, 721-33, 722-13, and 722-23 may have a thickness in a range of 0.8 μm to 8 μm. For example, the plating layers 721-13, 721-23, 721-33, 722-13, and 722-23 may have a thickness in a range of 1.0 μm to 6 μm. When the thickness of the plating layers 721-13, 721-23, 721-33, 722-13, and 722-23 is less than 0.5 μm, it may be difficult to form the plating layer 721-13, 721-23, 721-33, 722-13, and 722-23 of a uniform thickness on the surface of the metal layer 721-11, 721-21, 721-31, 722-11, and 722-21. For example, when the thickness of the plating layers 721-13, 721-23, 721-33, 722-13, and 722-23 is less than 0.5 μm, a problem in that a plating layer is not formed in a specific region of the metal layers 721-11, 721-21, 721-31, 722-11, and 722-21 may occur. Accordingly, there is a problem that oxidation of the pattern portion occurs. When the thickness of the plating layers 721-13, 721-23, 721-33, 722-13, and 722-23 exceeds 10 μm, the overall thickness of the pattern portion increases. Accordingly, the elastic properties of the pattern portion may be reduced, and the mobility of the moving portion of the camera module may be reduced. In addition, when the thickness of the plating layers 721-13, 721-23, 721-722-13, and 722-23 exceeds 10 μm, the resistance of the pattern portion may increase and signal transmission loss may increase.

Meanwhile, the plating layer 721-13, 721-23, 721-33, 722-13, and 722-23 in the embodiment has been described as being disposed only on one surface of the metal layer 721-11, 721-21, 721-31, 722-11, and 722-21, but is not limited thereto. That is, the plating layers 721-13, 721-23, 721-33, 722-13, and 722-23 may also be disposed on the upper surface of the metal layers 721-11, 721-21, 721-31, 722-11, and 722-21. In addition, when the plating layer is also disposed on the upper surface of the metal layers 721-11, 721-21, 721-31, 722-11, 722-21, the metal layers 721-11, 721-21, 721-31, adhesion between the metal layer and a dry film (not shown) may be improved in the etching process for patterning the metal layers 721-11, 721-21, 721-31, 722-11, and 722-21. And, the etching reliability of the metal layer may be improved as the adhesion between the metal layer and the dry film is improved.

FIG. 10 is a view for explaining a surface roughness of a metal layer and a plating layer of the pattern portion according to the embodiment.

FIG. 10 (*a*) is a view showing the surface of the metal layer 721-11, 721-21, 721-31, 722-11, and 722-21 of the pattern portion 720, and FIG. 10 (*b*) is a view showing the surface of the plating layer 721-13, 721-23, 721-33, 722-13, and 722-23 of the pattern portion 720.

As in (a) of FIG. 10, the metal layer 721-11, 721-21, 721-31, 722-11 and 722-21 refers to the surface of the rolled copper foil alloy. Accordingly, the surface roughness of the metal layer 721-11, 721-21, 721-31, 722-11, and 722-21 has a lower value than the surface roughness of the plating layer 721-13, 721-23, 721-33, 722-13, and 722-23.

For example, the surface of the metal layer 721-11, 721-21, 721-31, 722-11, 722-21 has a centerline average surface roughness (Ra) in the range of 0.025 μm to 0.035 μm or/and a 10-point average surface roughness in the range of 0.3 μm to 0.5 μm. And, when the surface of the metal layer 721-11, 721-21, 721-31, 722-11, 722-21 and the surface of the insulating portion 710 (or the surface of the adhesive layer disposed on the surface of the insulating portion) are in direct contact, there is a problem in that the metal layers 721-11, 721-21, 721-31, 722-11, and 722-21 are separated from the insulating portion 710 due to a decrease in adhesion.

Accordingly, the plating layer 721-13, 721-23, 721-33, 722-13, and 722-23 are formed on the surface of the metal layer 721-11, 721-21, 721-31, 722-11 and 722-21. Accordingly, the surface of the plating layer 721-13, 721-23, 721-33, 722-13, and 722-23 in the embodiment, not the surface of the metal layer 721-11, 721-21, 721-31, 722-11, and 722-21, is in contact with the surface of the insulating portion 710 (or the surface of the adhesive layer). Accordingly, the embodiment may improve the adhesion between the pattern portion 720 and the insulating portion 710.

At this time, a reference range of the surface roughness of the plating layer 721-13, 721-23, 721-33, 722-13, and 722-23 may be as follows. That is, the reference range of the centerline average surface roughness (Ra) of the plating layers 721-13, 721-23, 721-33, 722-13, and 722-23 and the reference range of the 10-point average surface roughness (Rz) may be as follows. For example, the surface of the plating layer 721-13, 721-23, 721-33, 722-13, 722-23 (specifically, the lower surface facing the upper surface of the insulating portion 710) may have a centerline average surface roughness (Ra) in a range of 0.05 μm to 1.5 μm. For example, the surface of the plating layer 721-13, 721-23, 721-33, 722-13, and 722-23 in the embodiment may have a centerline average surface roughness (Ra) in the range of 0.05 μm to 1.0 μm. For example, the surfaces of the plating layers 721-13, 721-23, 721-33, 722-13, and 722-23 in the embodiment may have a centerline average surface roughness Re in the range of 0.08 μm to 0.8 μm. For example, the surface of the plating layer 721-13, 721-23, 721-33, 722-13, and 722-23 in the embodiment may have a 10-point average surface roughness (Rz) in the range of 6.6 μm to 15 μm there is. For example, the surface of the plating layer 721-13, 721-23, 721-33, 722-13, and 722-23 in the embodiment may have a 10-point average surface roughness (Rz) in the range of 0.7 μm to 14.0 μm. For example, the surface of the plating layers 721-13, 721-23, 721-33, 722-13, and 722-23 may have a 10-point average surface roughness Rz in the range of 1.0 μm to 12 μm.

That is, the surface of the plating layer 721-13, 721-23, 721-33, 722-13, and 722-23 in the embodiment may have a surface roughness of 10 times or more compared to the surface of the metal layer 721-11, 721-21, 721-31, 722-11, and 722-21. That is, the surface of the plating layer 721-13, 721-23, 721-33, 722-13, and 722-23 in the embodiment may have a surface roughness of 20 times or more compared to the surface of the metal layer 721-11, 721-21, 721-31, 722-11, and 722-21.

When the surface roughness of the plating layer 721-13, 721-23, 721-33, 722-13, and 722-23 has a centerline average roughness (Ra) of less than 0.05 μm or a 10-point average roughness (Rz) of less than 0.6 μm, the pattern portion 720 may be detached from the insulation portion 710 due to a decrease in adhesion between the pattern portion 720 and the insulation portion 710. In addition, when the surface roughness of the plating layer 721-13, 721-23, 721-33, 722-13, and 722-23 has a centerline average roughness (Ra) of less than 0.05 μm or a 10-point average roughness (Rz) of less than 0.6 μm, an etching efficiency of the metal layers 721-11, 721-21, 721-31, 722-11, and 722-21 may be reduced. In addition, when the etching efficiency is reduced, a difference between the width of the upper surface and the width of the lower surface of the pattern portion 720 may increase, and thus the electrical reliability of the pattern portion 720 may be deteriorated.

In addition, when the surface roughness of the plating layer 721-13, 721-23, 721-33, 722-13, and 722-23 has a centerline average roughness (Ra) exceeding 1.5 μm or a 10-point average roughness (Rz) exceeding 15.0 μm, the thickness of the pattern portion 720 may increase. In addition, when the thickness of the pattern portion 720 is increased, the mobility of the sensor portion with respect to the fixed portion may be reduced according to a decrease in the elastic force of the pattern portion 720.

FIGS. 11a to 11e are views for explaining the relationship between plating conditions and adhesion of a plating layer according to an embodiment.

FIG. 11a is a view showing the relationship between the adhesion force between the plated layer and the insulating portion under a first plating condition, FIG. 11b is a view showing the relationship between the adhesion force between the plated layer and the insulating portion under a second plating condition, FIG. 11c is a view showing the relationship between the adhesion force between the plated layer and the insulating portion under a third plating condition, FIG. 11d is a view showing the relationship between the adhesion force between the plated layer and the insulating portion under a fourth plating condition, and FIG. 11e is a view showing the relationship between the adhesion force between the plated layer and the insulating portion under a fifth plating condition Hereinafter, a relationship between the plating condition of the plating layer and the adhesion force will be described with reference to FIGS. 11a to 11e.

As described above, the plating layer 721-13, 721-23, 721-33, 722-13, and 722-23 having a centerline average surface roughness (Ra) and a 10-point average surface roughness (Rz) of a certain level is formed on the surface of the metal layer 721-11, 721-21, 721-31, 722-11, and 722-21 constituting the pattern portion 720. Through this, the embodiment increases the adhesion between the pattern portion 720 and the insulating portion 710.

However, it was confirmed that even if the centerline average surface roughness (Ra) and/or the 10-point average surface roughness (Rz) of the surfaces of the plating layers 721-13, 721-23, 721-33, 722-13, and 722-23 satisfies the above-described range, a problem in that the adhesion between the pattern portion 720 and the insulating portion 710 decreases.

FIG. 11a is a view for explaining a peel strength (90' peel strength) between the plating layer and the insulating portion under the first plating condition. FIG. 11a (a) is a view showing a 3D image of the surface roughness of the plating layer under the first plating condition, and FIG. 11a (b) is a view showing a profile for the surface roughness of the plating layer under the first plating condition.

Specifically FIG. 11a shows the peel strength (90' peel strength) between the plating layer and the insulating portion when the surface roughness of the plating layer has a centerline average roughness (Ra) of 0.2 μm and a 10-point average roughness (Rz) of 6.1 μm and the thickness of the plating layer is 3.7 μm. At this time, as in FIG. 11a, when the plating layer is formed under the first plating conditions having a centerline average roughness (Ra) and a 10-point average roughness (Rz) in the above-described ranges, it was confirmed that the peel strength (90' peel strength) between the plating layer and the insulating portion was 79.5 gf/mm.

FIG. 11b is a view for explaining a peel strength (90' peel strength) between the plating layer and the insulating portion under the second plating condition. FIG. 11b (a) is a view showing a 3D image of the surface roughness of the plating layer under the second plating condition, and FIG. 11b (b) is a view showing a profile for the surface roughness of the plating layer under the second plating condition.

Specifically, FIG. 11b shows the peel strength (90' peel strength) between the plating layer and the insulating portion when the surface roughness of the plating layer has a centerline average roughness (Ra) of 0.6 μm and a 10-point average roughness (Rz) of 7.4 μm and the thickness of the plating layer is 1.4 μm. At this time, as in FIG. 11b, when the plating layer s formed under the second plating conditions having a centerline average roughness (Ra) and a 10-point average roughness (Rz) in the above-described ranges, it was confirmed that the peel strength (90' peel strength) between the plating layer and the insulating portion was 45.5 gf/mm.

FIG. 11c is a view for explaining a peel strength (90'' peel strength) between the plating layer and the insulating portion under the third plating condition. FIG. 11c (a) is a view showing a 3D image of the surface roughness of the plating layer under the third plating condition, and FIG. 11c (b) is a view showing a profile for the surface roughness of the plating layer under the third plating condition.

Specifically, FIG. 11c shows the peel strength (90' peel strength) between the plating layer and the insulating portion when the surface roughness of the plating layer has a centerline average roughness (Ra) of 1.0 μm and a 10-point average roughness (Rz) of 9.9 μm and the thickness of the plating layer is 5.7 μm. At this time, as in FIG. 11c, when the plating layer is formed under the third plating conditions having a centerline average roughness (Ra) and a 10-point average roughness (Rz) in the above-described ranges, it was confirmed that the peel strength (90' peel strength) between the plating layer and the insulating portion was 70.9 gf/mm.

FIG. 11d is a view for explaining a peel strength (90' peel strength) between the plating layer and the insulating portion under the fourth plating condition. FIG. 11d (a) is a view showing a 3D image of the surface roughness of the plating layer under the fourth plating condition, and FIG. 11d (b) is a view showing a profile for the surface roughness of the plating layer under the fourth plating condition.

Specifically, FIG. 11d shows the peel strength (90' peel strength) between the plating layer and the insulating portion when the surface roughness of the plating layer has a centerline average roughness (Ra) of 0.3 μm and a 10-point average roughness (Rz) of 4.5 μm and the thickness of the plating layer is 4.5 μm. At this time, as in FIG. 11d, when the plating layer is formed under the fourth plating conditions having a centerline average roughness (Ra) and a 10-point average roughness (Rz) in the above-described ranges, it was confirmed that the peel strength (90' peel strength) between the plating layer and the insulating portion was 5.9 gf/mm.

FIG. 11e is a view for explaining a peel strength (90' peel strength) between the plating layer and the insulating portion under the fifth plating condition. FIG. 11e (a) is a view showing a 3D image of the surface roughness of the plating layer under the fifth plating condition, and FIG. 11e (b) is a view showing a profile for the surface roughness of the plating layer under the fifth plating condition.

Specifically, FIG. 11e shows the peel strength (90' peel strength) between the plating layer and the insulating portion when the surface roughness of the plating layer has a centerline average roughness (Ra) of 0.9 μm and a 10-point average roughness (Rz) of 13.4 μm and the thickness of the plating layer is 4.3 μm. At this time, as in FIG. 11e, when the plating layer is formed under the fifth plating conditions having a centerline average roughness (Ra) and a 10-point average roughness (Rz) in the above-described ranges, it was confirmed that the peel strength (90' peel strength) between the plating layer and the insulating portion was 36.0 gf/mm.

That is, as in FIGS. 11a to 11e, the surface roughness of the plating layer formed by the first to fifth plating conditions satisfies the reference range of the centerline average surface roughness (Ra) and the 10-point average surface roughness (Rz) required in the embodiment. However, it was confirmed that even when the centerline average surface roughness Ra and the 10-point average surface roughness Rz satisfied the reference range, the 90' peel strength may appear to be 50 gf/mm or less.

In addition, as in FIGS. 11a to 11e, it was confirmed that even when the centerline average surface roughness (Ra) and the 10-point average surface roughness (Rz) of the plating layer increase, the peel strength (90' peel strength) between the plating layer and the insulating portion could be decreased. For example, as in FIG. 11d, even when the average roughness (Ra) of the center line of the plating layer is 0.3 μm and the 10-point average surface roughness (Rz) of the plating layer is 4.5 μm, it was confirmed that the peel strength (90' peel strength) between the plating layer and the insulating portion was significantly low at 5.9 gf/mm.

In addition, as in FIGS. 11a to 11e, it was confirmed that the peel strength (90' peel strength) between the plating layer and the insulating portion did not increase even when the thickness of the plating layer was increased.

In conclusion, according to FIGS. 11a to 11e, when the centerline average surface roughness (Ra) and the 10-point average surface roughness (Rz) of the plating layer increase or the thickness of the plating layer increases, it was confirmed that the peel strength (90' peel strength) between the plating layer and the insulating portion was rather decreased.

At this time, the adhesion corresponding to the peel strength (90' peel strength) between the pattern portion 720 and the insulating portion 710 is required 50 gf/mm or more. For example, when a 90' peel strength between the pattern portion 720 and the insulating portion 710 is less than 50 gf/mm, there is a problem in that the pattern portion 720 is detached from the insulating portion 710. Accordingly, the 90' peel strength between the pattern portion 720 and the insulating portion 710 should have a minimum of 50 gf/mm or more.

In conclusion; when the surface roughness of the plating layer 721-13, 721-23, 721-33, 722-13, and 722-23 of the pattern portion 720 of the embodiment has a center line average surface roughness (Ra) and a 10-point average surface roughness (Rz) in the reference range, the peel strength (90' peel strength) between the pattern portion 720 and the insulating portion 710 is increased. However, even when the surface roughness of the plating layer has a centerline average surface roughness (Ra) and a 10-point average surface roughness (Rz) in the reference range, it was confirmed that the peel strength (90' peel strength) appeared to be less than 50 gf/mm.

Accordingly, the embodiment controls other conditions affecting the 90' peel strength other than the surface roughness of the plating layer 721-13, 721-23, 721-33, 722-13, 722-23. For example, the peel strength (90' peel strength) between the pattern portion 720 and the insulating portion 710 in the embodiment et to have a value greater than or equal to a certain level.

FIGS. 12a to 12e are SEM photographs showing a surface of the plating layer according to the first to fifth plating conditions. For example, (a) of each of FIGS. 12a to 12e is a view showing an SEM photograph in a 40'tilt*2 k condition, and (b) is a view showing an SEM photograph in a 40'tilt*10 k condition.

Referring to FIGS. 12a to 12e, it was confirmed that the size of the plating particles of the plating layer 721-13, 721-23, 721-722-13, and 722-23 of the pattern portion 720 should be primarily controlled in order to match the peel strength (90' peel strength) between the pattern portion 720 and the insulating portion 710 to 50 gf/mm or more.

The plating particle size may be measured using SEM equipment. For example, the plating particle size may be measured using a surface image of a certain magnification obtained by photographing the surface of the plating layer 721-13, 721-23, 721-33, 722-13, and 722-23 with an SEM equipment. For example, the plating particle size may mean an average particle size of the plating layer. For example, the plating particle size may be measured based on a surface image of the plating layer obtained at a magnification of 10000 times. For example, the sizes of the plurality of plating particles are measured in the surface image, respectively. Then, the plating particle size may be obtained by calculating an average value of the sizes of the plurality of measured plating particles.

As shown in FIG. 12a, when the average value of the plating particle size of the plating layer according to the first plating condition is 1.2 µm it was confirmed that the peel strength (90' peel strength) between the pattern portion 720 and the insulating portion 710 was 79.5 gf/mm.

In addition, as in FIG. 12b, when the average value of the plating particle size of the plating layer according to the second plating condition is 4.3 µm, it was confirmed that the peel strength (90' peel strength) between the pattern portion 720 and the insulating portion 710 was 45.5 gf/mm.

In addition, as in FIG. 12c, when the average value of the plating particle size of the plating layer according to the third plating condition is 3.0 µm, it was confirmed that the peel strength (90' peel strength) between the pattern portion 720 and the insulating portion 710 was 70.9 gf/mm.

In addition, as in FIG. 12d, when the average value of the plating particle size of the plating layer according to the fourth plating condition is 5.19 µm, it was confirmed that the peel strength (90' peel strength) between the pattern portion 720 and the insulating portion 710 was 5.9 gf/mm.

In addition, as in FIG. 12e, when the average value of the plating particle size of the plating layer according to the fifth plating condition is 5.0 µm, it was confirmed that the peel strength (90' peel strength) between the pattern portion 720 and the insulating portion 710 was 36.0 gf/mm.

That is, as in FIGS. 12a to 12e, it was confirmed that the 90' peel strength between the pattern portion 720 and the insulating portion 710 can primarily have a certain level only when the average value of the plating particle size of the plating layer 721-13, 721-23, 721-33, 722-13, and 722-23 is within a certain range.

Specifically, when the average value of the plating particle size of the plating layer 721-13, 721-23, 721-33, 722-13, 722-23 exceeds 5.15 µm, it was confirmed that the peel strength between the pattern portion 720 and the insulating portion 710 was rapidly decreased. Accordingly, the average value of the plating particle size of the plating layer 721-13, 721-23, 721-33, 722-13, and 722-23 in the embodiment is set to be 5.15 µm or less. For example, the average value of the plating particle size of the plating layer 721-13, 721-23, 721-33, 722-13, and 722-23 in the embodiment is set to be 5.1 µm or less. For example, the average value of the plating particle size of the plating layer 721-13, 721-23, 721-33, 722-13, and 722-23 in the embodiment is set to be 5.0 µm or less.

Preferably, the average value of the plating particle size of the plating layers 721-13, 721-23, 721-33, 722-13, and 722-23 in this embodiment satisfies a range between 0.8 µm and 5.15 µm. For example, the average value of the plating particle size of the plating layers 721-13, 721-23, 721-33, 722-13, 722-23 in the embodiment satisfies a range between 0.9 µm and 5.10 µm. For example, the average value of the plating particle size of the plating layers 721-13, 721-23, 721-33, 722-13, 722-23 satisfies a range between 1.0 µm and 5.0 µm.

At this time, when the average value of the plating particle size of the plating layer 721-13, 721-23, 721-33, 722-13, and 722-23 is less than 0.8 µm, the centerline average surface roughness Ra and/or the 10-point average surface roughness Rz of the plating layers 721-13, 721-23, 721-33, 722-13, and 722-23 may not satisfy the reference range. Accordingly, the peel strength (90' peel strength) between the pattern portion 720 and the insulating portion 710 may be lowered.

In addition, when the average value of the plating particle size of the plating layers 721-13, 721-23, 721-33, 722-13, 722-23 exceeds 5.15 µm, as shown in FIG. 12d, there may be a problem in that the 90' peel strength between the pattern portion 720 and the insulating portion 710 is rapidly lowered.

Therefore, the average value of the plating particle size of the plating layer 721-13, 721-23, 721-33, 722-13, and 722-23 in the embodiment is to have a 0.8 µm to 5.15 µm. Thereby, the peel strength (90' peel strength) between the pattern portion 720 and the insulating portion 710 can be maintained at a certain level or more.

FIGS. 13a and 13b are views showing histograms of the plating particle size of the plating layer according to the first to fifth plating conditions. For example, FIGS. 13a and 13Bb are views showing size distribution diagrams of plating particles of a plating layer according to first to fifth plating conditions.

The average value of the plating particle size of the plating layer shown in FIGS. 12a to 12e may also be expressed as a size distribution diagram of the plating particles as in FIGS. 13a and 13b.

For example, the histogram or size distribution diagram of the size of the plating particles is a graph showing the number of plating particles by size exposed on the surface of the plating layer 721-13, 721-23, 721-33, 722-13, and 722-23. For example, FIGS. 13a to 13b may show a difference value between a maximum size and a minimum size of the plating particles of the plating layer.

Referring to FIG. 13a, when the distribution of the plating particle size of the plating layer according to the first plating condition is 1.60 µm (that is, when the difference between the maximum size and the minimum size of the plating particles is 1.60 µm), it was confirmed that the 90' peel strength between the pattern portion 720 and the insulating portion 710 was maintained at a constant level.

Referring to FIG. 13b (a), when the distribution of the plating particle size of the plating layer according to the second plating condition is 5.31 µm (that is, when the difference between the maximum size and the minimum size of the plating particles is 5.31 µm), it was confirmed that the 90' peel strength between the pattern portion 720 and the insulating portion 710 was maintained at a constant level.

Referring to FIG. 13b (b), when the distribution of the plating particle size of the plating layer according to the third plating condition is 6.55 µm (that is, when the difference between the maximum size and the minimum size of the plating particles is 6.55 μm), it was confirmed that the 90' peel strength between the pattern portion 720 and the insulating portion 710 was maintained at a constant level.

Referring to FIG. 13b (c), when the distribution of the plating particle size of the plating layer according to the fourth plating condition is 4.02 μm (that is, when the difference between the maximum size and the minimum size of the plating particles is 4.02 μm), it was confirmed that the 90' peel strength between the pattern portion 720 and the insulating portion 710 was maintained at a constant level.

Referring to FIG. 13b (d), when the distribution of the plating particle size of the plating layer according to the fifth plating condition is 4.65 μm (that is, when the difference between the maximum size and the minimum size of the plating particles is 4.65 μm), it was confirmed that the 90' peel strength between the pattern portion 720 and the insulating portion 710 was maintained at a constant level.

However, when the distribution of the plating particle size of the plating layer exceeds 7.0 μm, it was confirmed that the peel strength (90' peel strength) between the pattern portion 720 and the insulating portion 710 is rapidly reduced.

Accordingly, the plating layers 721-13, 721-23, 721-33, 722-13, and 722-23 have a size distribution of the plating particles of 7.0 μm or less. For example, the plating layers 721-13, 721-23, 721-33, 722-13, and 722-23 have a size distribution of the plating particles of 6.5 μm or less. For example, the plating layers 721-13, 721-23, 721-33, 722-13, and 722-23 have a size distribution of the plating particles of 6.0 μm or less For example, the difference between a size of the first plating particle and a size of the second plating particle of the plating layers 721-13, 721-23, 721-33, 722-13 and 722-23 in the embodiment is 7.0 μm or less. The first plating particle is a plating particle having a largest size among the plating particles of the plating layer. In addition, the second plating particle is a plating particle having a smallest size among the plating particles of the plating layer. For example, the difference between the size of the first plating particle and the second plating particle of the plating layers 721-13, 721-23, 721-33, 722-13, and 722-23 is 6.5 μm or less. For example, the difference between the size of the first plating particle and the size of the second plating particle is 6.0 μm or less.

The distribution of the plating layers 721-13, 721-23, 721-33, 722-13, 722-23 exceeds 7.0 μm, or a difference value between the first plating particle and the second plating particle exceeds 7.0 μm, a peel strength 90' between the pattern portion and the insulating portion 710 may be lowered. Accordingly, the pattern portion 720 may be separated from the insulating portion 710 in the usage environment of the camera module.

FIG. 14 is a graph showing the relationship between a surface area of the plating particles and a peel strength according to the embodiment.

It was confirmed that the peel strength (90' peel strength) between the pattern portion 720 and the insulating portion 710 was changed according to the average value of the size of the plating particles of the plating layer, the size distribution of the plating particles, and the difference value between the maximum size and the minimum size of the plating particles described above.

In addition, the average value of the size of the plating particles, the size distribution of the plating particles, and the difference value between the maximum size and the minimum size of the plating particles may also be expressed as a surface area of the plating particles.

And, it was confirmed that there was a difference in the peel strength (90' peel strength) between the pattern portion 720 and the insulating portion 710 according to the surface area of the plating particles per unit area (1 μm$^2$) of the plated layer.

The surface area of the plating particles per unit area (1 μm$^2$) of the plating layer may be measured according to the following assumption condition.

(1) A shape of the plating particle has a shape of a sphere (2) About half (hemisphere) of the plating particles are exposed to the surface of the plating layer And, the surface area may be calculated by a calculation method in the following order.

(1) Measuring the size (eg, diameter) of the plating particles using the method for measuring the size of the plating particles described above (2) Calculation of a first surface area for the plating particles having the size (3) Check the number of plating particles included in a first area (eg. 115 μm$^2$ area) larger than the unit area (1 μm$^2$)

(4) Calculation of a second surface area of ½ (for example, half of the plating particle) of the first surface area of the plating particle (5) Calculation of a first surface area of the plating particles in the first area using the number of plating particles and the second surface area (6) Calculation of a surface area of the plating particles in the unit area (1 μm$^2$) using the first surface area And, the surface area of the plating particles per area of the plating layer calculated based on the assumption conditions and calculation method as described above is shown in Table 4 below.

TABLE 4

| | Plating particle size (μm) | Surface area of plating particles (surface area of sphere, μm$^2$) | Surface area of a hemisphere (surface area of a sphere*½, μm$^2$) | Number of plating particles per 115 μm$^2$ area | Number of plating particles per 3000 μm$^2$ area | Surface area of plated particles per 3000 μm$^2$ area (μm$^2$) |
|---|---|---|---|---|---|---|
| #1 | 1.2 | 4.52 | 2.26 | 74.00 | 1924. | 4351.99 |
| #2 | 4.3 | 58.09 | 29.04 | | 32 | 929.41 |
| #3 | 3 | 28.27 | 14.14 | 9.0 | 234 | 3308.10 |
| #4 | 5.19 | 84.62 | 42.31 | | 12 | 507.73 |
| #5 | 5 | 78.54 | 39.27 | | 21 | 824.67 |

Referring to Table 4, when the plating particle size (average value) of the plating layer according to the first plating condition was 1.2 μm, it was confirmed that the surface area (μm$^2$) of the plating particles per 3000 μm$^2$ area was 4351.99.

Referring to Table 4, when the plating particle size (average value) of the plating layer according to the second plating condition was 4.3 μm, it was confirmed that the surface area (μm$^2$) of the plating particles per 3000 μm$^2$ area was 929.41.

Referring to Table 4, when the plating particle size (average value) of the plating layer according to the third plating condition was 3 μm, it was confirmed that the surface area (μm$^2$) of the plating particles per 3000 μm$^2$ area was 3308.10.

Referring to Table 4, when the plating particle size (average value) of the plating layer according to the fourth plating condition was 5.19 t was confirmed that the surface area (μm$^2$) of the plating particles per 3000 μm$^2$ area was 507.73.

Referring to Table 4, when the plating particle size (average value) of the plating layer according to the fifth plating condition was 5 μm, it was confirmed that the surface area (μm$^2$) of the plating particles per 3000 μm$^2$ area was 82.467.

And, the surface area of the plating particles per unit area (1 μm$^2$) of the plating layer of the embodiment according to Table 4 may be as shown in Table 5 below.

TABLE 5

| | surface area per unit area | peel strength (90' peel strength) |
|---|---|---|
| #1 | 1.5 | 79.5 |
| #2 | 0.3 | 45.5 |
| #3 | 1.1 | 70.9 |
| #4 | 0.2 | 5.9 |
| #5 | 0.3 | 36 |

According to Table 5, the surface area (μm$^2$) of the plating particles per unit area (1 μm$^2$) of the plating layer according to the first plating condition is 1.5, and at this time, it was confirmed that the peel strength (90 peel strength) between the pattern portion 720 and the insulating portion 710 was 79.5 gf/mm.

In addition, the surface area (μm$^2$) of the plating particles per unit area (1 μm$^2$) of the plating layer according to the second plating condition is 0.3, and at this time, it was confirmed that the peel strength (90' peel strength) between the pattern portion 720 and the insulating portion 710 was 45.5 gf/mm.

In addition, the surface area (μm$^2$) of the plating particles per unit area (1 μm$^2$) of the plating layer according to the third plating condition is 1.1, and at this time, it was confirmed that the peel strength (90' peel strength) between the pattern portion and the insulating portion 710 was 70.9 gf/mm.

In addition, the surface area (μm$^2$) of the plating particles per unit area (1 μm$^2$) of the plating layer according to the fourth plating condition is 0.2, and at this time, it was confirmed that the peel strength (90' peel strength) between the pattern portion 720 and the insulating portion 710 was 5.9 gf/mm.

In addition, the surface area (μm$^2$) of the plating particles per unit area (1 μm$^2$) of the plating layer according to the fifth plating condition is 0.3, and at this time, it was confirmed that the peel strength (90' peel strength) between the pattern portion and the insulating portion 710 was 36 gf/mm.

Summarizing the contents of Tables 5 and FIG. 14, when the surface area (μm$^2$) of the plating particles per unit area (1 μm$^2$) of the plating layer is less than 0.5, between the pattern portion 720 and the insulating portion (710), it was confirmed that the 90' peel strength between the pattern portion 720 and the insulating portion 710 was less than 50 gf/mm. Accordingly, the surface area (μm$^2$) of the plating particles per unit area (1 μm$^2$) of the plating layer is 0.5 or more. Accordingly, the peel strength (90' peel strength) between the pattern portion 720 and the insulating portion 710 in the embodiment is 50 gf/mm or more.

FIG. 15 is a mobile terminal to which a camera module according to an embodiment is applied.

As shown in FIG. 13, the mobile terminal 1500 of the embodiment may include a camera module 1000, a flash module 1530, and an autofocus device 1510 provided on a rear side. The mobile terminal 1500 of the embodiment may further include a second camera module 1100.

The camera module 1000 may include an image capturing function and an auto focus function. For example, the camera module 1000 may include an auto-focus function using an image.

The camera module 1000 processes an image frame of a still image or a moving image obtained by an image sensor in a capturing mode or a video call mode. The processed image frame may be displayed on a predetermined display unit and stored in a memory. A camera (not shown) may also be disposed on a front-body of the mobile terminal.

For example, the camera module 1000 may include a first camera module and a second camera module, and OIS may be implemented together with an AF or zoom function by the first camera module.

The flash module 1530 may include a light emitting device emitting light therein. The flash module 1530 may be operated by a camera operation of a mobile terminal or a user's control.

The autofocus device 1510 may include one of packages of a surface light emitting laser device as a light emitting unit.

The autofocus device 1510 may include an auto-focus function using a laser. The auto focus device 1510 may be mainly used in a condition in which the auto focus function using the image of the camera module 1000 is deteriorated, for example, close to 10 m or less or in a dark environment. The autofocus device 1510 may include a light emitting unit including a vertical cavity surface emitting laser (VCSEL) semiconductor device and a light receiving unit such as a photodiode that converts light energy into electrical energy.

A lens driving device of the embodiment includes a sensor portion and a circuit board for moving an image sensor connected to the sensor portion. The circuit board may be an interposer. The sensor portion includes a sensor substrate connected to the circuit board and an image sensor mounted on the sensor substrate. In this case, the sensor substrate includes an electrical pad electrically connected to the circuit board and a fixing pad other than the electrical pad. In this case, the circuit board may include an opening portion into which the fixing pad of the sensor substrate is inserted.

Accordingly, the fixing pad of an embodiment may be inserted into the opening portion during a soldering process between the circuit board and the sensor substrate. Through this, the embodiment may facilitate alignment between the circuit board and the sensor substrate in the soldering process.

Further, the embodiment may limit the movement of the sensor substrate in a state in which the positions of the circuit board and the sensor substrate are aligned. Through this, the embodiment can solve the problem of position shift between the circuit board and the sensor substrate occurring in the soldering process. Through this, the embodiment can improve workability.

The embodiment may also improve electrical connectivity between the sensor substrate and the circuit board. Through this, the embodiment may improve product reliability.

In addition, the circuit board of the embodiment includes an insulating portion and a pattern portion. The insulating portion includes a first insulating region, a second insulating region, and a separation region therebetween. In addition, the pattern portion includes a first terminal portion disposed on the first insulating region to be connected to the sensor substrate, a second terminal portion disposed on the second insulating region to be connected to the main substrate, and a connection portion disposed on the separation region and connecting between the first terminal portion and second terminal portion. In this case, the connection portion includes a bending portion disposed on each of corner portions of the separation region. In this case, each of bending portions of the connection portion is bent by rotating in the same direction at the corner portion. Accordingly, the mobility of the sensor portion by the circuit board may be improved by the bent structure of the connection portion. Furthermore, the embodiment may improve the accuracy of the movement position of the sensor portion.

In addition, the bending portion of the connection portion of the embodiment includes a first open region that opens a part of each of the corner portions of the separation region. In this case, the first open region may be formed at a position overlapping a protrusion of a second frame constituting the first moving portion in the optical axis direction. In addition, the connection portion includes an inner connection portion disposed inside the first open region and an outer connection portion disposed outside the first open region while avoiding the first open region. In this case, the number of the inner connection portion may be smaller than the number of the outer connection portion.

Accordingly, the embodiment may increase the mobility of the first moving portion by making the number of outer connection portion disposed outside of the first open region larger than the number of inner connection portion disposed inside the first open region. For example, when the number of the outer connection portion is greater than the number of the inner connection portion, the amount of movement of the first moving portion can be easily adjusted compared to the opposite case. For example, the outer connection portion is disposed outside the first open region to have a greater length than the inner connection portion. And, since the length of the outer connection portion is greater than the length of the inner connection portion, the intensity of the driving force required to move the first moving portion may be reduced compared to the inner connection portion. Accordingly, the mobility of the first moving portion in the embodiment may be improved by a difference in the number of the inner connection portion and the outer connection portion. Furthermore, the amount of movement of the first moving portion can be finely adjusted.

In addition, each of the outer connection portion and the inner connection portion of the embodiment includes a plurality of bending points. In this case, the number of bending points of the outer connection portion may be the same as the number of bending points of the inner connection portion. In addition, the mobility of the first moving portion may be increased by the same number of bending points.

For example, when the number of bending points of the outer connection portion is different from the number of bending points of the inner connection portion, force may be concentrated on a connection portion having a relatively large number of bending points. Accordingly, a problem may occur in which the connection portion on which the force is concentrated is broken before other connection portion. Furthermore, a problem may occur in the movement accuracy of the first moving portion.

In contrast, when the first moving portion moves, the force applied to the inner connection portion and the outer connection portion in the embodiment may be uniformly distributed because the number of the bending points is the same. Accordingly, in the embodiment, the force may be uniformly distributed to the inner connection portion and the outer connection portion. Accordingly, the embodiment can solve the problem that the specific connection portion is cut off first. Furthermore, even when the connection portion is cut off, the inner connection portion and the outer connection portion in the embodiment may be cut off at the same time.

Meanwhile, the embodiment includes an adhesive layer disposed in a through hole passing through the first insulating region of the circuit board, and a heat dissipation portion attached to the circuit board through the adhesive layer. In addition, the heat dissipation portion may dissipate heat generated from the sensor substrate.

Accordingly, the embodiment may improve heat dissipation characteristics by dissipating heat generated by the image sensor to the outside. Accordingly, the embodiment may improve the operational reliability of the image sensor. Furthermore, the embodiment may improve the quality of an image obtained from an image sensor.

In addition, the pattern portion of the embodiment includes a metal layer and a surface treatment layer disposed on the metal layer. The surface treatment layer may be a thin film layer formed by coating an organic material. In this case, the dielectric constant (Er) of the organic material is 3.24. This value is significantly smaller than the dielectric constant (Er) of nickel or gold (Au) of a normal surface treatment layer. That is, the dielectric constant (Er) of the nickel or gold (Au) is 4 or more.

Accordingly, the embodiment may improve the signal transmission speed of the wiring that changes in inverse proportion to the relative dielectric constant of the surface treatment layer. Accordingly, the embodiment may improve product reliability of the circuit board.

In addition, the thermal conductivity of the organic material used in the surface treatment layer of the embodiment is higher than the thermal conductivity of nickel. Accordingly, the embodiment may increase the thermal conductivity of the pattern portion.

In particular, heat dissipation characteristics of electronic products including camera modules are emerging as a major issue because they affect product performance. That is, the components included in the camera module have a structure vulnerable to heat dissipation. Accordingly, efforts are being made to improve the heat dissipation characteristics of the camera module. In this case, the embodiment may increase the thermal conductivity of the pattern portion by the organic coating. Accordingly, the embodiment may improve the heat dissipation characteristics of the circuit board and the heat dissipation characteristics of the camera module to which the circuit board is applied.

In addition, the pattern portion of the embodiment is a portion of the configuration of the first moving portion of the camera module. Accordingly, the pattern portion may move along with the movement of the first moving portion. In addition, the pattern portion may be in contact with other components when the first moving portion moves. In this case, when the pattern portion is in contact with other components, a problem in electrical reliability may occur.

At this time, the organic material of the surface treatment layer of the embodiment has an electrical conductivity lower than that of nickel or gold. Accordingly, when the pattern portion is in contact with other components, the surface treatment layer may perform an insulating function. Accordingly, the embodiment may improve the electrical reliability of the circuit board. In addition, the embodiment may simplify the plating process by applying the organic coating method, further reducing the plating cost.

On the other hand, the pattern portion of the embodiment includes a plating layer disposed between the metal layer and the surface treatment layer. The plating layer may improve peel strength between the pattern portion and the insulating portion.

In this case, the plating layer has a surface roughness. In this case, even when the surface roughness of the plating layer increases, the adhesion between the plating layer and the insulating portion may decrease. Accordingly, the embodiment improves the adhesion by controlling the size of the plating particles constituting the plating layer.

For example, the average value of the plating particles of the plating layer of the embodiment has a range between 0.8 µm to 5.15 µm. In addition, a difference value between a first plating particle having a maximum size and a second plating particle having a minimum size of the plating layer in the embodiment is 7.0 µm or less. In addition, a surface area of the plating particles in an unit area (1 µm$^2$) of the plating layer may be 0.5 µm 2 or more. In addition, a centerline average surface roughness (Ra) of the plating layer has a range of 0.05 µm to 1.5 µm. In addition, a 10-point average surface roughness (Rz) of the plating layer has a range of 0.6 µm to 15 µm. Accordingly, the embodiment may further improve the adhesion between the pattern portion and the insulating portion. Further, the peel strength (90' peel strength) between the pattern portion and the insulating portion in the embodiment is 50 gf/mm or more. Accordingly, the embodiment can solve the reliability problem in which the pattern portion is detached from the insulating portion in an environment in which the camera module is used. Furthermore, the embodiment may improve the operation reliability of the auto-focusing or hand-shake prevention function of the camera module.

Next, FIG. 16 is a perspective view of a vehicle to which a camera module according to an embodiment is applied.

For example, FIG. 16 is an external view of a vehicle having a vehicle driving assistance device to which a camera module according to an embodiment is applied.

Referring to FIG. 16, the vehicle 800 according to the embodiment may include wheels 13FL and 13FR that rotate by a power source and a predetermined sensor. The sensor may be the camera sensor 2000, but is not limited thereto.

The camera 2000 may be a camera sensor to which the camera module according to the embodiment is applied.

The vehicle 800 of the embodiment may acquire image information through a camera sensor 2000 that captures a front image or a surrounding image. In addition, the vehicle may determine a lane non-identification situation by using the image information, and may generate a virtual lane when the lane is not identified.

For example, the camera sensor 2000 captures the front of the vehicle to obtain a front image, and the processor (not shown) analyzes an object included in the front image to obtain image information.

For example, when an object such as a lane, an adjacent vehicle, a driving obstacle, and indirect road markings including median strips, curbs, avenues, etc. is captured in the image captured by the camera sensor 2000, the processor may detect such an object and include it in the image information.

In this case, the processor y further supplement the image information by acquiring distance information from the object detected through the camera sensor 2000. The image information may be information about an object captured in an image.

The camera sensor 2000 may include an image sensor and an image processing module. The camera sensor 2000 may process a still image or a moving image obtained by an image sensor (eg. CMOS or CCD). The image processing module may process a still image or a moving image obtained through the image sensor, extract necessary information, and transmit the extracted information to the processor.

In this case, the camera sensor 2000 may include a stereo camera to improve the measurement accuracy of the object and further secure information such as the distance between the vehicle 800 and the object, but is not limited thereto.

The vehicle 800 of an embodiment may provide an advanced driver assistance system (ADAS).

For example, Advanced Driver Assistance Systems (ADAS) include Autonomous Emergency Braking (AEB) that automatically slows down or stops in the event of a collision without the driver stepping on the brake, Lane Keep Assist System (LKAS), which maintains the lane by adjusting the driving direction in case of lane departure, Advanced Smart Cruise Control (ASCO), which maintains a distance from the vehicle in front while driving at a pre-determined speed, Active Blind Spot Detection (ABSD) which detects the risk of collision in the blind spot and helps to change lanes safely, and Around View Monitor (AVM) that visually shows the surroundings of the vehicle.

The camera module in such an advanced driver assistance system (ADAS) functions as a core part together with a radar, etc. and the proportion of application of camera modules is gradually increasing.

For example, an automatic emergency braking system (AEB) can automatically provide emergency braking by detecting a vehicle or pedestrian in front with the front camera sensor and radar sensor when the driver does not control the vehicle. Alternatively, the driving steering assistance system (LKAS) can detect whether the driver leaves the lane without manipulation such as a direction signal through a camera sensor and automatically steer the steering wheel to maintain the lane. In addition, the Around View Monitoring System (AVM) can visually show the surroundings of the vehicle through camera sensors placed on all sides of the vehicle.

Features, structures, effects, etc. described in the above embodiments are included in at least one embodiment, and it is not necessarily limited to only one embodiment. Furthermore, features, structures, effects, etc. illustrated in each embodiment can be combined or modified for other embodiments by those of ordinary skill in the art to which the embodiments belong. Accordingly, the contents related to such combinations and variations should be interpreted as being included in the scope of the embodiments.

In the above, the embodiment has been mainly described, but this is only an example and does not limit the embodiment, and those of ordinary skill in the art to which the embodiment pertains will appreciate that various modifications and applications not illustrated above are possible without departing from the essential characteristics of the present embodiment. For example, each component specifically shown in the embodiment can be implemented by modification. And the differences related to these modifications and applications should be interpreted as being included in the scope of the embodiments set forth in the appended claims.

The invention claimed is:

1. A circuit board comprising:
an insulating portion; and
a pattern portion disposed on the insulating portion,
wherein the insulating portion includes:
a first insulating region, and
a second insulating region disposed outside the first insulating region and spaced apart from the first insulating region with a separation region therebetween;
wherein the pattern portion includes:
a first pattern portion for signal transmission; and
a second pattern portion including a dummy pattern separated from the first pattern portion,
wherein the first pattern portion includes:
a first terminal portion disposed on the first insulating region;
a second terminal portion disposed on the second insulating region; and
a connection portion disposed on the separation region and connecting between the first terminal portion and the second terminal portion,
wherein the second pattern portion includes:
a second-first pattern portion disposed on the first insulating region; and
a second-second pattern portion disposed on the second insulating region and separated from the second-first pattern portion.

2. The circuit board of claim 1, wherein the second-first pattern portion is disposed on a central region of an upper surface of the first insulating region, and
wherein the first terminal portion is disposed on an edge region of the upper surface of the first insulating region excluding the central region.

3. The circuit board of claim 1, wherein the first insulating region includes a first terminal opening portion overlapping the first terminal portion in a vertical direction,
wherein a part of the first terminal portion is disposed on the first insulating region; and
wherein a remaining part of the first terminal portion is disposed on the first terminal opening portion.

4. The circuit board of claim 3, wherein the second insulating region includes a second terminal opening portion overlapping the second terminal portion in a vertical direction,
wherein a part of the second terminal portion is disposed on the second insulating region; and
wherein a remaining part of the second terminal portion is disposed on the second terminal opening portion.

5. The circuit board of claim 4, wherein at least one of the first terminal opening portion and the second terminal opening portion is not connected to the separation region of the insulating portion.

6. The circuit board of claim 3, wherein the first insulating region includes a fixing pad opening portion disposed adjacent to the first terminal opening portion and spaced apart from the first terminal opening portion.

7. The circuit board of claim 6, wherein the fixing pad opening portion is connected to the separation region.

8. The circuit board of claim 1, wherein the first insulating region includes:
a first portion overlapping the first terminal portion of the first pattern portion and the second-first pattern portion of the second pattern portion in a vertical direction; and
a second portion other than the first portion.

9. The circuit board of claim 1, wherein the second insulating region includes:
a third portion overlapping the second terminal portion of the first pattern portion and the second-second pattern portion of the second pattern portion in a vertical direction; and
a fourth portion excluding the third portion.

10. The circuit board of claim 1, wherein the separation region includes first to fourth corner portions,
wherein the connection portion includes first to fourth connection portions including a bending portion disposed on each of the first to fourth corner portions, and
wherein the first to fourth connection portions extend in the same direction from one end connected to the first terminal portion and are connected to the second terminal portion.

11. The circuit board of claim 10, wherein the first insulating region includes first-first to first-fourth side regions,
wherein the first terminal portion includes first-first to first-fourth terminals disposed on each of the first-first to first-fourth side regions,
wherein the second insulating region includes second-first to second-fourth side regions facing each of the first-first to first-fourth side regions of the first insulating region; and
wherein the second terminal portion includes second-first to second-fourth terminals disposed on each of the second-first to second-fourth side regions.

12. The circuit board of claim 11, wherein the first-first to first-fourth terminals are disposed adjacent to different corner portions of the first to fourth corner portions of the separation region, respectively, and
wherein the second-first to second-fourth terminals are disposed adjacent to different corner portions of the first to fourth corner portions of the separation region, respectively.

13. The circuit board of claim 12, wherein the first connection portion includes one end connected to the first-first terminal and the other end connected to the second-fourth terminal that does not face the first-first terminal,
wherein the second connection portion includes one end connected to the first-second terminal and the other end connected to the second-third terminal that does not face the first-second terminal,
wherein the third connection portion includes one end connected to the first-third terminal and the other end connected to the second-first terminal that does not face the first-third terminal, and
wherein the fourth connection portion includes one end connected to the first-fourth terminal and the other end connected to the second-second terminal that does not face the first-fourth terminal.

14. The circuit board of claim 11, wherein each of the first to fourth connection portions is bent counterclockwise from one end connected to the first terminal portion to be connected to the second terminal portion.

15. The circuit board of claim 10, wherein each of the first to fourth connection portions includes:
an inner connection portion disposed inside an open region that opens a part of each of the first to fourth corner portions and an outer connection portion disposed outside the open region, and
wherein the number of the inner connection portions is different from the number of the outer connection portions.

16. The circuit board of claim 15, wherein the number of bending points of the inner connection portion is the same as the number of bending points of the outer connection portion.

17. An image sensor module comprising:
a first substrate;
a second substrate disposed on the first substrate; and
an image sensor disposed on the second substrate;
wherein the first substrate includes:
an insulating portion including a first insulating region and a second insulating region disposed outside the first insulating region and spaced apart from the first insulating region with a separation region therebetween;
a first pattern portion including a first terminal portion disposed on the first insulating region, a second terminal portion disposed on the second insulating region, and a connection portion disposed on the separation region to connect between the first terminal portion and the second terminal portion; and
a second pattern portion including a second-first pattern portion disposed to be spaced apart from the first terminal portion on the first insulating region, and a second-second pattern portion disposed to be spaced apart from the second terminal portion on the second insulating region and separated from the second-first pattern portion,
wherein the second substrate includes:
a pad connected to the first terminal portion of the first substrate; and
a via passing through the second substrate;
wherein the via is connected to the second-first pattern portion with an adhesive member interposed therebetween.

18. The image sensor module of claim 17, wherein the first insulating region of the first substrate includes a through hole formed in a region overlapping the second-first pattern portion in a vertical direction and passing through the first insulating region; and
wherein the first substrate includes:
an adhesive layer disposed in the through hole; and
a heat dissipation portion attached to the first substrate through the adhesive layer.

19. The image sensor module of claim 18, wherein a planar area of the second-first pattern portion is larger than a planar area of the first insulating region of the first substrate.

20. The image sensor module of claim 19, wherein at least a part of the heat dissipation portion is disposed in the through hole formed in the first insulating region.

* * * * *